(12) United States Patent
Ofek et al.

(10) Patent No.: US 11,635,456 B2
(45) Date of Patent: Apr. 25, 2023

(54) TECHNIQUES FOR CONTROL OF QUANTUM SYSTEMS AND RELATED SYSTEMS AND METHODS

(71) Applicant: Yale University, New Haven, CT (US)

(72) Inventors: Nissim Ofek, New Haven, CT (US); Luigi Frunzio, North Haven, CT (US); Michel Devoret, New Haven, CT (US); Robert J. Schoelkopf, III, Madison, CT (US)

(73) Assignee: Yale University, New Haven, CT (US)

( * ) Notice: Subject to any disclaimer, the term of this patent is extended or adjusted under 35 U.S.C. 154(b) by 1212 days.

(21) Appl. No.: 16/076,411

(22) PCT Filed: Feb. 10, 2017

(86) PCT No.: PCT/US2017/017534
§ 371 (c)(1),
(2) Date: Aug. 8, 2018

(87) PCT Pub. No.: WO2017/139683
PCT Pub. Date: Aug. 17, 2017

(65) Prior Publication Data
US 2019/0049495 A1 Feb. 14, 2019

Related U.S. Application Data

(60) Provisional application No. 62/294,966, filed on Feb. 12, 2016.

(51) Int. Cl.
*G01R 23/16* (2006.01)
*G01R 33/20* (2006.01)
(Continued)

(52) U.S. Cl.
CPC .......... *G01R 23/16* (2013.01); *G01R 33/032* (2013.01); *G01R 33/038* (2013.01);
(Continued)

(58) Field of Classification Search
CPC .... G01R 23/16; G01R 33/032; G01R 33/038; G01R 33/1284; G01R 33/20;
(Continued)

(56) References Cited

U.S. PATENT DOCUMENTS 5,635,834 A 6/1997 Sloggett et al.
7,135,701 B2 11/2006 Amin et al.
(Continued)

FOREIGN PATENT DOCUMENTS

CN 101548288 A 9/2009
CN 103246017 A 8/2013
(Continued)

OTHER PUBLICATIONS

Hornibrook, "Cryogenic Control Architecture for Large-Scale Quantum Computing", Feb. 23, 2015, Physical Review Applied (Year: 2015).*

(Continued)

*Primary Examiner* — Tarun Sinha
*Assistant Examiner* — Yossef Korang-Beheshti
(74) *Attorney, Agent, or Firm* — Wolf, Greenfield & Sacks, P.C.

(57) ABSTRACT

The present application describes a waveform processor for control of quantum mechanical systems. The waveform processor may be used to control quantum systems used in quantum computation, such as qubits. According to some embodiments, a waveform processor includes a first sequencer configured to sequentially execute master instructions according to a defined order and output digital values in response to the executed master instructions, and a second sequencer coupled to the first sequencer and configured to generate analog waveforms at least in part by transforming digital waveforms according to digital values received from the first sequencer. The analog waveforms are applied to a
(Continued)

quantum system. In some embodiments, the waveform processor further includes a waveform analyzer configured to integrate analog waveforms received from a quantum system and output results of said integration to the first sequencer.

23 Claims, 46 Drawing Sheets

(51) Int. Cl.
| | |
|---|---|
| G06F 17/14 | (2006.01) |
| G01R 33/038 | (2006.01) |
| G01R 33/032 | (2006.01) |
| G01R 33/12 | (2006.01) |
| G06N 10/00 | (2022.01) |
| G06F 9/38 | (2018.01) |
| G06F 9/50 | (2006.01) |
| G06F 15/16 | (2006.01) |

(52) U.S. Cl.
CPC ......... *G01R 33/1284* (2013.01); *G01R 33/20* (2013.01); *G06F 9/3877* (2013.01); *G06F 9/5027* (2013.01); *G06F 15/16* (2013.01); *G06F 17/14* (2013.01); *G06N 10/00* (2019.01)

(58) Field of Classification Search
CPC ...... G06F 9/3877; G06F 9/5027; G06F 15/16; G06F 17/14; G06N 10/00
See application file for complete search history.

(56) References Cited

U.S. PATENT DOCUMENTS

| | | | |
|---|---|---|---|
| 7,307,275 B2 | 12/2007 | Lidar et al. | |
| 7,616,452 B2* | 11/2009 | Wehrly, Jr. | H05K 1/189 174/254 |
| 7,791,780 B2 | 9/2010 | Munro et al. | |
| 7,966,549 B2 | 6/2011 | Hollenberg et al. | |
| 8,032,474 B2 | 10/2011 | Macready et al. | |
| 9,907,181 B2* | 2/2018 | Kraft | H01L 23/5384 |
| 10,127,499 B1* | 11/2018 | Rigetti | G06N 10/00 |
| 2004/0059760 A1 | 3/2004 | Ageishi et al. | |
| 2007/0296953 A1 | 12/2007 | Allen et al. | |
| 2008/0185576 A1 | 8/2008 | Hollenberg et al. | |
| 2009/0241013 A1 | 9/2009 | Roetteler | |
| 2011/0060710 A1 | 3/2011 | Amin | |
| 2014/0264285 A1 | 9/2014 | Chow et al. | |
| 2014/0368234 A1 | 12/2014 | Chow et al. | |
| 2016/0071021 A1* | 3/2016 | Raymond | G06N 10/00 712/28 |
| 2016/0267032 A1* | 9/2016 | Rigetti | G06F 13/4068 |
| 2016/0381800 A1* | 12/2016 | Yagnamurthy | H01L 25/105 361/767 |
| 2017/0062692 A1 | 3/2017 | Dial et al. | |
| 2018/0330266 A1* | 11/2018 | Simmons | H01L 29/0684 |
| 2019/0020346 A1 | 1/2019 | Wang et al. | |
| 2020/0334104 A1 | 10/2020 | Rosenblum et al. | |
| 2021/0125096 A1 | 4/2021 | Puri et al. | |

FOREIGN PATENT DOCUMENTS

| | | |
|---|---|---|
| CN | 105281886 A | 1/2016 |
| JP | 2010-511946 A | 4/2010 |
| JP | 2013/121161 A | 6/2013 |
| JP | 2014-523705 A | 9/2014 |
| WO | WO 2017/065856 A2 | 4/2017 |
| WO | WO 2017/123940 A1 | 7/2017 |
| WO | WO 2017/139683 A1 | 8/2017 |
| WO | WO 2017/151200 A1 | 9/2017 |
| WO | WO 2018/089850 A1 | 5/2018 |

OTHER PUBLICATIONS

International Search Report and Written Opinion for International Application No. PCT/US2019/039945, dated Mar. 9, 2020.
International Search Report and Written Opinion dated Apr. 20, 2017 in connection with International Application No. PCT/US2017/017534.
International Preliminary Report on Patentability dated Aug. 23, 2018 in connection with International Application No. PCT/US2017/017534.
Extended European Search Report for European Application No. 17750901.5, dated Oct. 2, 2019.
International Search Report and Written Opinion for International Application No. PCT/US2019/012441, dated Jul. 25, 2019.
Albert et al., Pair-cat codes: autonomous error-correction with low-order nonlinearity. Quantum Science and Technology. Jul. 2019;4(3):035007.
Albert et al., Performance and structure of single-mode bosonic codes. Physical Review A. Mar. 30, 2018;97(3):032346.
Aliferis et al., Fault-tolerant computing with biased-noise superconducting qubits: a case study. New Journal of Physics. Jan. 30, 2009;11(1):013061.
Aliferis et al., Fault-tolerant quantum computation against biased noise. Physical Review A. Nov. 19, 2008;78(5):052331.
Aoki et al., Quantum error correction beyond qubits. Nat. Phys. Aug. 2009;5(8):541-6.
Barends et al., Superconducting quantum circuits at the surface code threshold for fault tolerance. Nature. Apr. 2014;508(7497):500-3.
Bergeal et al., Phase-preserving amplification near the quantum limit with a Josephson ring modulator. Nature. May 2010;465(7294):64-8.
Bermudez et al., Robust trapped-ion quantum logic gates by continuous dynamical decoupling. Physical Review A. 2012;85:9 pages.
Berry et al., How to perform the most accurate possible phase measurements. Physical Review A. Nov. 23, 2009;80(5):052114.
Berry et al., Optimal input states and feedback for interferometric phase estimation. Physical Review A. Apr. 12, 2001;63(5):053804-1-11.
Bertet et al., Direct Measurement of the Wigner Function of a One-Photon Fock State in a Cavity. Phys. Rev. Lett. Oct. 28, 2002;89(20):200402-1-4.
Blais et al., Cavity quantum electrodynamics for superconducting electrical circuits: An architecture for quantum computation. Phys. Rev. A. Jun. 29, 2004;69(6):062320.
Boissonneault et al., Nonlinear dispersive regime of cavity QED: The dressed dephasing model. Physical Review A. Jun. 17, 2008;77(6):060305.
Braunstein et al., Dense coding for continuous variables. Phys. Rev. A. Apr. 2000;61(4):042302.
Braunstein et al., Teleportation of continuous quantum variables. Phys. Rev. Lett. Jan. 26, 1998;80(4):869-72.
Braunstein, Quantum error correction for communication with linear optics. Nature. Jul. 2, 1998;394(6688):47-9.
Brecht et al., Demonstration of superconducting micromachined cavities. Applied Physics Letters. Nov. 9, 2015;107(19):192603.
Brecht et al., Multilayer microwave integrated quantum circuits for scalable quantum computing. NPJ Quantum Information. Feb. 23, 2016;2:16002.
Brooks et al., Fault-tolerant quantum computation with asymmetric Bacon-Shor codes. Physical Review A. Mar. 7, 2013;87(3):032310.
Brune et al., Quantum nondemolition measurement of small photon numbers by Rydberg-atom phase-sensitive detection. Phys. Rev. Lett. Aug. 20, 1990;65(8):976-9.
C'Orcoles et al., Demonstration of a quantum error detection code using a square lattice of four superconducting qubits. Nat. Comm. Apr. 29, 2015;6:6979.
Cahill et al., Density operators and quasiprobability distributions. Phys. Rev. Jan. 25, 1969;177(5):1882-1902.
Calderbank et al., Good quantum error-correcting codes exist. Physical Review A. Aug. 1, 1996;54(2):1098-105.
Chiaverini et al., Realization of quantum error correction. Nature. Dec. 2004;432(7017):602-5.

(56) References Cited

OTHER PUBLICATIONS

Chow et al., Universal quantum gate set approaching fault-tolerant thresholds with superconducting qubits. Phys. Rev. Lett. Aug. 9, 2012;109(6):060501-1-5.

Cohen et al., Degeneracy-Preserving Quantum Nondemolition Measurement of Parity-Type Observables for Cat Qubits. Physical Review Letters. Aug. 9, 2017;119(6):060503.

Cory et al., Experimental Quantum Error Correction. Phys. Rev. Lett. Sep. 7, 1998;81(10):2152-5.

Cramer et al., Repeated quantum error correction on a continuously encoded qubit by real-time feedback. Nature communications. May 5, 2016;7:11526.

De Fouquieres et al., Second order gradient ascent pulse engineering. J. Mag. Res. Oct. 1, 2011;212(2):412-7.

Deleglise et al., Reconstruction of non-classical cavity field states with snapshots of their decoherence. Nature. Sep. 25, 2008;455(7212):510-4.

Devoret et al., Superconducting Circuits for Quantum Information: An Outlook. Science. Mar. 8, 2013;339(6124):1169-74.

Divincenzo et al., Fault-Tolerant Error Correction with Efficient Quantum Codes. Physical Review Letters. Oct. 7, 1996;77(15):3260-3.

Eastin et al., Restrictions on Transversal Encoded Quantum Gate Sets. Physical Review Letters. Mar. 18, 2009;102(11):110502.

Facchi et al., Quantum zeno subspaces. Physical review letters. Aug. 19, 2002;89(8):080401-1-4.

Flurin et al., Superconducting quantum node for entanglement and storage of microwave radiation. Physical review letters. Mar. 4, 2015;114(9):090503.

Fowler et al., Surface codes: Towards practical large-scale quantum computation. Phys. Rev. A. 2012;86(3):032324-1-48.

Frattini et al., 3-wave mixing Josephson dipole element. Applied Physics Letters. May 29, 2017;110(22):222603-1-4.

Gambetta et al., Building logical qubits in a superconducting quantum computing system. NPJ Quantum Information. Jan. 13, 2017;3(1):2.

Gao et al., Programmable interference between two micro wave quantum memories. Physical Review X. Jun. 21, 2018;8(2):021073.

Gilles et al., Generation of nonclassical light by dissipative two-photon processes. Physical Review A. Apr. 1, 1994;49(4):2785-99.

Goto, Universal quantum computation with a nonlinear oscillator network. Physical Review A. May 10, 2016;93(5):050301.

Gottesman et al., Encoding a qubit in an oscillator. Phys. Rev. A. Jun. 11, 2001;64(1):012310-1-21.

Gottesman, An introduction to quantum error correction and fault-tolerant quantum computation. In Quantum information science and its contributions to mathematics. Proceedings of Symposia in Applied Mathematics. Apr. 2010;68:13-58.

Gottesman, Quantum fault tolerance in small experiments. arXiv:1610.03507. 2016:1-8.

Gottesman, Stabilizer codes and quantum error correction. Caltech Ph.D. Thesis. 1997. 122 pages.

Gottesman, Theory of fault-tolerant quantum computation. Phys. Rev. A. Jan. 1, 1998;57(1):127-37.

Hann et al., Robust readout of bosonic qubits in the dispersive coupling regime. Physical Review A. Aug. 6, 2018;98(2):022305.

Haroche et al., Measuring the photon number parity in a cavity: from light quantum jumps to the tomography of non-classical field states. J. Mod. Opt. Sep. 10, 2007;54(13-5):2101-14.

Hatridge et al., Quantum Back-Action of an Individual Variable-Strength Measurement. Science. Jan. 11, 2013;339(6116):178-81.

Heeres et al., Cavity state manipulation using photon-No. selective phase gates. Phys. Rev. Lett. Sep. 22, 2015;115(13):137002-1-5.

Hofheinz et al., Synthesizing arbitrary quantum states in a superconducting resonator. Nature. May 28, 2009; 459(7246): 546-9.

Imamog et al., Stochastic wave-function approach to non-markovian systems. Physical Review A. Nov. 1, 1994;50(5):3650.

Jensen et al., Quantum memory for entangled continuous-variable states. Nat. Phys. Jan. 2011;7(1):13.

Johansson et al., Qutip: An open-source python framework for the dynamics of open quantum systems. Computer Physics Communications. Aug. 1, 2012;183(8):1760-72.

Kapit., Error-transparent quantum gates for small logical qubit architectures. Physical Review Letters. Feb. 1, 2018;120(5):050503-1-5.

Kelly et al., State preservation by repetitive error detection in a superconducting quantum circuit. Nature. Mar. 2015;519(7541):66-9.

Khaneja et al., Optimal control of coupled spin dynamics: design of nmr pulse sequences by gradient ascent algorithms. J. Mag. Res. Feb. 1, 2005;172(2):296-305.

Kirchmair et al., Observation of quantum state collapse and revival due to the single-photon Kerr effect. Nature. Mar. 14, 2013;495(7440):205-9.

Kitaev, Fault-tolerant quantum computation by anyons. Annals of Physics. Jan. 1, 2003;303(1):2-30.

Knill et al., A scheme for efficient quantum computation with linear optics. Nature. Jan. 2001;409(6816):46-52.

Knill et al., Benchmarking quantum computers: The five-qubit error correcting code. Phys. Rev. Lett. Jun. 18, 2001;86(25):5811-4.

Knill et al., Resilient quantum computation: error models and thresholds. Proceedings of the Royal Society of London A: Mathematical, Physical and Engineering Sciences. Jan. 8, 1998;454(1969):365-84.

Leghtas et al., Confining the state of light to a quantum manifold by engineered two-photon loss. Science. Feb. 20, 2015;347(6224):853-7.

Leghtas et al., Hardware-efficient autonomous quantum memory protection. Phys. Rev. Lett. Sep. 20, 2013;111(12):120501.

Leung et al., Experimental realization of a two-bit phase damping quantum code. Phys. Rev. A. Sep. 1, 1999;60(3):1924-43.

Linke et al., Fault-tolerant quantum error detection. Science Advances. Oct. 1, 2017;3(10):e1701074.

Liu et al., Comparing and combining measurement-based and driven-dissipative entanglement stabilization. Physical Review X. Mar. 3, 2016;6(1):011022-1-18.

Lloyd et al., Analog quantum error correction. Phys. Rev. Lett. May 4, 1998;80(18):4088-91.

Lloyd et al., Quantum computation over continuous variables. Phys. Rev. Lett. Feb. 22, 1999;82(8):1784-7.

Lund et al., Fault-tolerant linear optical quantum computing with small-amplitude coherent states. Phys. Rev. Lett. Jan. 25, 2008;100(3):030503.

Lutterbach et al., Method for direct measurement of the Wigner function in cavity QED and ion traps. Phys. Rev. Lett. Mar. 31, 1997;78(13) 2547-50.

Menicucci et al., Universal Quantum Computation with Continuous-Variable Cluster States. Phys. Rev. Lett. Sep. 13, 2006;97(11):110501.

Michael et al., New class of quantum error-correcting codes for a bosonic mode. Physical Review X. Jul. 14, 2016;6(3):031006.

Minev et al., Planar multilayer circuit quantum electrodynamics. Physical Review Applied. Apr. 29, 2016;5:044021.

Mirrahimi et al., Dynamically protected cat-qubits: a new paradigm for universal quantum computation. New Journal of Physics. Apr. 22, 2014;16(4):045014.

Mirrahimi et.al., Dynamics and Control of Open Quantum Systems. Mar. 18, 2015. https://who.rocq.inria.fr/Mazyar.Mirrahimi/QuantSys2015.pdf, 98 pages.

Moussa et al., Demonstration of Sufficient Control for Two Rounds of Quantum Error Correction in a Solid State Ensemble Quantum Information Processor. Phys. Rev. Lett. Oct. 10, 2011;107(16):160501.

Nigg et al., Black-box superconducting circuit quantization. Phys. Rev. Lett. Jun. 12, 2012;108(24):240502-1-5.

Nigg et al., Quantum computations on a topologically encoded qubit. Science. 2014;345(6194):302-5.

Nigg et al., Stabilizer quantum error correction toolbox for superconducting qubits. Physical review letters. Jun. 14, 2013;110(24):243604.

Ofek et al., Demonstrating quantum error correction that extends the lifetime of quantum information. arXiv: 1602.04768. Feb. 15, 2016;44 pages.

(56) References Cited

OTHER PUBLICATIONS

Okef et al., Extending the lifetime of a quantum bit with error correction in superconducting circuits. Nature. Aug. 25, 2016;536(7617):441-5.
Paik et al., Observation of High Coherence in Josephson Junction Qubits Measured in a Three-Dimensional Circuit QED Architecture. Phys. Rev. Lett. Dec. 5, 2011;107(24):240501.
Pfaff et al., Schrodinger's catapult: Launching multiphoton quantum states from a microwave cavity memory. Nature Physics. Jun. 5, 2017;13:882-7.
Pittman et al., Demonstration of quantum error correction using linear optics. Phys. Rev. A. May 31, 2005;71(5):052332.
Preskill, Sufficient condition on noise correlations for scalable quantum computing. Quantum Information & Computation. Mar. 2013;13(3-4):181-94.
Puri et al., Engineering the quantum states of light in a kerr-nonlinear resonator by two-photon driving. NPJ Quantum Information. Apr. 19, 2017;3(1):18.
Puri et al., Stabilized Cat in Driven Nonlinear Cavity: A Fault-Tolerant Error Syndrome Detector. arXiv:1807.09334. Jul. 24, 2018. 22 pages.
Raimond et al., Phase space tweezers for tailoring cavity fields by quantum zeno dynamics. Physical Review Letters. Nov. 16, 2010;105(21):213601.
Ralph, Continuous variable quantum cryptography. Phys. Rev. A. Dec. 8, 1999;61(1):010303.
Ralph, Quantum error correction of continuous-variable states against Gaussian noise. Phys. Rev. A. Aug. 25, 2011;84(2):022339.
Raussendorf et al., Fault-tolerant quantum computation with high threshold in two dimensions. Physical Review Letters. May 11, 2007;98(19):190504.
Raussendorf et al., Topological fault-tolerance in cluster state quantum computation. New Journal of Physics. Jun. 29, 2007;9(6):199.
Reagor et al., A quantum memory with near-millisecond coherence in circuit QED. Physical Review B. Jul. 8, 2016;94(1):014506-1-8.
Reed et al., Realization of three-qubit quantum error correction with superconducting circuits. Nature. Feb. 2012;482(7385):382-5.
Reiserer et al., Nondestructive Detection of an Optical Photon. Science. Dec. 13, 2013;342(6164):1349-51.
Rigetti et al., Superconducting qubit in a waveguide cavity with a coherence time approaching 0.1 ms. Physical Review B. Sep. 24, 2012;86(10):100506(R).
Riste et al., Detecting bit-flip errors in a logical qubit using stabilizer measurements. Nat. Comm. Apr. 29, 2015;6:6983.
Riste et al., Deterministic entanglement of superconducting qubits by parity measurement and feedback. Nature. Oct. 2013;502(7471):350-4.
Riste et al., Feedback control of a solid-state qubit using high-fidelity projective measurement. Phys. Rev. Lett. Dec. 10, 2012;109(24):240502.
Rosenblum et al., A CNOT gate between multiphoton qubits encoded in two cavities. Nature communications. Feb. 13, 2018;9(1):652.
Rosenblum et al., Demonstration of a fault-tolerant error syndrome measurement: results. Presentation Abstract. http://adsabs.harvard.edu/abs/2018APS..MARX15013R. APS March Meeting 2018; abstract IDS X15.013, 2 pages.
Rosenblum et al., Fault-tolerant detection of a quantum error. Science. Jul. 20, 2018;361(6399):266-70.
Sayrin et al., Real-time quantum feedback prepares and stabilizes photon number states. Nature. Sep. 2011;477(7362):73-7.
Schindler et al., Experimental Repetitive Quantum Error Correction. Science. May 27, 2011;332(6033), 1059-61.
Schuster et al., Resolving photon number states in a superconducting circuit. Nature. Feb. 2007;445(7127):515-8.
Sears et al., Photon shot noise dephasing in the strong-dispersive limit of circuit QED. Phys. Rev. B. Nov. 12, 2012;86(18):180504.
Shor, Fault-tolerant quantum computation. IEEE Proceedings of 37th Annual Symposium on Foundations of Computer Science. 1996:56-65.

Shor, Scheme for reducing decoherence in quantum computer memory. Phys. Rev. A. Oct. 1, 1995 52(4):R2493-6.
Shulman et al., Suppressing qubit dephasing using real-time Hamiltonian estimation. Nat. Comm. Oct. 8, 2014;5:5156.
Steane, Error correcting codes in quantum theory. Phys. Rev. Lett. Jul. 29, 1996;77(5):793-7.
Steane, Multiple-particle interference and quantum error correction. Proc. R. Soc. Lond. A. Nov. 8, 1996;452(1954):2551-77.
Sun et al., Tracking Photon Jumps with Repeated Quantum Non-Demolition Parity Measurements. Nature. Jul. 2014;511(7510):444-8.
Taminiau et al., Universal control and error correction in multi-qubit spin registers in diamond. Nat. Nano. Mar. 2014;9(3):171-6.
Terhal et al., Encoding a qubit into a cavity mode in circuit-QED using phase estimation. Physical Review A. Jan. 11, 2016;93(1):012315.
Touzard et al., Coherent oscillations inside a quantum manifold stabilized by dissipation. Physical Review X. Apr. 4, 2018;8(2):021005.
Tuckett et al., Ultrahigh error threshold for surface codes with biased noise. Physical Review Letters. Jan. 31, 2018;120(5):050505.
Vijay et al., Observation of quantum jumps in a superconducting artificial atom. Phys. Rev. Lett. Mar. 14, 2011;106(11):110502-1-4.
Vijay et al., Stabilizing Rabi oscillations in a superconducting qubit using quantum feedback. Nature. Oct. 2012;490(7418):77-80.
Vijay et al., The Josephson bifurcation amplifier. Rev. Sci. Inst. Nov. 17, 2009;80(11):111101.
Vlastakis et al., Characterizing entanglement of an artificial atom and a cavity cat state with Bell's inequality. Nat. Comm. Nov. 27, 2015;6:8970.
Vlastakis et al., Deterministically Encoding Quantum Information Using 100-Photon Schrodinger Cat States. Science. Nov. 1, 2013;342(6158):607-10.
Vlastakis et al., Violating Bell's inequality with an artificial atom and a cat state in a cavity. arXiv:1504.02512. Apr. 2015:1-20.
Waldherr et al., Quantum error correction in a solid-state hybrid spin register. Nature. Feb. 2014;506(7487):204-7.
Wallraff et al., Strong coupling of a single photon to a superconducting qubit using circuit quantum electrodynamics. Nature. Sep. 9, 2004;431(7005):162-7.
Wang et al., A Schrödinger cat living in two boxes. Science. May 27, 2016;352(6289):1087-91.
Webster et al., Reducing the overhead for quantum computation when noise is biased. Physical Review A. Dec. 3, 2015;92(6):062309.
Wolinsky et al., Quantum noise in the parametric oscillator: from squeezed states to coherent-state superpositions. Physical Review Letters. May 2, 1988;60(18):1836-9.
Wustmann et al., Parametric resonance in tunable superconducting cavities. Physical Review B. May 1, 2013;87(18):184501.
Xue et al., Quantum filter for a class of non-Markovian quantum systems. 2015 54th IEEE Conference on Decision and Control (CDC). 2015:7096-100.
Yurke et al., Generating quantum mechanical superpositions of macroscopically distinguishable states via amplitude dispersion. Physical review letters. Jul. 7, 1986;57(1):13-6.
Zeytinoglu et al., Microwave-induced amplitude—and phase-tunable qubit-resonator coupling in circuit quantum electrodynamics. Physical Review A. Apr. 30, 2015;91(4):043846.
International Preliminary Report on Patentability for International Application No. PCT/US2019/039945, dated Jan. 7, 2021.
Extended European Search Report for European Application No. 19751978.8, dated Sep. 6, 2021.
Reinhold et al., Error-corrected gates on an encoded qubit. Nature Physics. Aug. 2020;16(8):822-6.
U.S. Appl. No. 16/959,251, Rosenblum et al., filed Jun. 30, 2020.
U.S. Appl. No. 17/253,460, Puri et al., filed Dec. 17, 2020.
International Preliminary Report on Patentability for International Application No. PCT/US2019/012441, dated Jul. 16, 2020.
Extended European Search Report for European Application No. 19866408.8, dated Feb. 28, 2022.
Blumoff et al., Implementing and characterizing precise multiqubit measurements. Physical Review X. Sep. 14, 2016;6(3):031041.
Cohen, Autonomous quantum error correction with superconducting qubits. Université Paris Sciences et Lettres Doctoral Dissertation. Jun. 22, 2017:1-165.

(56) References Cited

OTHER PUBLICATIONS

Frattini et al., Optimizing the nonlinearity and dissipation of a snail parametric amplifier for dynamic range. Physical Review Applied. Nov. 8, 2018;10(5):054020.

Hu et al., Quantum error correction and universal gate set operation on a binomial bosonic logical qubit. Nature Physics. May 2019;15(5):503-8.

* cited by examiner

| | 450<br>Master Sequence Instructions | |
|---|---|---|
| | *Manipulation* | |
| 1 | Amplitude scale 1.0 | |
| 2 | No manipulation | |
| 3 | Amplitude scale 0.9 | |
| 4 | No manipulation | |
| ... | | |
| 41 | Amplitude scale -1.0 | |
| 42 | No manipulation | |

| | 460<br>Analog Sequence Instructions | |
|---|---|---|
| | *Bare I* | *Bare Q* |
| 1 | Gaussian Waveform | Delay |
| 2 | Delay | Delay |

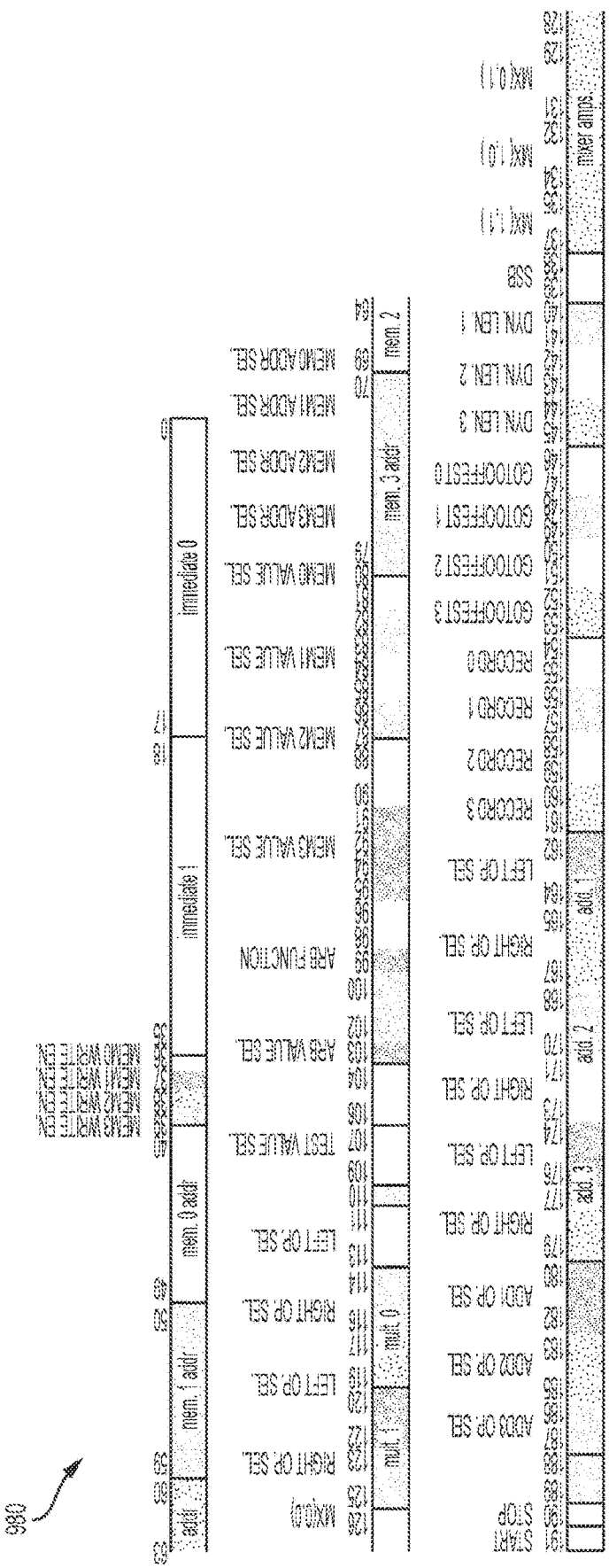

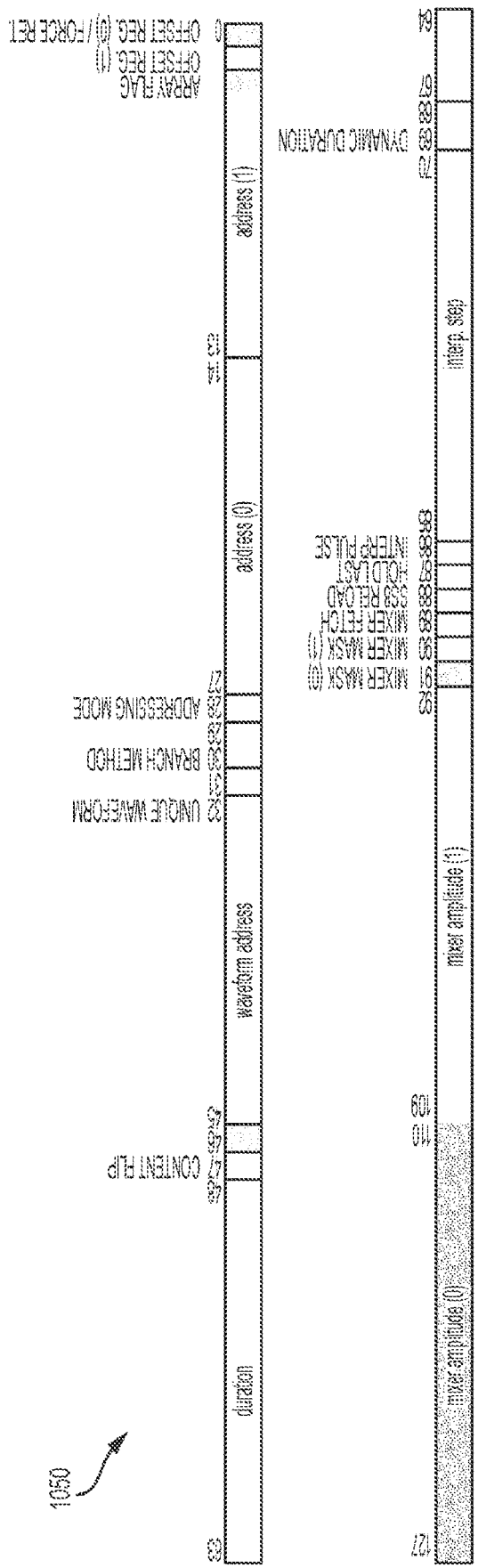

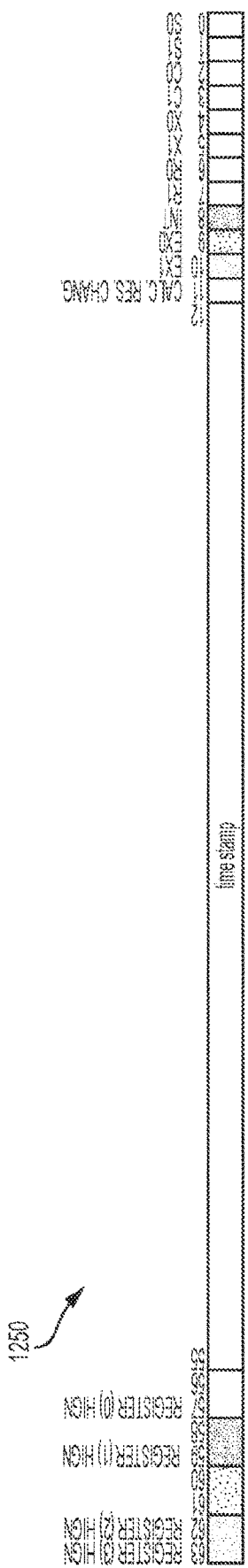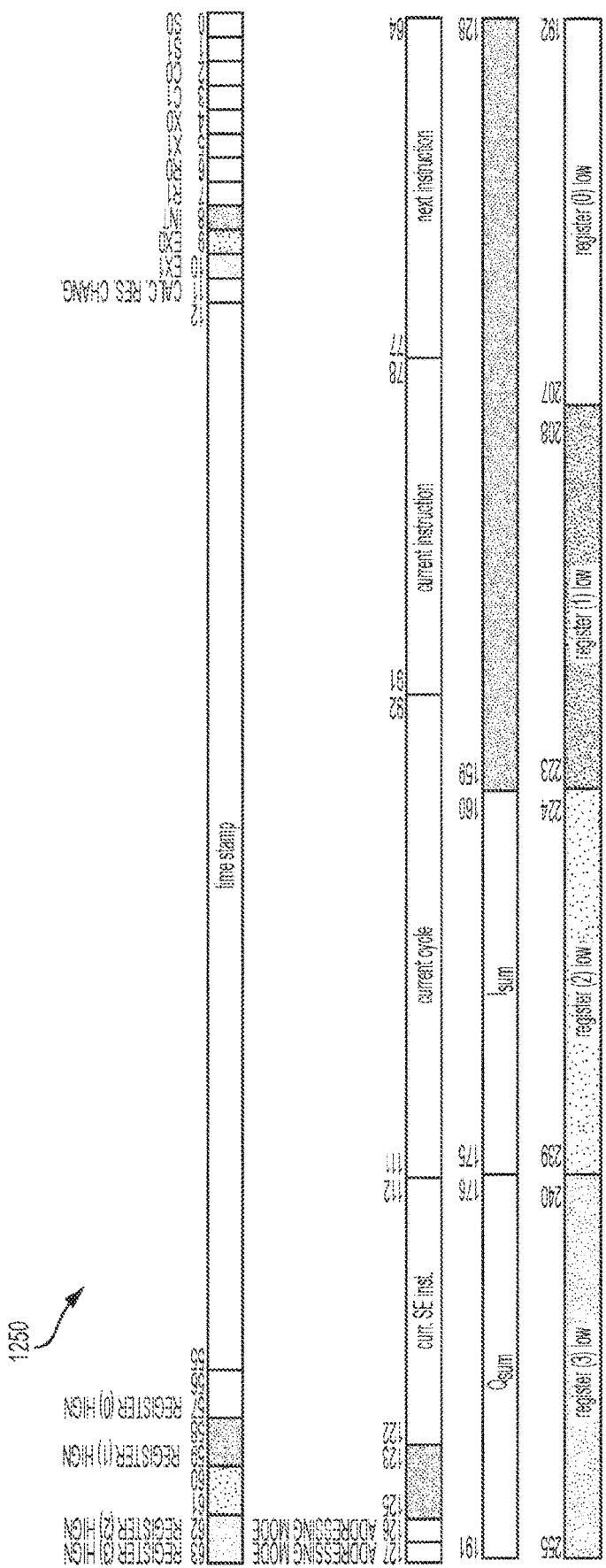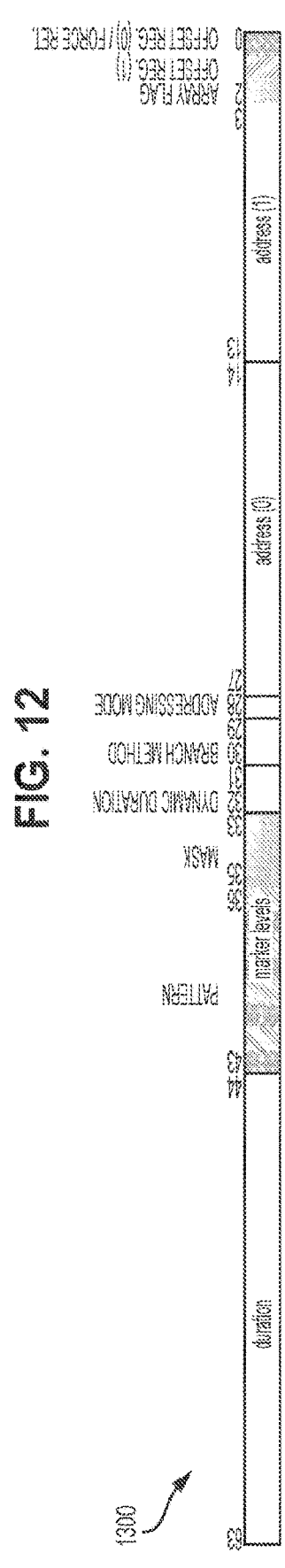
FIG. 12
FIG. 13

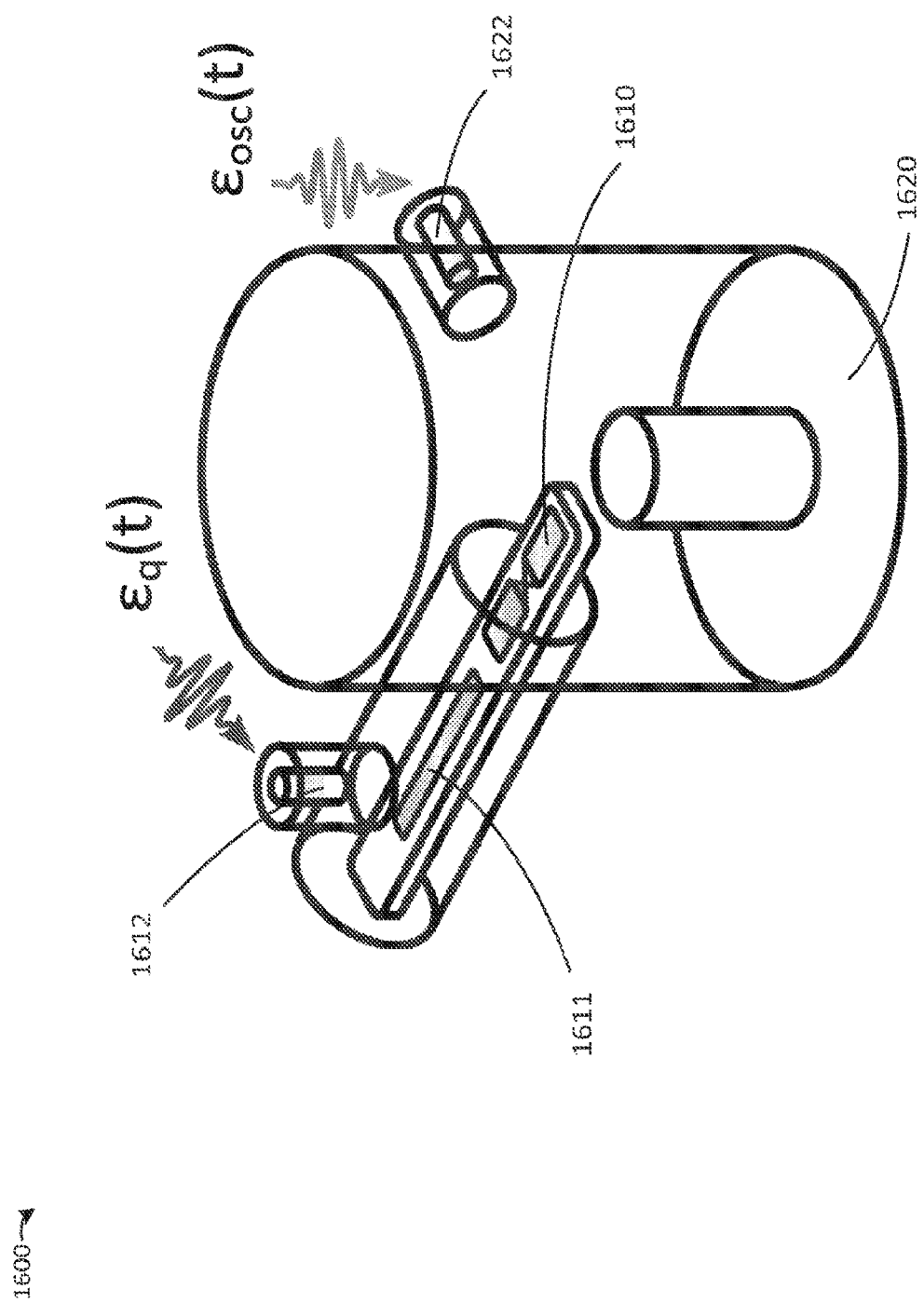

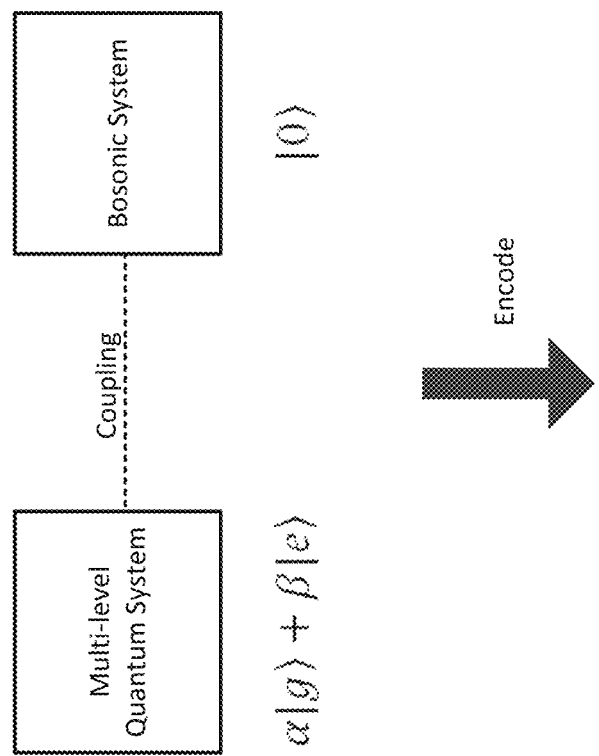
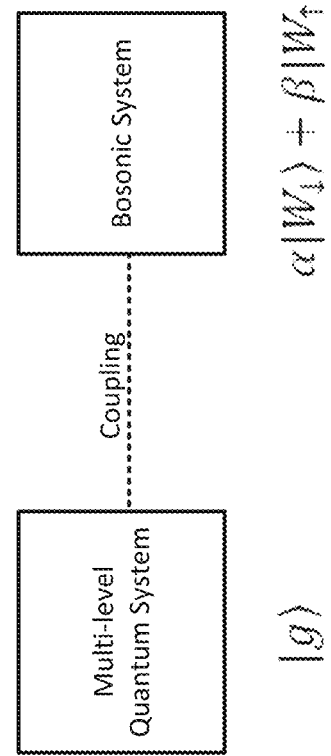
FIG. 24A
FIG. 24B

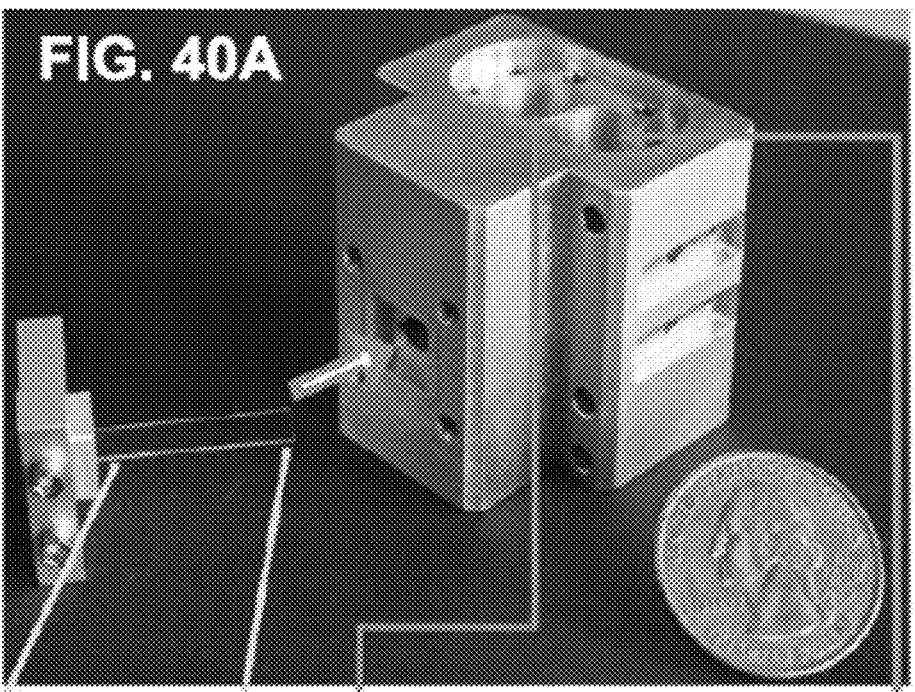
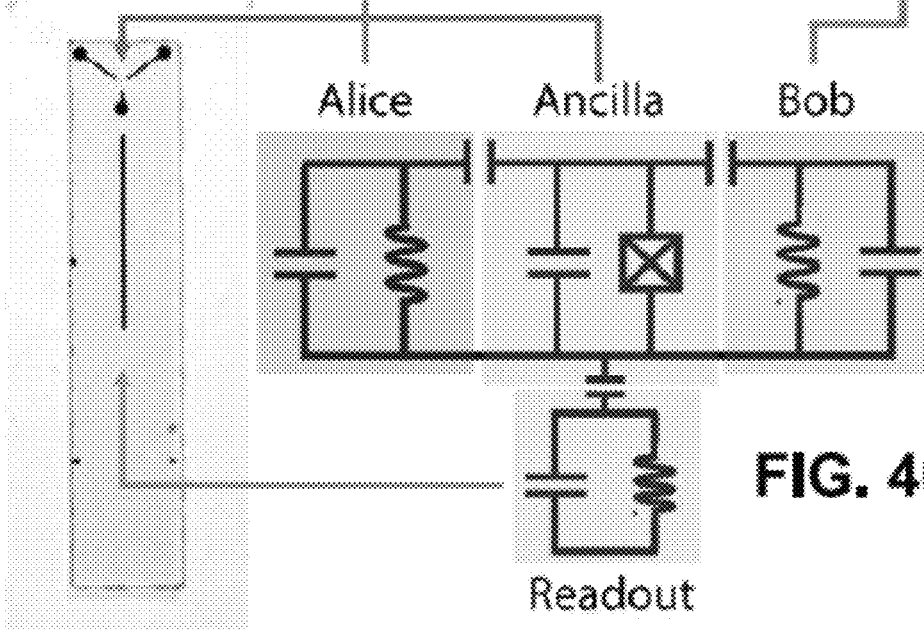
FIG. 40B

TECHNIQUES FOR CONTROL OF QUANTUM SYSTEMS AND RELATED SYSTEMS AND METHODS

CROSS-REFERENCE TO RELATED APPLICATIONS

This Application is a national stage filing under 35 U.S.C. 371 of International Patent Application No. PCT/US2017/017534, filed Feb. 10, 2017, entitled "TECHNIQUES FOR CONTROL OF QUANTUM SYSTEMS AND RELATED SYSTEMS AND METHODS", which claims priority to U.S. Provisional Patent Application No. 62/294,966, filed Feb. 12, 2016, entitled "QUANTUM COMPUTER STATE CONTROLLER," each of which is incorporated herein by reference to the maximum extent allowable.

FEDERALLY SPONSORED RESEARCH

This invention was made with government support under W911NF-14-1-0011 awarded by Army Research Office. The government has certain rights in the invention.

BACKGROUND

Quantum information processing uses quantum mechanical phenomena, such as energy quantization, superposition, and entanglement to encode and process information in a way not utilized by conventional information processing. In the mid 1990's, it was theoretically demonstrated how a quantum computer could be used to perform certain algorithms much more rapidly than could be achieved by a conventional, or "classical" computer. For instance, rapid factorization of large numbers has important implications for encryption and secure communications, and it was postulated that a quantum computer could perform such rapid factorization and thereby easily decipher communications encrypted by conventional computing techniques. Many technical barriers exist to developing a functional quantum computer, however.

It is well-known in the field of quantum information processing that qubits (a.k.a. quantum bits, the analog of conventional binary bits) naturally evolve to other states and lose their information (decohere) if left unattended in a quantum information system. This loss of information by qubits in a quantum information processing system can inhibit or prohibit computation by the system. The duration over which a qubit retains its information is referred to as the coherence time, and this time depends upon the way in which qubits are formed. Various ways to form qubits include trapped ions, atoms of nuclear magnetic resonance systems, photons, nitrogen vacancy centers, and superconducting quantum circuits utilizing Josephson junctions. Although dramatic improvements have been made, the best superconducting quantum systems currently have coherence times on the order of several hundred microseconds to a few milliseconds. Since complex computations will generally take longer than these coherence times, apparatus and methods for implementing quantum error correction (QEC) to preserve quantum information longer than the coherence time (i.e., surpass the "break-even point") may be required for practical quantum information processing systems.

SUMMARY

The present application relates generally to control electronics for quantum information systems, including implementations of quantum error correction.

According to some aspects, a waveform processor is provided comprising one or more data storage devices that include a first memory for storing a plurality of master instructions, wherein a master instruction comprises a plurality of digital data fields and the master instructions have a defined order, and a second memory for storing a plurality of digital waveforms, a first sequencer comprising a first plurality of logic blocks configured to access the first memory and sequentially execute the master instructions according to their defined order, the first sequencer having a first digital output configured to output digital values based at least in part on results of executing the master instructions, a second sequencer coupled to the first sequencer and configured to receive values from the first digital output, the second sequencer comprising a second plurality of logic blocks configured to access the second memory, generate analog waveforms at least in part by transforming one of the plurality of digital waveforms according to one or more of the digital values received from the first sequencer, and output the generated analog waveforms to an external system, and a waveform analyzer comprising a third plurality of logic blocks configured to integrate analog waveforms received from the external system and to output results of said integration to the first sequencer.

According to some embodiments, the one or more data storage devices further include a third memory for storing a plurality of waveform instructions, a waveform instruction comprises a plurality of digital data fields and the waveform instructions have a defined order, and the second plurality of logic blocks of the second sequencer are further configured to access the third memory and sequentially execute the waveform instructions according to their defined order, and generate the analog waveforms according to the executed waveform instructions.

According to some embodiments, the waveform instructions include at least a first branch instruction and the second sequencer is further configured to identify a non-sequential waveform instruction of the plurality of waveform instructions to execute subsequent to the first branch instruction based at least in part on a digital signal received by the second sequencer from the first sequencer.

According to some embodiments, the second plurality of logic blocks of the second sequencer are further configured to repeatedly execute the plurality of waveform instructions according to their defined order.

According to some embodiments, the master instructions include at least a first branch instruction and the first sequencer is further configured to identify a non-sequential master instruction of the plurality of master instructions to execute subsequent to the first branch instruction based at least in part on a digital signal received by the first sequencer.

According to some embodiments, the digital signal received by the first sequencer is received by the first sequencer from the waveform analyzer and comprises a result of said integration by the waveform analyzer.

According to some embodiments, the first sequencer is further configured to output a digital instruction to the second sequencer based at least in part on the result of said integration received by the first sequencer from the waveform analyzer.

According to some embodiments, the integration of analog waveforms by the waveform analyzer is triggered by execution of a master instruction by the first sequencer.

According to some embodiments, the external system is a quantum system including a qubit, and the generated analog waveforms are designed to rotate a state of the qubit.

According to some embodiments, the first sequencer is further configured with a second digital output configured to output digital values based at least in part on results of executing the master instructions, the waveform processor further comprising a third sequencer coupled to the first sequencer and configured to receive values from the second digital output, the third sequencer configured to output digital values according to one or more of the digital values received from the first sequencer.

According to some embodiments, transforming one of the plurality of digital waveforms by the second sequencer comprises performing a linear transformation of the one of the plurality of digital waveforms based at least in part on the one or more digital values received from the first sequencer.

According to some embodiments, the one or more data storage devices, the first sequencer, the second sequencer and the waveform analyzer are assembled on a single substrate.

According to some embodiments, the first sequencer, the second sequencer and the waveform analyzer are embodied in a field-programmable gate array.

According to some embodiments, the first sequencer, the second sequencer and the waveform analyzer are embodied in an application specific integrated circuit.

According to some embodiments, the first sequencer, the second sequencer and the waveform analyzer are configured to receive a common clock signal.

According to some embodiments, the second sequencer is configured to generate the analog waveforms as comprising IQ waveform pairs.

According to some embodiments, the second sequencer is configured to generate the analog waveforms as single-sideband modulated waveforms.

According to some embodiments, the second sequencer comprises a digital-to-analog converter, and the waveform analyzer comprises an analog-to-digital converter.

According to some aspects, a system is provided comprising the waveform processor and a superconducting qubit coupled to the waveform processor.

According to some aspects, a system is provided comprising a plurality of instances of the waveform processor communicatively coupled to one another.

According to some aspects, a method is provided comprising selecting, by a first sequencer that comprises a first plurality of logic blocks, a first master sequence instruction from a plurality of master sequence instructions stored in a first memory of one or more data storage devices, wherein a master sequence instruction comprises a plurality of digital data fields and the master instructions have a defined order, executing, by the first sequencer, the first master sequence instruction, outputting, by the first sequencer, one or more digital values to a second sequencer comprising a digital-to-analog converter and a second plurality of logic blocks, generating, by the second sequencer, a first analog waveform that has characteristics at least in part by transforming one of the plurality of digital waveforms according to the one or more digital values received from the first sequencer, applying the first analog waveform to a system, integrating, by a waveform analyzer comprising a first analog-to-digital converter and a third plurality of logic blocks assembled on a substrate, a first received analog waveform from the system, providing, by the waveform analyzer, a result of the integration to the first sequencer, and executing, by the first sequencer, a second master sequence instruction of the plurality of master sequence instructions based on the received result from the waveform analyzer.

According to some embodiments, the method further comprises computing, by the first sequencer, an internal result based in part on the result of the integration, providing, by the first sequencer, the internal result to the second sequencer, and outputting, by the second sequencer, a second analog waveform to the system based in part on the internal result.

According to some embodiments, the system is a quantum system including a qubit, and the first analog waveform is designed to rotate a state of the qubit.

According to some embodiments, the method further comprises identifying, by the first sequencer, a non-sequential master instruction of the plurality of master instructions to execute subsequent to the first master sequence instruction based at least in part on the received result from the waveform analyzer.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 9C illustrates data fields of an illustrative processing logic instruction, according to some embodiments;

FIG. 10B depicts an illustrative analog sequencer instruction, according to some embodiments;

FIG. 10C depicts illustrative waveform data, according to some embodiments;

FIG. 12 depicts illustrative output data, according to some embodiments;

FIG. 13 illustrates data fields of an illustrative digital sequencer instruction, according to some embodiments;

FIG. 16 is a schematic drawing of an illustrative circuit quantum electrodynamics system, according to some embodiments;

FIGS. 24A-24B illustrate encoding of the state of a multi-level quantum system in a bosonic system, according to some embodiments;

FIG. 40A is a photograph of a machined aluminum package containing two coaxial stub cavity resonators and a transmon, suitable for practicing aspects of the present disclosure;

FIG. 40B is a micrograph image of the transmon of the device of FIG. 40A; and

FIG. 40C is a schematic effective circuit of the device of FIG. 40A.

DETAILED DESCRIPTION

Figure 1:
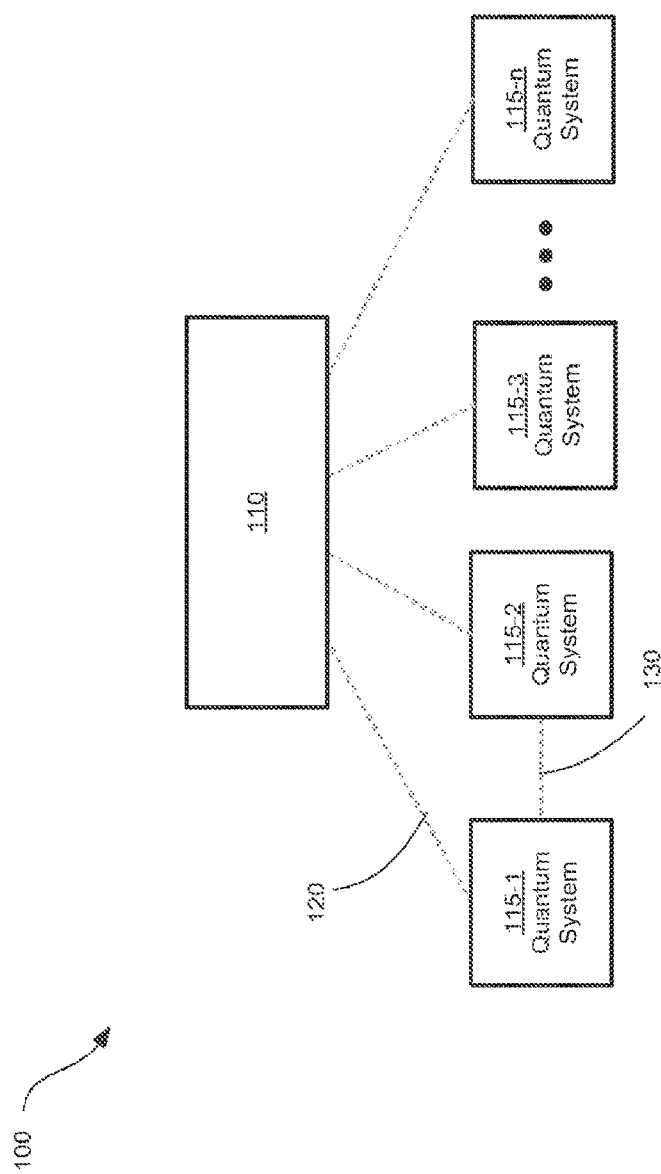
FIG. 1 depicts a quantum information system, according to some embodiments.

Quantum systems exhibit states that typically evolve over timescales of tens or hundreds of nanoseconds. Control over such a system can present a challenge, as one of the following two approaches must be chosen. Firstly, experiments can be limited to those that do not require controls that can be dynamically selected within such timescales based on the current state of the quantum system. This approach, however, limits the types of experiments that can be performed. Alternatively, a control system could be developed to dynamically control the quantum system over the required timescales, which would allow a wide range of experiments to be performed but also presents a practical problem of implementation.

In order to dynamically control a quantum system that evolves over tens or hundreds of nanoseconds, an extremely low latency system would be needed that can probe the state of the quantum system and determine a subsequent control step quickly enough that the system does not evolve into a different state before the subsequent step can be executed. For instance, a qubit state may be a ground state, an excited state, or a superposition of the ground and excited states. To control the qubit based on its current state, a control system may probe the state of the qubit then determine a control operation based on the result. Since the qubit's state may naturally evolve over timescales of less than a microsecond, however, the steps of probing, determining, and controlling should occur in less than such a timescale, otherwise the determined control operation may be operating on a different qubit state than the one identified by the probing operation.

A conventional computer is unable to perform control operations at this latency, since the timescales involved in operating hardware (e.g., signal generators, data acquisition hardware, etc.) to probe a quantum system, send information on results of said probing to the computer, determine a subsequent control operation by the computer, and operate the hardware to perform the subsequent control operation on the quantum system are much greater than those timescales over which the quantum system would evolve. Alternatively, signal generators that are separate from the computer can be programmed with the various operations that may be performed upon the quantum system. The number and type of these operations are substantial, however, and there is generally insufficient data storage in a signal generator to store all of the possible operations. In addition, the processing capability of a signal generator is generally insufficient to dynamically determine which operation to apply. Due to the above difficulties, conventional quantum control systems are generally designed for use with experiments that do not require dynamic control in sub-microsecond timescales.

The inventors have recognized and appreciated that despite the above-described technical challenges for low latency control of a quantum system, to perform effective quantum error correction of a quantum system, such control may be extremely desirable or necessary. Due to the natural evolution of quantum systems, quantum computation may require the repeated performance of quantum error correction (QEC) operations within timescales much shorter than the coherence time (e.g., less than a microsecond). These QEC operations are designed to preserve quantum information in the system, and by performing them in timescales much shorter than the coherence time, information can thereby be preserved for longer than the coherence time. Without repeated QEC operations at these timescales, the system may decohere such that computation is no longer feasible.

Once a control system can repeatedly preserve information in a quantum system for longer than the coherence time by performing QEC operations, the control system can be said to be capable of operating the system beyond the so-called "break-even point" of QEC. This type of system can be scaled in size to encompass more qubits and thereby enable more complex computational operations whilst preserving the information in the system. Prior to the work described in this application, elements of QEC were demonstrated in several different types of quantum information systems. However, none of these efforts demonstrated apparatuses or methods for QEC that could maintain quantum information in a system past the break-even point. As described herein, the inventors have recognized and appreciated apparatuses that can dynamically control a quantum system within timescales that allow QEC to reach or exceed the break-even point.

To illustrate the architecture of a quantum information system in general, FIG. 1 depicts a quantum information system, according to some embodiments. Illustrative system 100 comprises a control apparatus 110 that operates on and receives signals from quantum systems 115-1, 115-2, . . . 115-$n$ through control links 120. The quantum systems may include, for instance, a physical qubit (e.g., a transmon qubit, a charge qubit, a flux qubit, a phase qubit, etc.) or a quantum oscillator (e.g., a resonator cavity). Irrespective of the particular technology implementing the quantum systems, at least some of the quantum systems are operated to store quantum information (e.g., be operated as a qubit). In some implementations, two or more quantum systems may be coupled to one another via a coupling 130, which may cause the states of the coupled systems to affect one other and/or may cause operations on one of the quantum systems to change the state of a quantum system to which it is coupled. For example, the link 130 may represent a dispersive coupling. The system 100 shown in FIG. 1 may, in some cases, be one module of a larger quantum information processing system in which the modules are interconnected.

To become a practical quantum processing system having a reasonable amount of processing power, a quantum information processor 100 requires the ability to precisely control at least some of the quantum systems 115, and to control at least some interactions between the quantum systems. For instance, to perform a logical operation between two or more qubits, the control apparatus 110 may be configured to perform one or more control operations upon the quantum systems storing the qubit information. It is preferable that the quantum systems have long coherence times, be able to be individually manipulated, be able to interact with one or more other quantum systems (e.g., to implement multi-qubit gates), be able to be initialized and measured efficiently, and that the system allow scaling to a large numbers of quantum systems. It is also preferable that the control apparatus 110 be scalable to controlling a large number of quantum systems.

Figure 2A:
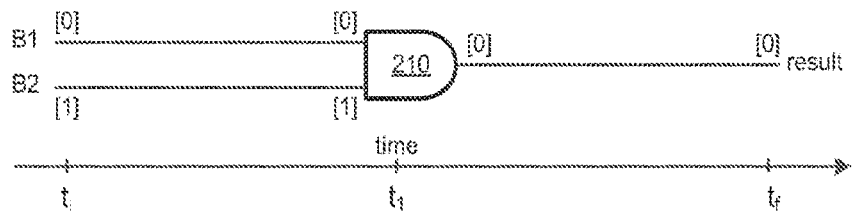
FIG. 2A depicts a conventional logic gate.

Working with qubits in a quantum information processor is generally much more challenging than working with conventional binary bits in a conventional computer. By way of illustration, FIG. 2A depicts a conventional AND operation 210 that may be executed over time. In the example of FIG. 2A, at a first time $t_i$ two binary bits B1 and B2 are prepared in initial states, each being either 0 or 1. Because of thresholding and recognition of only two states in a conventional computer, it is permissible for preparation of these states to be quite imprecise. For example, in a 3.3V CMOS system, any bit having a voltage value between 0 V and 1.4 V is recognized as a logical 0, and any bit having a voltage value between 1.55 V and 3.3V is recognized as a logical 1. Thus, even if the bits are prepared imprecisely and perturbations occur between the time at which the bits are prepared and the time $t_1$ at which the logical operation occurs, the bits are almost always (with an error rate typically lower than $10^{-9}$) correctly recognized for a logic operation, and the result is almost always correctly recognized at a later time $t_f$.

Figure 2B:
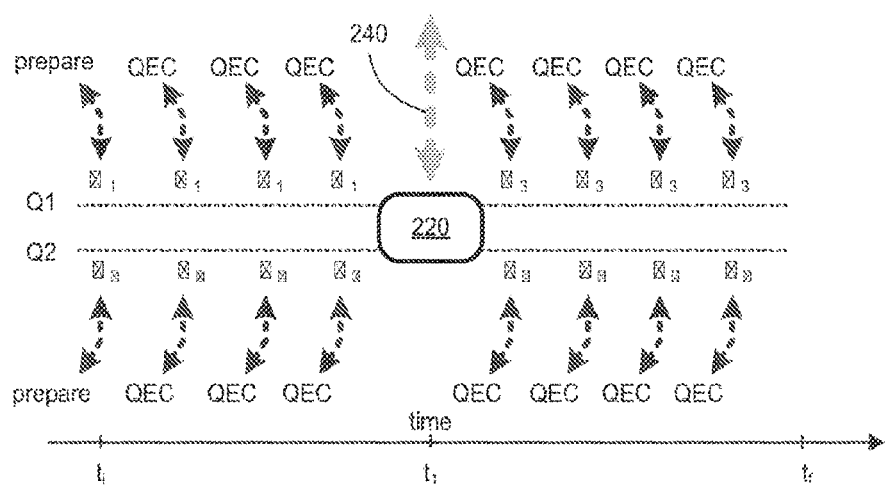
FIG. 2B depicts implementation of a quantum logic gate, according to some embodiments.

Although qubits are based on two orthogonal states, they are not limited to one of two states like their binary counterparts. Instead, qubits may assume any superposition of the two states, and every superposition state matters for quantum computations. FIG. 2B illustrates how a logical operation may be carried out with a quantum information processor 100, according to some embodiments. Two qubits Q1, Q2 may be prepared at time $t_i$ in two quantum states $\Psi_1$, $\Psi_2$. Because of decoherence, these states will naturally and unpredictably evolve to other states over time such that that the information stored by the qubits may be lost. To preserve each qubit's state until execution of a logical operation 220 at time $t_1$, one or more quantum error correction QEC steps may be applied. After application of the logical operation 220, which transforms the two qubit states to quantum states $\Psi_3$, $\Psi_4$, additional QEC steps may be applied until the qubits are, for instance, read and/or used to perform another logical operation. The way in which qubits are physically implemented may determine how interactions with the qubits are carried out and the repetition rate at which QEC steps are implemented.

One promising approach to implementing qubits is known as circuit quantum electrodynamics (circuit QED). Other approaches include those based on trapped atoms intermediated by optical photons and solid-state impurities intermediated by phonons. Such qubits are macroscopic compared to atoms or impurity sites and can be engineered to have desired properties and comparatively long coherence times. In a circuit QED system, control links 120 may be implemented with microwave signals (e.g., signals at frequencies between about 3 GHz and about 40 GHz) that couple to the quantum systems 115 (e.g., wirelessly, via waveguides, etc.). Referring again to FIG. 2B, QEC steps and logical operation 220 may be implemented by applying carefully prepared microwave signals to the qubits.

Another challenging difference between a quantum information processor and conventional processor is the way in which logical operations are performed. In a conventional processor, a logic gate 210 typically comprises CMOS transistors formed on a semiconductor substrate that receives voltage signals representative of the bits' B1, B2 states. The logic gate is static hardware that is typically the same hardware throughout the system. In a circuit QED quantum information processor, a logical operation 220 may be implemented as a sequence of microwave signals 240 that act on the quantum bits Q1, Q2 directly to alter their states. The microwave signals 240 must be carefully prepared and may be slightly different throughout a processing system due to differences in connection hardware. In some cases, the microwave signal 240 for a particular logic operation may be altered slightly based upon signals applied immediately prior to the microwave signal for the logic operation (e.g., due to heating of the quantum system by the prior signal).

As discussed above, conventional quantum control systems are generally designed for use with experiments that do not require dynamic control in sub-microsecond timescales, but this forecloses reaching the break-even point in quantum error correction. To operate the control apparatus 110 in such a way as to perform a given experiment, which may include executing numerous logical gates upon quantum systems 115 in addition to quantum error correction operations (e.g., as shown in FIG. 2B), requires that the control apparatus be able to perform a wide array of control operations, and that it be able to dynamically choose from these operations based on the states of the quantum systems 115 in less than the coherence time of the quantum system. As discussed above, these requirements place demands on both the latency of the control logic and the storage capabilities of the control apparatus.

The inventors have recognized and appreciated techniques for executing a preconfigured sequence of instructions by a control apparatus such that signals for operating upon a quantum system can be generated and applied to the quantum system in less than the coherence time of a typical quantum system. The dynamic generation of signals allows for a large number of possible signals to be available for application to the quantum system without it being necessary to store all the possible signals in the control apparatus. The inventors have recognized that the diversity in signals that may be applied to a quantum system lies primarily in the different amplitudes and phases of the signals, and less so on the shape of the signals. The techniques described herein dynamically generate signals for operating upon a quantum system by transforming one of a number of template (or "base") pulse envelopes into a desired signal. Thus, only the base waveforms need to be stored by the hardware that communicates with the quantum system.

The inventors have further recognized and appreciated techniques for integrating signals received from a quantum system by a control apparatus such that the logical flow of the sequence of instructions can be altered based on the received signals. The sequenced instructions can be configured to cause the control apparatus to integrate and interpret these signals and to use the result to adjust the logical flow of the instructions (e.g., by jumping to a non-sequential instruction in the sequence). Since received signals can encode information about the state of a quantum system, the sequence of instructions can be arranged to execute different operations when two logically distinct signals are received from the quantum system, thereby dynamically executing instructions based on the state of the quantum system.

According to some embodiments, the control apparatus may include circuitry that executes instructions according to a predefined sequence. As used herein, circuitry so configured is referred to as a "sequencer," and a control apparatus may include one or more sequencers that each executes distinct sequences of instructions. Sequences may be loaded onto memory or other suitable storage media, or otherwise accessible to a sequencer such that the sequencer is able to retrieve the instructions of the sequence in order and execute the instructions. According to some embodiments, instructions may include a plurality of digital data fields and the sequencer may be configured to interpret the data fields to determine which operation(s) to perform (e.g., generate a signal to apply to a quantum system, integrate a signal received from a quantum system, etc.). The data fields may also include information that can be used in performing said operations (e.g., may include a template signal or a pointer to a template signal in a memory, etc.).

According to some embodiments, the control apparatus may include one or more analog-to-digital convertors (ADCs) or digital-to-analog convertor (DACs). The digital sequencer(s) of the control apparatus may be configured to execute digital instructions and to produce analog signals that may be output to a quantum system via a DAC and/or to receive analog signals received from a quantum system via an ADC.

Following below are more detailed descriptions of various concepts related to, and embodiments of, control apparatuses for quantum systems. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 3:
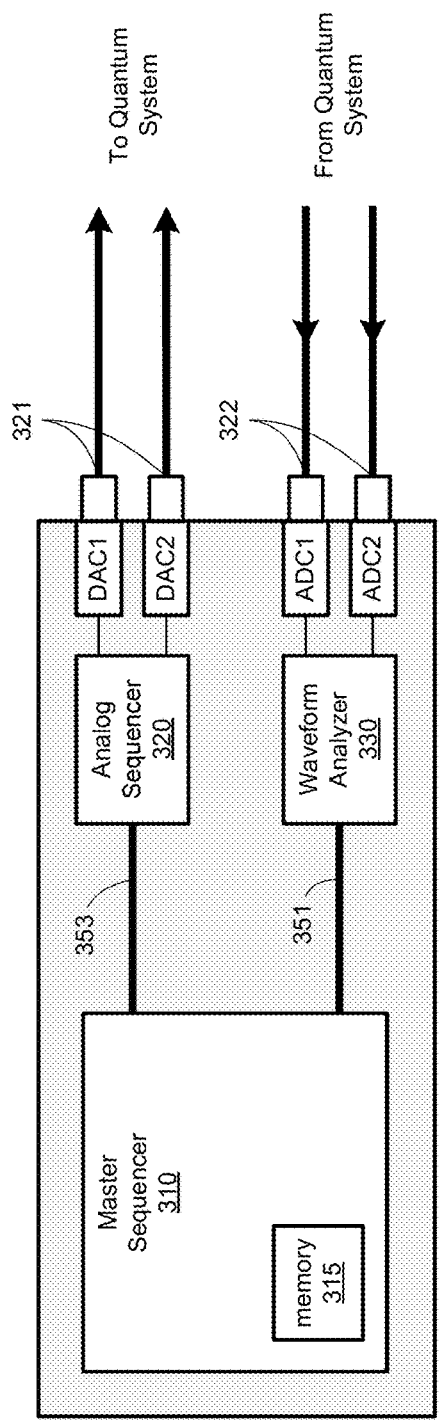
FIG. 3 is a block diagram of an illustrative waveform processor, according to some embodiments.

FIG. 3 is a block diagram of an illustrative waveform processor, according to some embodiments. The illustrative waveform processor 300 may be a component of the control apparatus 110 shown in FIG. 1 and may be configured to interact with one of the quantum systems 115 (e.g., may be configured to implement one of the control links 120). The waveform processor 300 includes a master sequencer 310, an analog sequencer 320 and a waveform analyzer 330, in addition to DACs 321 and ADCs 322 which are configured to, respectively, output analog signals to the quantum system that have been converted from digital waveforms; and receive and digitize analog signals received from the quantum system. The analog sequencer 320 may be a digital component but is referred to as an "analog" sequencer herein since it is involved in producing analog signals and to distinguish it from the master sequencer. Each of the sequencer components pictured can include multiple sequencer units when implemented. For example, the analog sequencer may include two sequencers operating in parallel that each output signals to one of the DACs 321.

In the example of FIG. 3, the master sequencer 310 coordinates operation of other components of the waveform processor. In particular, the master sequencer 310 may execute instructions that signal the analog sequencer 320 to generate and produce analog waveforms via the DACs 321, and may execute instructions that trigger the waveform analyzer 330 to receive and analyze signals received via ADCs 322. The master sequencer may also execute other instructions that do not cause interactions between the master sequencer and the analog sequencer or waveform analyzer.

The master sequencer may be in communication with the waveform analyzer 330 through a communication link 351. The waveform analyzer may be configured to process waveforms received from a quantum system. The master sequencer 310 may also be in communication with an analog sequencer 320 via a second communication link 353. The analog sequencer may be configured to generate digital waveforms that are converted into analog waveforms (by digital-to-analog converters (DAC1, DAC2), for example) and applied to a quantum system (e.g., used to execute quantum operations on a qubit).

In overview, operation of the illustrative waveform processor may begin by the master sequencer 310, the analog sequencer 320 and the waveform analyzer 330 being loaded with instructions that determine their operation. Instructions can be loaded and made accessible to respective components by loading the instructions onto any number of data storage devices on the waveform processor 300. For instance, memory 315 may be a memory shared by each sequencer and that stores sequences for each of the sequencers. Alternatively, memory 315 may store a sequence for the master sequencer 310 and analog sequencer 320 and waveform analyzer 330 may each include separate memories (not shown) for storing respective instructions. According to some embodiments, prior to carrying out a quantum operation with the waveform processor 300, the instructions may be preloaded onto the waveform processor 300 from a conventional computer (e.g., over a digital I/O port, not shown).

In operation, the waveform processor 300 may output a pair of analog waveforms by producing digital waveforms from the analog sequencer 320 and converting the waveforms to analog signals. These waveforms may be sent to a quantum system either directly or indirectly. For example, the waveforms may be transmitted indirectly to the quantum system by transmitting the signals to RF generator components, which in turn produce signals that are applied to one or more quantum systems to perform a quantum operation (e.g., a logic gate, an error correction, etc.). Subsequently, return signals from the quantum system(s) may be routed to the waveform analyzer 330.

In some embodiments, trigger values sent by the master sequencer 310 to the waveform analyzer 330 may determine when and/or how the results of processing the received signals by the waveform analyzer are to be sent to the master sequencer for further processing. A master sequencer's instruction may determine when and how it processes data from the waveform analyzer. The master sequencer may then set values for data fields in memory, based upon its computations, that are accessed by instructions that are currently executing or to be executed by the analog sequencer and/or waveform analyzer. In this manner, the master sequencer can influence operational flow of the waveform processor 300.

According to some embodiments, a waveform processor 300 may be implemented at least in part using a field-programmable gate array (FPGA). In some implementations, a waveform processor may be implemented at least in part using an application-specific integrated circuit (ASIC). For example, the master sequencer 310 may be implemented with a first group of logic blocks and gates of an FPGA or ASIC. The waveform analyzer 330 may be implemented with a second group of logic blocks and gates of an FPGA or ASIC. The waveform analyzer may further include (or may be coupled to) analog-to-digital converters ADC1, ADC2 arranged to receive a signal pair at analog input ports 322. The analog sequencer 320 may be implemented with a third group of logic blocks and gates of an FPGA or ASIC. The analog sequencer may further include (or may be coupled to) digital-to-analog converters DAC1, DAC2 arranged to convert digital data streams from the analog sequencer to analog output signals for analog output ports 321. Any of the sequencers and the waveform analyzer may include or share random access memory (RAM), according to some embodiments. According to some embodiments the master sequencer 310, analog sequencer 320 and waveform analyzer 330 may be assembled on a single substrate. Where the waveform processor 300 includes one or more DACs and/or ADCs, these may be assembled on the same substrate as the master sequencer 310, analog sequencer 320 and/or waveform analyzer 330.

According to some embodiments the master sequencer 310, analog sequencer 320 and waveform analyzer 330 may all execute their operations, according to their individual instructions, synchronously and in parallel. For example, the analog sequencer, the waveform analyzer and the master sequencer may all be driven by a same clock when stepping through their respective instructions. Synchronization between these components may be assumed, but not verified—that is, each of the sequencers may execute instructions in successive clock cycles and assume the other sequencers are doing the same without verifying this synchronization. In this regard, the waveform processor 300 operates as a multi-core processor, in which each core is specialized for a particular task but does not ensure synchronization with other cores (e.g., specialized for generating analog waveforms to output to the quantum system, analyzing waveforms received from the quantum system, digesting received data to determine operational flow, communicating digital signals, etc.).

In some embodiments, the waveform processor may be further configured to allow communication with other waveform processors in a cluster. For instance, the waveform processor may include a communication link for sending and/or receiving data from other instances of the waveform processor. In some embodiments, communication between waveform processors may be implemented by including one or more data fields in sequencer instructions that are shared or accessed by plural waveform processors. Communication with other waveform processors in a cluster may be implemented by importing and exporting values for these data fields. These data fields may be updated at any time, so that each core's operation on any waveform processor in a cluster may be changed as needed during run time. In some embodiments, none of the waveform processors within a cluster may be master to other slave waveform processors. Instead, each waveform processor can operate nearly independently of the other waveform processors, relying only on shared data field values from other waveform processors that may influence operation of an individual waveform processor. Because of this architecture, a waveform processor cluster is readily scalable. More waveform processors 300 may be added to address more quantum systems. For instance, each control link 120 in FIG. 1 may be implemented by one waveform processor.

Figures 4A, 4B:
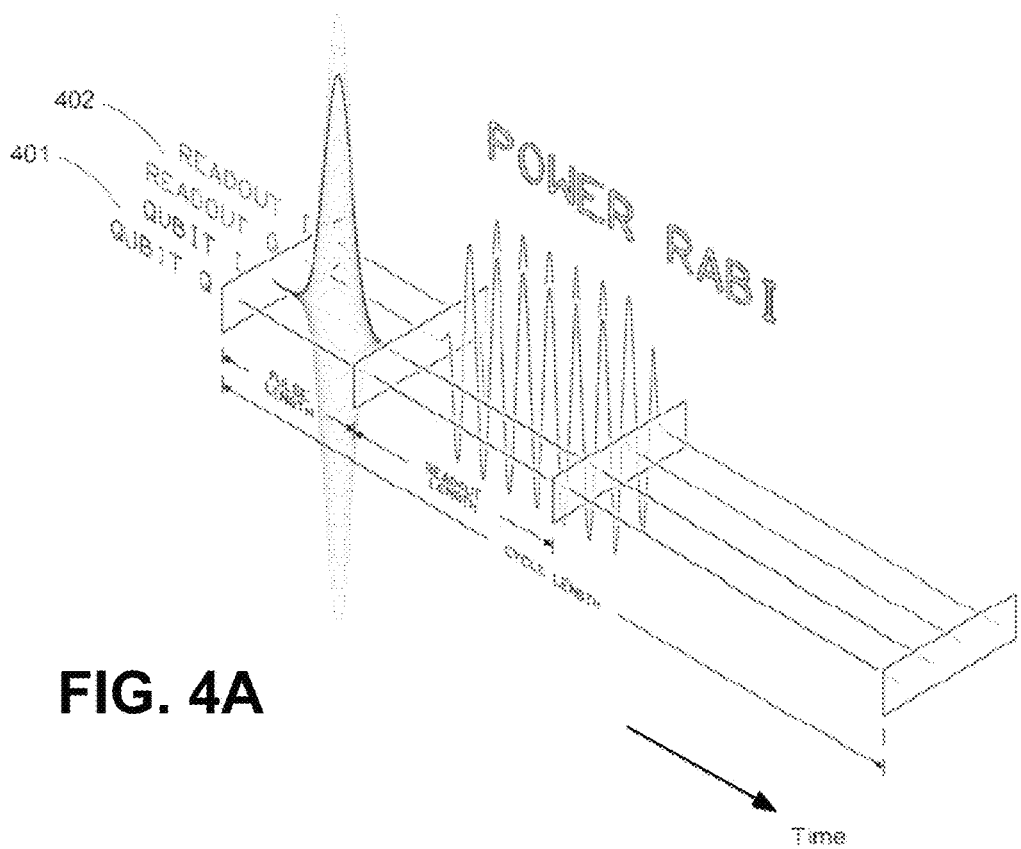
FIG. 4A depicts waveforms that may be generated during an illustrative experiment on a quantum system, according to some embodiments.
FIG. 4B shows sequencer instructions that may be executed within the system of FIG. 3 to produce some of the waveforms shown in FIG. 4A, according to some embodiments.

By way of example, the following describes an illustrative experiment with a quantum system that may be executed by waveform processor 300. FIG. 4A depicts waveforms that may be generated during a "Power Rabi" experiment in which pulses are applied to a qubit (which may be a physical qubit, such as a transmon, or a logical qubit, such as one implemented using superpositions of states of a quantum oscillator) to produce a rotation of the qubit state. This experiment may be used to calibrate the amplitudes of waveforms in order to understand how the various amplitudes map to the magnitudes of qubit state rotations. FIG. 4B shows sequencer instructions that may be executed within the system of FIG. 3 to produce some of the waveforms shown in FIG. 4A, according to some embodiments.

The illustrative waveforms 400 represent two analog signals, where each signal is modulated to provide I and Q components. A first of the two analog signals in FIG. 4A are labeled as a "qubit" signal having I and Q components (the leftmost two signals) and is shown evolving over time as a Gaussian pulse. A second of the two analog signals is labeled as a "readout" signal having I and Q components (the rightmost two signals) and is shown as an oscillating signal that is produced after the qubit pulse is produced. A delay period in which no signal is output follows the qubit pulse and the readout pulse.

In the illustrative Power Rabi experiment, it is a goal to produce a Gaussian pulse over a range of amplitudes. As discussed above, the techniques described herein utilize base waveforms to reduce storage and to dynamically compute desired signals according to instructions executed by a sequencer. In FIG. 4B, illustrative instructions to be executed by the master sequencer 310 are shown as master sequence instructions 450, and illustrative instructions to be executed by the analog sequencer 320 are shown as analog sequence instructions 460. The illustrated are instructions are those configured to produce the qubit analog signal, and another sequence (not shown) would be used to produce the readout analog signal.

In the example of FIGS. 4A-4B, the analog sequencer is configured to executed analog sequence instructions 460 in the illustrated sequence and, once the end of the sequence is reached, execute the initial instruction again, and so on. The two illustrated instructions will thereby be executed repeatedly (1, 2, 1, 2, 1, etc.).

Initially, master sequence instruction #1 will be executed by the master sequencer and, in the same clock cycle, analog sequence instruction #1 will be executed by the analog sequencer. The master sequencer instruction #1 is configured to supply values to the analog sequencer that allow the analog sequencer to manipulate a waveform to form an output signal. These supplied values, in the example of FIG. 4B, apply an amplitude of scale 1.0 to the waveform. Note that, in the example of FIG. 4B, the master sequence instruction #1 includes no information about the waveform to be applied—it only includes values for transforming a waveform. When the analog sequencer receives these values, it transforms the waveforms supplied in its instruction #1 (a Gaussian for the I component, no signal for the Q component), thereby producing a Gaussian pulse with amplitude 1.0 for the I component and a baseline signal for the Q component. The analog sequencer then forms a modulated signal and outputs the signal to one of the DACs 321.

Instruction #2 in the master sequence instructions 450 is included as a time window in which to measure the state of the qubit. Since the initial instruction #1 may produce the Gaussian pulse as shown in the instructions 450 and 460 (and a readout pulse, as not shown), in a subsequent time period the state of the qubit system may be measured. During this time, an instruction may be executed by the master sequencer but does not include manipulation of a waveform, as denoted by the label "no manipulation" in FIG. 4B. It may be true, however, that the master sequencer instruction #2 does perform other functions in the waveform processor, such as triggering the waveform analyzer to read a signal received from the qubit.

It will be noted that the instructions depicted in FIG. 4B are shown in a representational form and can be represented in a digital form in any suitable way. In particular, waveforms such as the Gaussian waveform of instruction #1 in the analog sequence instructions may be included within the digital instruction, or may alternatively be stored in a memory location that is referenced by the digital instruction.

In some embodiments, master sequence instructions as shown in FIG. 4B may be optimized as follows. Instead of storing the complete sequence of master sequence instructions 450, in the example of FIG. 4B the master sequencer may instead store only two master sequence instructions: the first, setting an amplitude scale of (1.0--0.1×N) and the second with no manipulation. By repeatedly executing this sequence of instructions, but incrementing the value of N in each iteration (N=0, 1, 2, etc.), the master sequence instructions 450 may be replicated. As discussed below, a master sequencer may be configured to perform arithmetic operations and store values, and such a configuration may thereby enable more efficient processing of master sequence instructions as illustrated by this example.

Figure 5A:
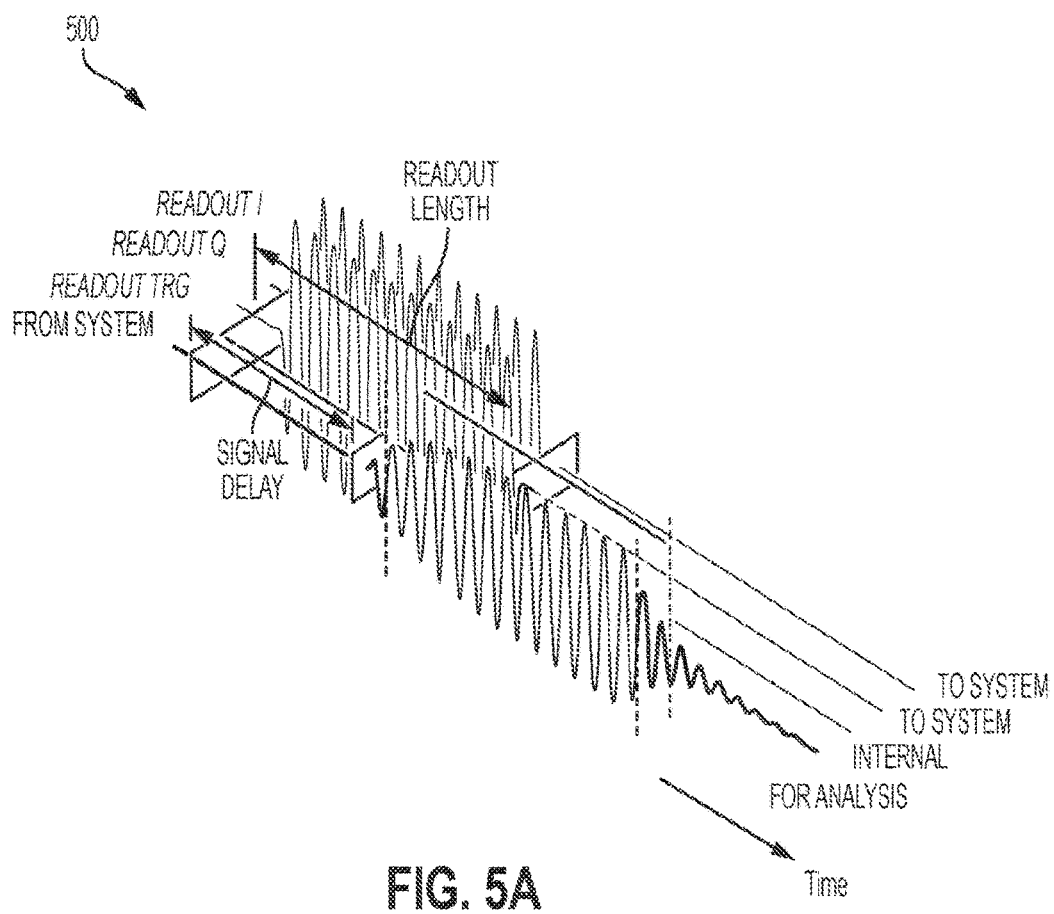
FIG. 5A depicts waveforms that may be used to measure information from a quantum system, according to some embodiments.

FIG. 5A depicts waveforms that may be used to readout information from a quantum system, according to some embodiments. Once an analog signal is output from the waveform processor 300 to a quantum system, a subsequent signal is received from the quantum system that has encoded within it information about the state of the quantum system. For example, the amplitude and/or phase of the received signal may indicate the state. FIG. 5A illustrates signals 500 that include readout pulses having I and Q components (the rightmost two signals), which are the same as those readout pulses shown in FIG. 4A. After the readout signal begins output to the quantum system, a signal is received by the waveform analyzer 330 (via an ADC 322) from the quantum system, shown as an oscillating signal in FIG. 5A (leftmost signal). To capture that signal using the waveform analyzer, the waveform analyzer is configured to produce an internal trigger signal representing a period during which the incoming signal will be captured. This trigger signal is shown second from the left in FIG. 5A as a constant high value during the trigger and a constant low value otherwise. In some embodiments, the trigger signal may be generated by the master sequencer, or may be caused to be generated by the waveform analyzer by a signal received by the waveform analyzer from the master sequencer.

Figure 5B:
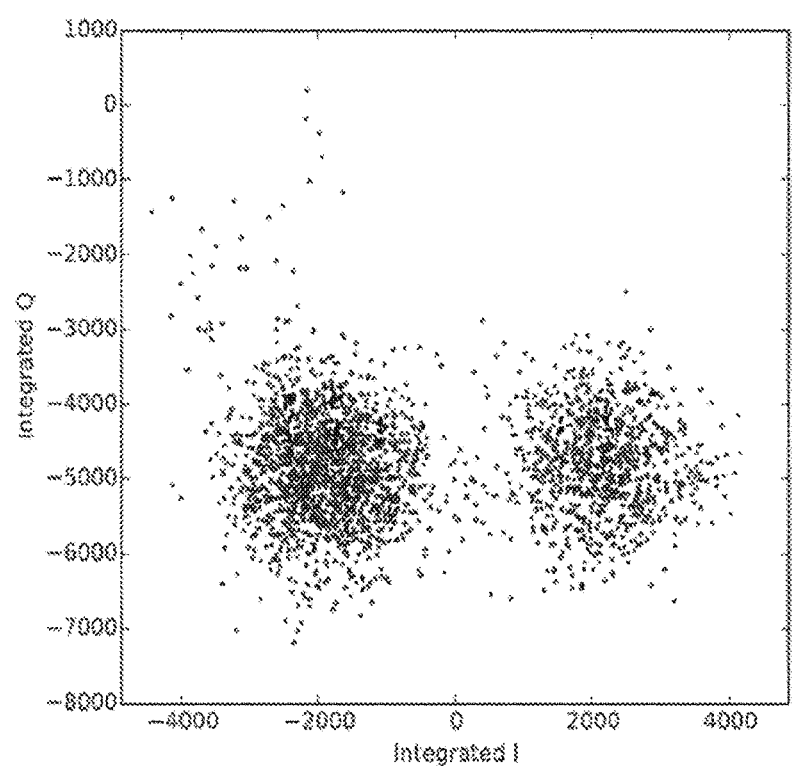
FIG. 5B illustrates results of measuring a quantum system, according to some embodiments.

The received signal from the system is integrated in a manner defined by waveform analyzer and/or master sequencer instructions to produce one of a pair of values. The integrated procedure can be defined by the instructions to produce desired results from the integration. For example, the incoming signal can be integrated based on an envelope described by a master sequence instruction so that one of two values results and such that the values are indicative of some property of the quantum system. Illustrative data depicting a bimodal distribution for one exemplary integration strategy is shown in FIG. 5B. In this example, the I and Q components of the received signal are integrated separately and added to the depicted data as a single point. The bimodal distribution of these points allows for correspondence of the state of (for example) a qubit with which of the two distributions the point falls into. One cluster could represent a result that the qubit is in the ground state and the other cluster could represent a result that the qubit is in its excited state. Accordingly, the integration results can be used to identify a property of the quantum system. An indication of these results can be provided to the master sequencer so that it can make logical flow decisions based on the results.

Figure 6:
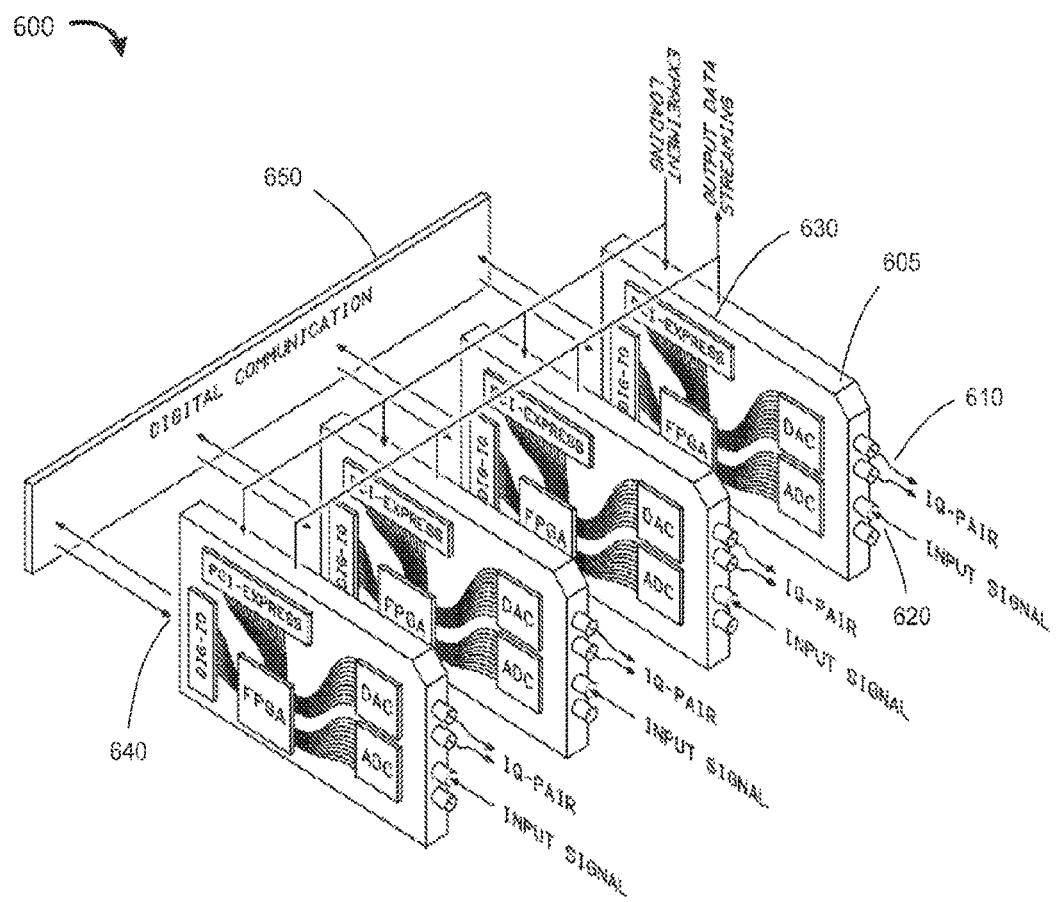
FIG. 6 depicts a group of illustrative waveform processors, according to some embodiments.

As discussed above, waveform processors may be grouped into clusters that comprise a plurality of similarly-configured, interactive waveform processors 300 as depicted in FIG. 3. FIG. 6 depicts an illustrative configuration in which a number of waveform processors 605 are grouped together. Each waveform processor 605 may include a plurality of electrical components assembled on a substrate. The electrical components may be configured to generate waveforms that are output to respective quantum systems via analog output ports 610, and to process waveforms received from the qubits via the microwave components through one or more analog input ports 620. Each waveform processor 605 may include a first digital interface 630 for transmitting and receiving data to and from a conventional computer, and further include a second digital interface 640 that is used to communicate digital data over an internal digital communication link 650 between the waveform processors 605 within the cluster.

While the waveform processor 300 shown in FIG. 3 is not limited to any particular type of quantum system, nor technique(s) for interacting with quantum systems, in some embodiments the waveform processor 300 may be implemented in a circuit QED system, such that interactions with quantum systems is by way of microwave signals. A control apparatus 110 may thereby include electronics for dynamically generating precise microwave signals (typically waveforms) and processing signals received from the quantum system(s) (also waveforms) in a flexible manner that allows real-time adjustment of the control waveforms sent to the quantum system(s). Because many quantum system(s) may be involved in a computation, a control apparatus 110 should be scalable so that multiple waveform processors may operate in parallel on multiple qubits. Additionally, each waveform processor should be quasi-independent in that it can make intelligent decisions about waveform generation based on its own calculations, which may be influenced, at least in part, by data from other waveform processors within a cluster.

Figure 7A:
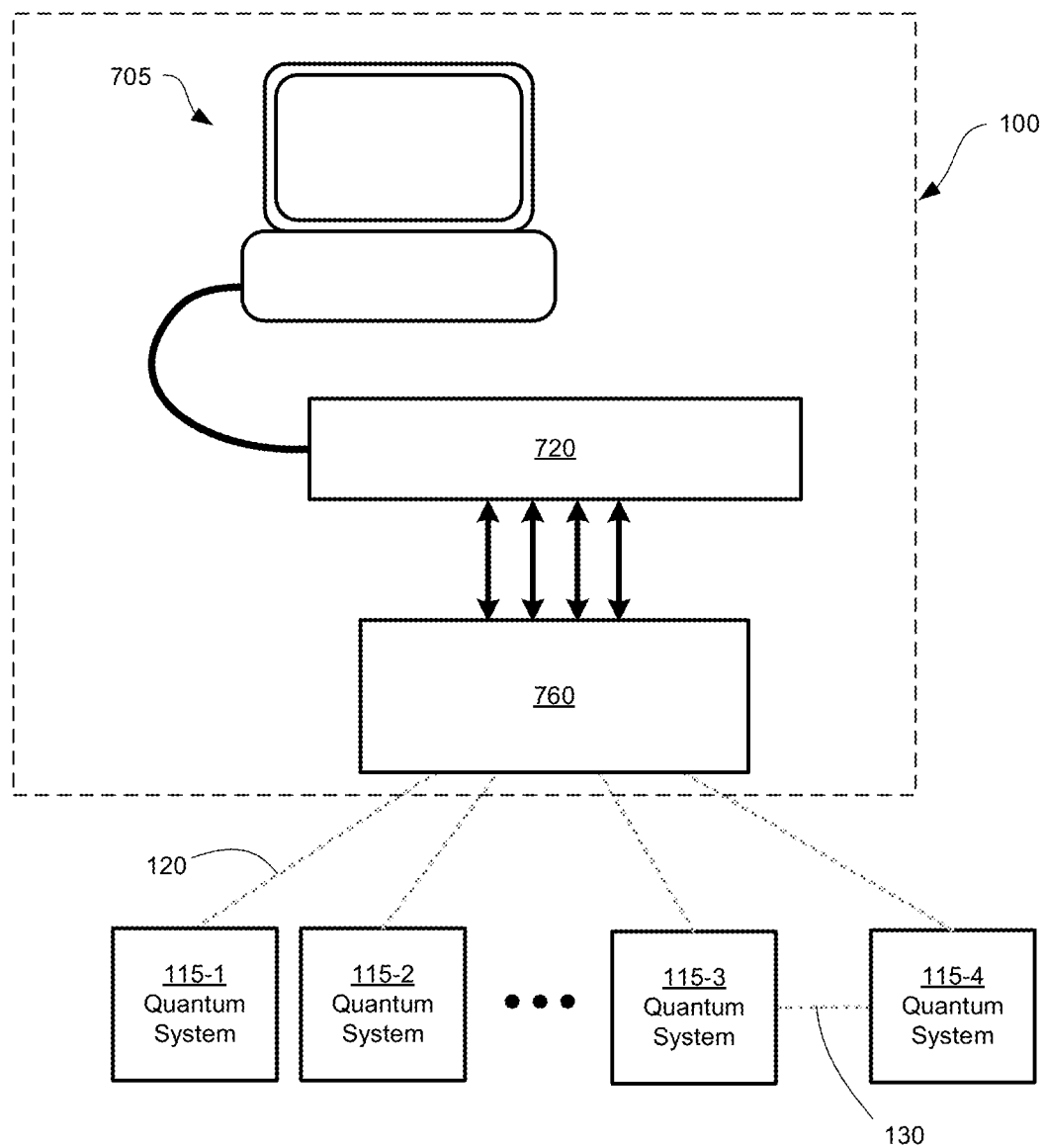
FIG. 7A depicts control components of a quantum information system, according to some embodiments.

FIG. 7A depicts further details of one embodiment of architecture for a quantum information processing system 100, e.g., a quantum system that may utilize circuit QED systems 115. The quantum systems 115 may include physical qubits (e.g., one or more transmon qubits, charge qubits, flux qubits and/or phase qubits, etc.), quantum mechanical oscillator(s) (e.g., one or more stripline resonators), etc. In such systems, one or more of the quantum systems may be maintained at cryogenic temperatures or temperatures at which superconductivity occurs within the quantum systems when the system is in operation. Interaction with the quantum systems may be via microwave control links 120, which may include a combination of wired and wireless links to microwave components 760. The microwave components 760 may be connected to a waveform processor cluster 720 (e.g., comprising a plurality of instances of waveform processor 300) that controls execution of quantum information processing operations. In some embodiments, a conventional computer 705 may connect to the waveform processor cluster 720 and provide an interface for human operation of the system.

The conventional computer 705 may be any suitable computer capable of receiving data input by a user and displaying, storing, and/or forwarding data received from the waveform processor cluster 720. The conventional computer 705 may be a personal computer, laptop, or tablet computer, for example. In some embodiments, the conventional computer 705 may comprise a microprocessor, display, and memory that are incorporated within the waveform processor cluster.

Figure 7B:
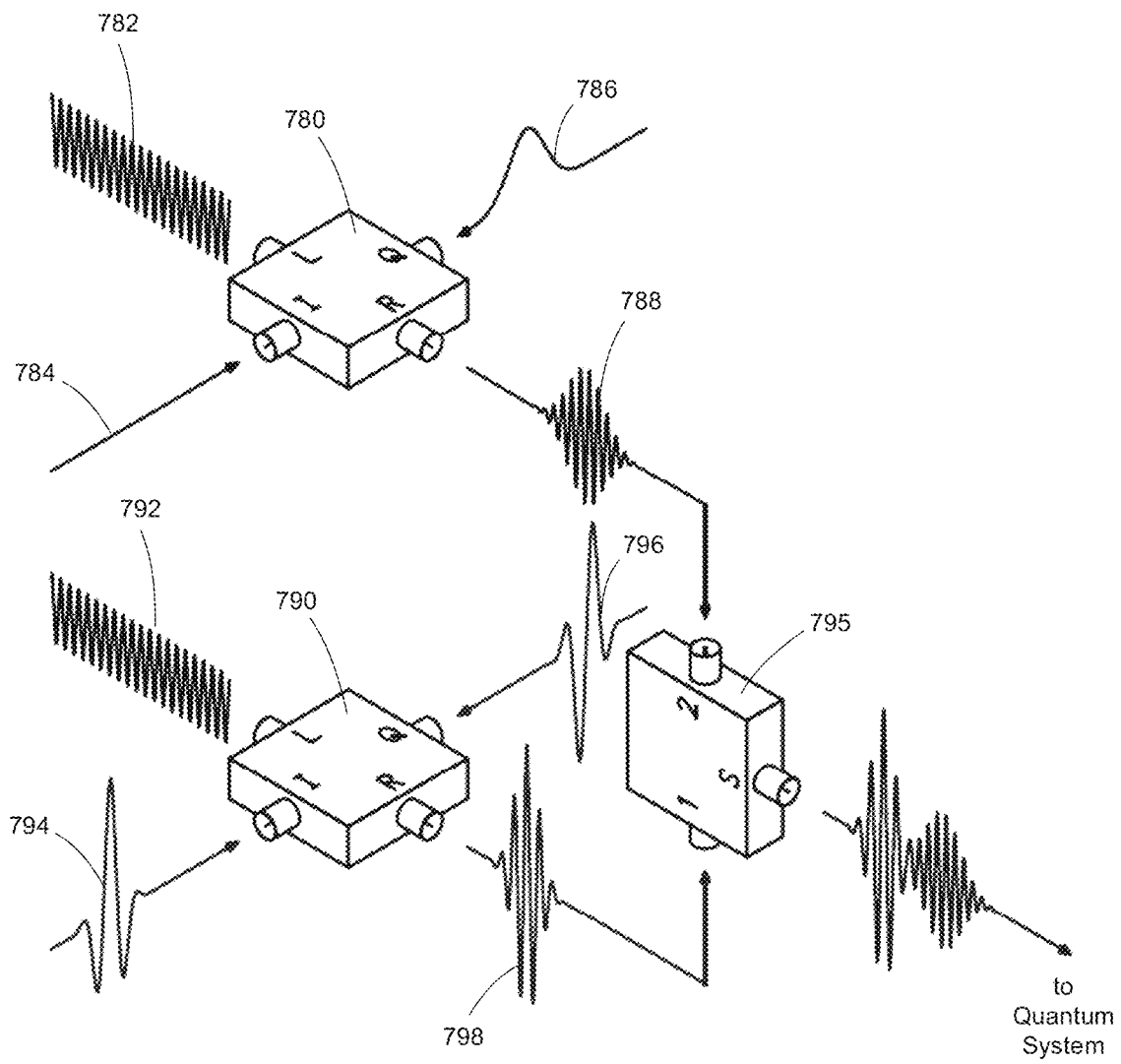
FIG. 7B illustrates radio-frequency components that may be used to construct waveforms for quantum information systems, according to some embodiments.

The microwave components 760 may include radio-frequency (RF) generators for outputting constant-amplitude oscillating signals at selected frequencies, cables, mixers, routers, amplifiers, combiners, directional couplers, etc. Some of these components may be operated at cryogenic or low temperatures, and some may be operated at room temperature. Some microwave components may be arranged to receive and amplify signals from the qubits and provide the amplified signals to the waveform processor cluster for analysis. Some microwave components may be arranged to combine signals received from the waveform processor cluster 720 and output resulting signals to the qubits 115, as depicted in FIG. 7B.

As an example, two mixers 780, 790 may receive constant-amplitude signals 782, 792, respectively, at selected frequencies from one or two RF generators (not shown). The mixers may also receive in-phase and in-quadrature (IQ) waveform pairs 784, 786 and 794, 796 from a waveform processor cluster (e.g., cluster 600). After mixing, output waveforms 788, 798 may be combined with combiner 795 and sent to a quantum system to, for example, perform a qubit or multi-qubit operation. There may be additional components operating in parallel with the components shown in FIG. 7B to produce other waveforms that are sent to other qubits.

Figure 8:
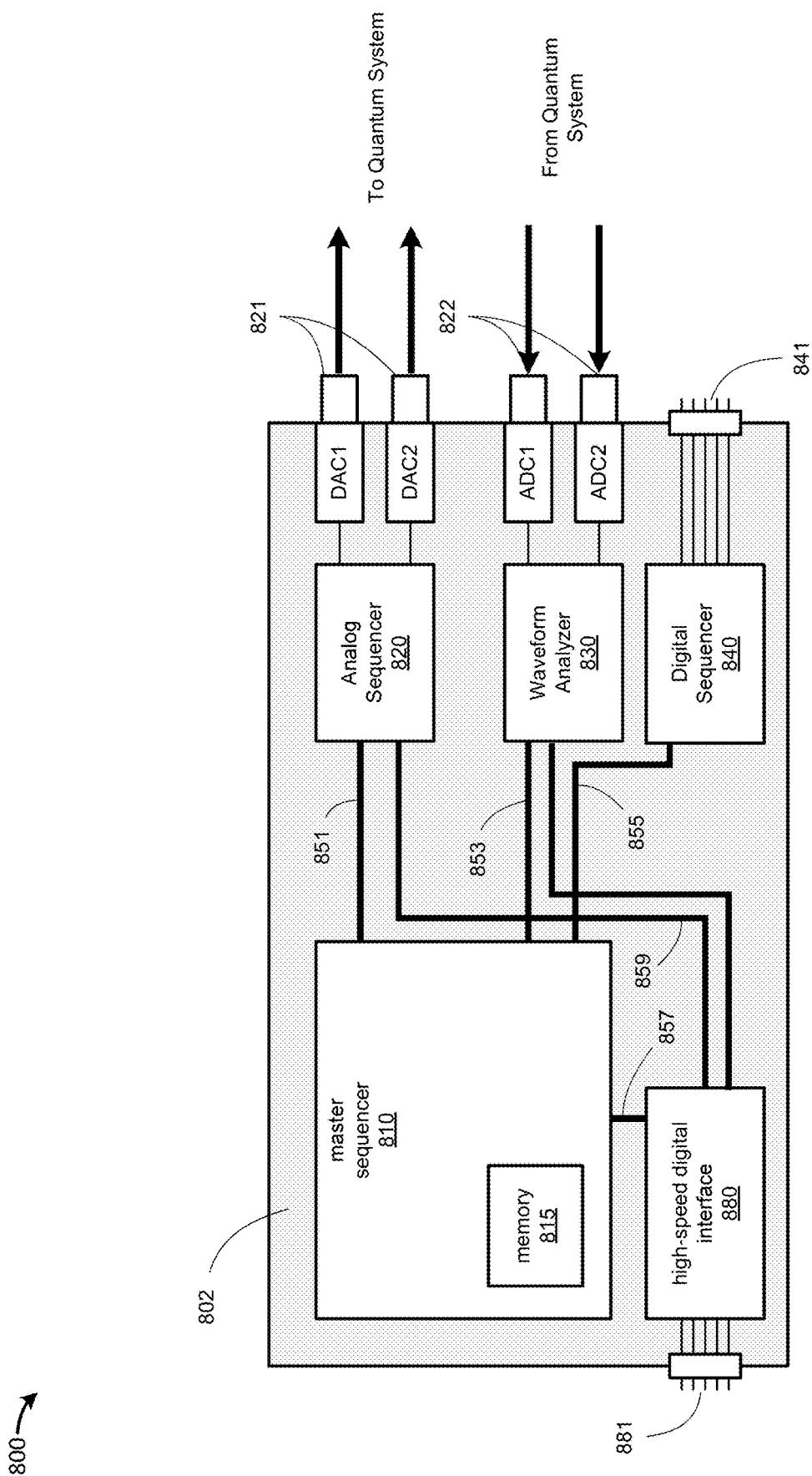
FIG. 8 is a block diagram of an illustrative waveform processor, according to some embodiments.

FIG. 8 is a block diagram of an illustrative waveform processor, according to some embodiments. Waveform processor 800 is an example of waveform processor 300 that also includes a digital sequencer 840 and a high-speed digital interface 880. Master sequencer 810, memory 815, analog sequencer 820, DACs 821, waveform analyzer 830, ADCs 822 and communication links 851 and 853 may be configured as elements 310, 315, 320, 321, 330, 322, 351 and 353, respectively, were described above.

In the example of FIG. 8, the master sequencer 810 is in communication with a digital sequencer 840 and a digital I/O port 841 over a third communication link 855. The digital sequencer may be configured to output digital information that may be used to communicate with other apparatuses (e.g., other waveform processors in a cluster or other measurement apparatus) connected to the waveform processor 800. For instance, the digital sequencer may be configured to perform operations such as triggering another device and/or blocking an RF signal received or output from another device. The latter operation may be useful to produce a noiseless baseline signal.

In the example of FIG. 8, the waveform processor 800 includes a high-speed digital interface 880 and an I/O port 881 that may be in communication with the master sequencer over a fourth communication link 857. The high-speed digital interface 880 may also be in communication with the waveform analyzer 830 over a fifth communication link 859, so that data (raw and/or processed) from the waveform analyzer may be streamed directly to the digital interface 880 and sent for remote analysis. The high-speed digital interface 880 may be configured to link to a conventional computing device for downloading and uploading data to and from the waveform processor 800. In some implementations, the high-speed digital interface 880 may support a Peripheral Component Interconnect Express standard (PCI Express®), though other digital interface configurations may be used in other implementations.

According to some embodiments the master sequencer 810, analog sequencer 820, waveform analyzer 830 and digital sequencer 840 may all execute their operations, according to their individual instructions, synchronously and in parallel. For example, the analog sequencer, the waveform analyzer and the master sequencer may all be driven by a same clock when stepping through their respective instructions. Synchronization between these components may be assumed, but not verified—that is, each of the sequencers may execute instructions in successive clock cycles and assume the other sequencers are doing the same without verifying this synchronization.

Figure 9A:
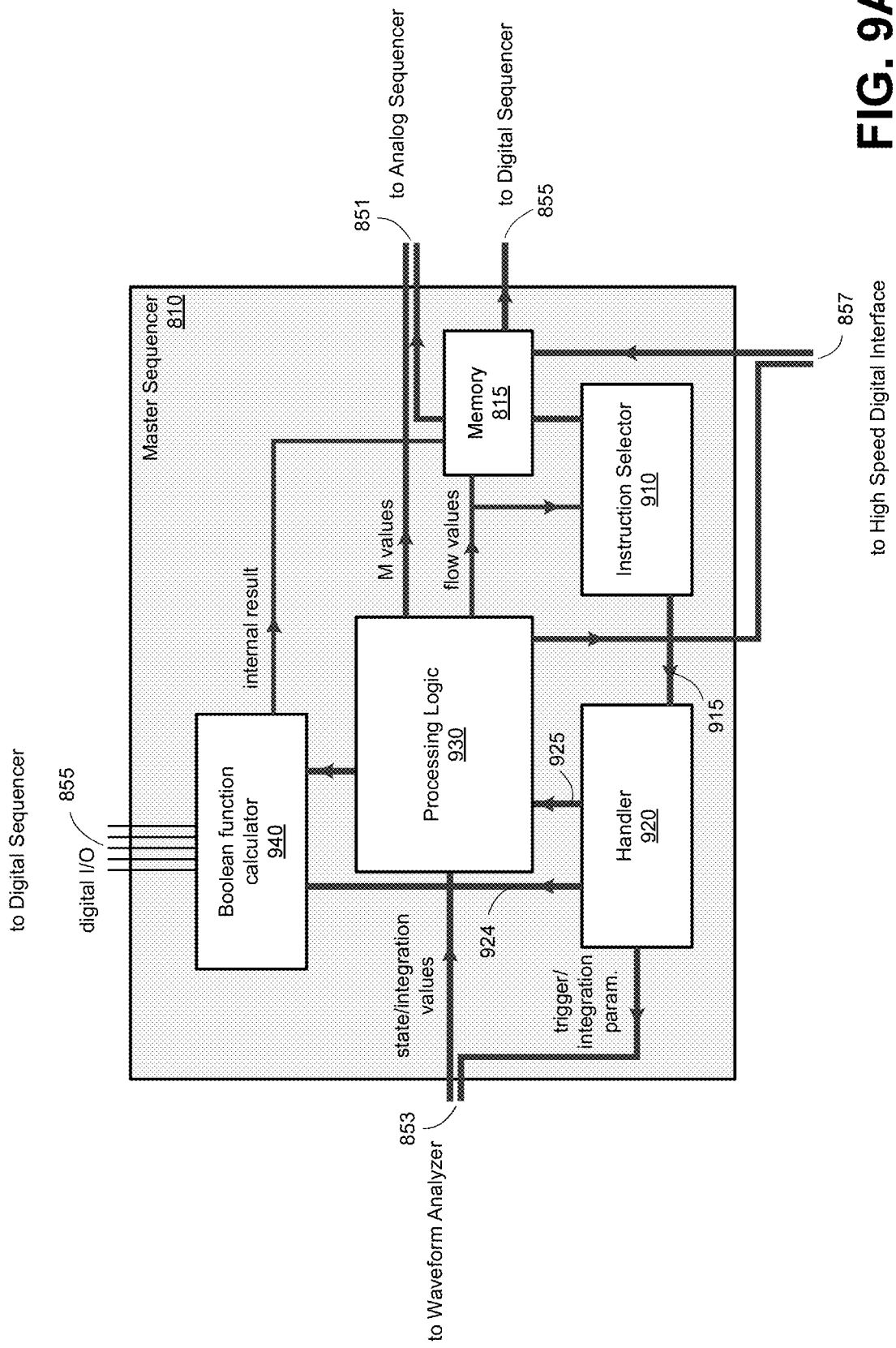
FIG. 9A is a block diagram of an illustrative master sequencer, according to some embodiments.

Internal details of an illustrative master sequencer are shown in FIG. 9A. According to some embodiments, a master sequencer may comprise a plurality of logic locks configured to have different functionalities (e.g., sub-processing cores within the master sequencer) that execute in parallel. A first group of logic blocks may be configured as an instruction selector 910. The instruction selector may retrieve a master sequence instruction (e.g., instruction data string) from memory 815 that determines the operation of the master sequencer 810 and may load the instruction (and/or data identifying the instruction, such as an address) to an array of logic gates for each of the sub-processing cores. The master sequence may be one of several master sequences that have been preloaded to the memory 815 by a conventional computer or other suitable device. To begin operation of the master sequencer 810, the instruction selector 910 may first retrieve a first master sequence that has been loaded into the memory 815. Once initiated, a master sequence runs for a duration that is defined by one of several methods, which are described separately herein.

A master sequence instruction to be executed and/or a subsequent master sequence instruction to be identified may be effected and/or chosen by the instruction selector 910 based upon flow values output from a processing logic block 930 of the master sequencer 810 and received by the instruction selector 910. For example, when the processing logic block 930 determines that a branch condition applies, the flow values may provide information to the instruction selector 910 that enable the instruction selector to identify the address or the next instruction to be executed by following the branch. Prior to completion of the execution of a master sequence instruction, a waveform processor 830 may determine a subsequent master sequence instruction that is to be loaded by the instruction selector 910. The determination of a next master sequence instruction may be based on values computed by the processing logic 930 and/or a Boolean function calculator 940.

In the example of FIG. 9A, the master sequencer 810 includes a handler 920 that comprises a second group of logic blocks, and that is configured to receive or access a master sequence instruction over communication link 915 from the instruction selector 910. The handler 920 may parse the master sequence instruction and provide data values to the processing logic 930, to the Boolean function calculator 940, and/or to the waveform analyzer 830 over internal communication links 925, 924 and 853, respectively. For example, the handler 920 may parse a master sequence instruction to determine trigger values that are used to trigger waveform samplers of the waveform analyzer 830 and/or may parse integration values that are used by the waveform analyzer 830. The handler 920 may further provide data to the processing logic block 930 that determines how a computation is to be executed by the processing logic block. For example, the handler 920 may provide an instruction address location from the instruction selector to the processing logic block that identifies a processor instruction to be performed by the processing logic block. The handler may further provide data (e.g., a binary mask) to the Boolean function calculator 940 that defines how a Boolean operation is performed.

According to some embodiments, the processing logic 930 may comprise programmable logic that is configured to perform calculations based on input from the waveform analyzer and from the handler 920. The processing logic 930 is an effective component of the waveform processor 800 that may enable greatly improved performance over conventional solutions. The processing logic 930 is specially configured to run pertinent calculations in a synchronized manner (orchestrated by the master sequencer 810) that affect operational flow of the waveform processor. According to some embodiments, the processing logic 930 produces a plurality of outputs that may be used by other components of the waveform processor during program execution. The processing logic may comprise several processing elements (e.g., multipliers, adders, arithmetic logic units, etc.) for carrying out respective operations, memory, and routing connections.

Each element configured to perform an operation has its inputs and outputs. The outputs of each element are routed selectively to one or more other elements to create a network of data flow. A program is implemented by a sequence of routing instructions through the elements to obtain a desired calculation.

The type of computation and values used for the computation may be determined in part by data included in an executing master sequence instruction that is parsed and passed to the processing logic block by the handler 920. The processing logic block 930 may output values that are based on its computation to other components within the waveform processor 800. For example the processing logic block 930 may make available values (manipulation matrix values, or "M values") that may be used by the analog sequencer 820 via the second communication link 851 to shape waveforms produced by the analog sequencer 630. The values may be made available by setting control lines within the waveform processor circuitry at high or low values, or by writing the values to temporary memory. According to some implementations, the processing logic block 730 may output Boolean values (e.g., flags, values, and/or masks) over communication link 735 to the Boolean function calculator 740. The processing logic block may also output values to the digital sequencer 840, which can output computed values to other waveform processors in a cluster.

The Boolean function calculator 940 may comprise logic blocks configured to perform Boolean operations based on input from the processing logic block and from external data received over the third communication link 855. The external data may come from "sensors" on the waveform processor 800 as well as, should the waveform processor 800 be part of a cluster of such processors, from sensors on the other waveform processors within the cluster. The sensors may be binary sensors that detect states of various components of the quantum control apparatus 110 and/or various states of quantum systems 115.

Based on its Boolean operations, the Boolean function calculator 940 may output a value referred to as an "internal result" that is made available to other components on the waveform processor 800. The internal result may be made available by setting one or more control lines to high or low values, and/or by writing a digital value to memory 815. The internal result may directly affect instructions that are executed by all the sequencers. In some implementations, the internal result is a two-bit or n-bit signal that determines how a currently executing instruction branches to a next instruction. For the instructions described below, the internal result is a value set for the "branch method" or "branch type" data field of an instruction. The internal result may be set at any time and affect real-time execution of a waveform processor 800.

Memory 815 may comprise transistors (e.g., RAM type memory, registers, buffers) and/or control lines that are set in one of two binary states to retain values during execution of an instruction, according to some embodiments. The memory elements may be included as part of the circuitry for the master sequencer 810. Other sequencers and the waveform analyzer 840 may also include memory elements. For example, memory elements may comprise a portion of an FPGA or an ASIC that has been delegated for memory functionality.

Figure 9B:
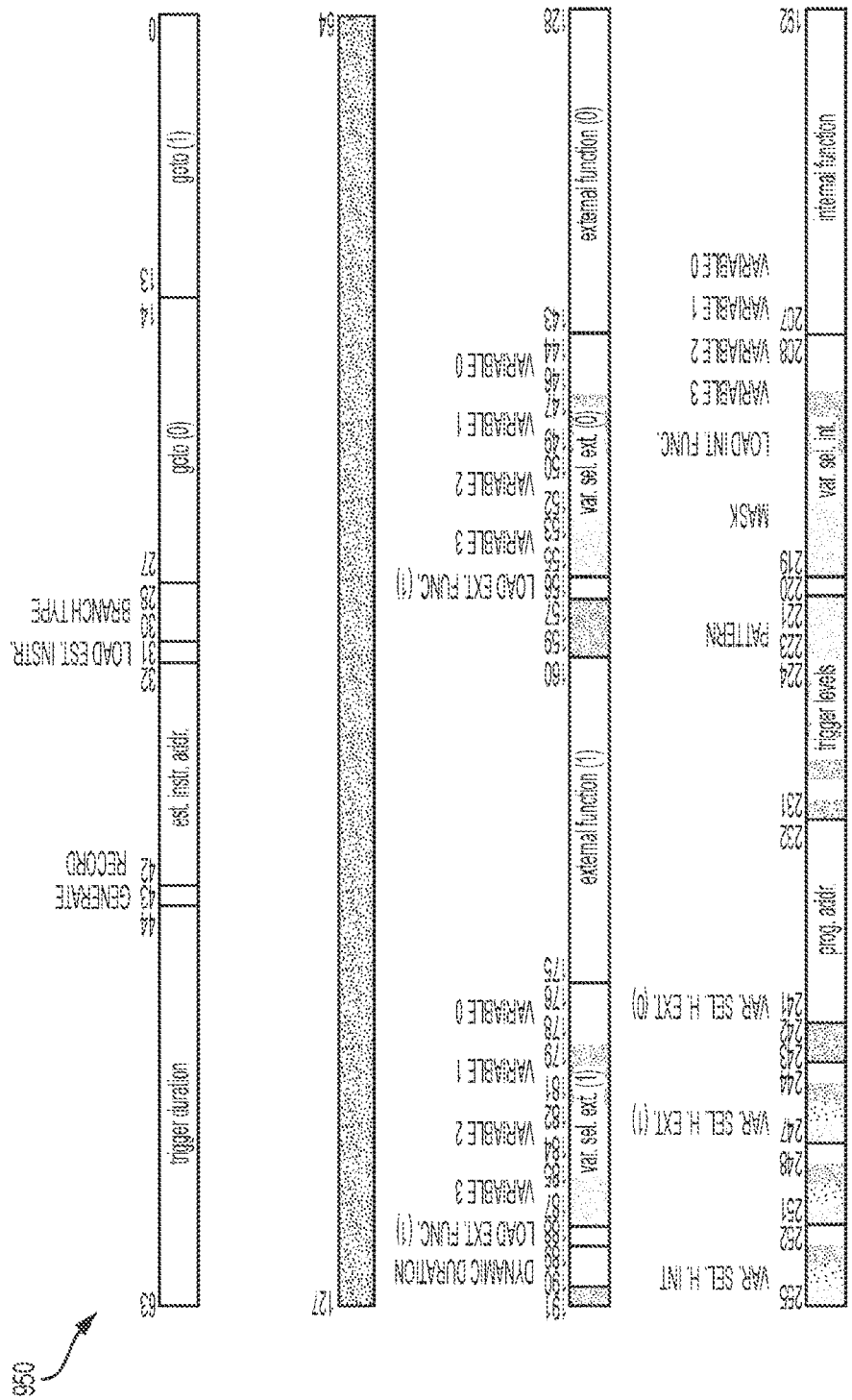
FIG. 9B illustrates data fields of an illustrative master sequencer instruction, according to some embodiments.

In some embodiments, each sequencer and the processing logic 930 may be placed in operation by loading and executing their respective instructions. An illustrative master sequence instruction 950, depicted in FIG. 9B, determines trigger values, controls waveform sampling timing and duration by the waveform analyzer 840, as well as establishes other values that affect operation of the waveform processor 800. An analog sequence instruction describes what pulses to play at the output of the analog sequencer. A digital sequence instruction describes the digital pattern to play on the digital I/O port 841. A processing-logic instruction determines how a number of values are calculated that affect operation of the waveform processor and how output results are calculated.

There may be common attributes among the sequencer and processing logic instructions. Each instruction may include a value that identifies how long (how many clock cycles) the instruction will be executed. This value may be common across all executing instructions, so that the components of the waveform processor 800 can be synchronized. According to some embodiments, the duration of an instruction may be defined in units of 4 ns (1 clock cycle), though other base units may be used for different clock speeds. The duration of an instruction may be as long as $2^{20}$ cycles which is about 4 ms for a 4-ns clock cycle. There may be a lower bound of clock cycles for a minimum duration (e.g., six cycles or ~24 ns).

The duration of execution of an instruction may be a static value or a dynamic value, which may be chosen based on an entry within the instruction. A static value may be encoded as a data field within each instruction (e.g., an inline "duration" data field). One or more dynamic values may be calculated at any time by processing logic 930 and stored in one or more registers in memory 815. The registers may be identified by the "dynamic duration" data field within an instruction. For example, the dynamic duration data field may be two bits long. The value "00" may indicate that the duration is taken from the instruction's inline duration, whereas the values "01", "10" or "11" indicate that the duration is taken from one of three corresponding registers. A dynamic duration can be useful, for example, for $T_1$ measurements on a qubit, where a delay after an applied pulse is stepped efficiently instead of generating a separate instruction for each pulse application. The ability to alter durations of executing instructions provides a first level of flexibility to the waveform processor cluster 320. Synchronization between sequencers may be maintained with the use of instructions of dynamic duration, by ensuring that the total duration to execute each sequence of instructions is the same. While it may be beneficial in some cases to execute instructions of the same dynamic length in each sequencer at the same time, this is unnecessary so long as a single iteration of each sequence has the same duration.

Another common attribute among instructions is the address of a next instruction that is to be executed after conclusion of the current instruction. According to some embodiments, a next instruction address may be flexibly decided a few cycles before the current instruction ends. Each instruction includes data fields that are used to make a flexible branching decision for the next executable instruction. In some embodiments, there may be a plurality of branching methods (e.g., choose from among a plurality of next instructions based on values in different data fields within an instruction. For example, some branching methods may be defined as GOTO, IF, GOSUB and RETURN, and identified within an instruction by a two-bit value (11, 00, 01, 10) in a "branch method" data field. Other data fields (e.g., "address(0)", "address(1)", "addressing mode", "force return", "array flag", "offset register") within the instruction may determine how a next address is obtained. For example, an identification of the GOTO branching method may result in determining the next address according to the following logic operation:

IF "array_flag" then
next_address="address(0)"+GOF{"offset register"}
ELSE
next_address="address(0)"

Other logic operations may be used for the other branching methods.

In addition to being able to select a branching method, relative and absolute addressing modes may be specified by the "addressing mode" value (e.g., 1 or 0). In absolute mode, a value of a next address may be the value indicated in an address data field, e.g., in "address(0)." In relative mode, a value of a next address may be the value of the current data field plus the value indicated in an address data field. Further, each instruction may specify address offset registers (e.g., GOF0, GOF1, GOF2, GOF3) that may be used in computing the location of a next address, as in the above GOTO branching method. The ability to determine a branching method within an instruction, from among a number of different branching methods, and to determine an address of a next instruction based on static or dynamic values within or identified by an instruction provides a high level of flexibility to a waveform processor 800.

Referring again to FIG. 9B, a master sequence instruction 950 may comprise a plurality of data values in fields that are applied to gates of the master sequencer 810 prior to initiating operation of the master sequencer. By referencing dynamic values in the master sequence instruction, operation of the master sequencer and other waveform processor components may be affected by data received from the qubit(s) and/or other waveform processors in a cluster. According to some embodiments, a master sequence instruction 950 may comprise 256 bits and include two internal trigger signals (encoded in the "trigger levels" field) that control the sampling on both analog-to-digital converters ADC1, ADC2 at the waveform analyzer 830. These trigger levels may be encoded as input signal level values, time values, or clock cycles that determine when sampled waveform data is valid data for further processing by the processing logic 930. The "estimation instruction address" (est. instr. addr.) and "load estimation instruction" (load est. instr.) fields may be used to update the parameters for integrating waveforms sampled by the waveform analyzer 830. According to some implementations, the estimation instruction address points into a data table in memory 915 that stores integration parameters (e.g., integration weights, integration lengths, threshold values).

A master sequence instruction 950 may further include three Boolean functions that are calculated on a set of "sensors." The Boolean functions may comprise binary masks that are applied against combined signals from the sensors. The sensors may comprise signal values received from other waveform processors, the results of the integration by the waveform analyzer 830, and results from other calculations (e.g., calculations carried out by processor logic 930 and/or Boolean function calculator 940). Two external Boolean functions ("external function (0)", "external function (1)") may be broadcast to other cards in a cluster, and one "internal function" may be used to control the operational flow (e.g., determine a branching method) on the instant waveform processor. There may be between 10 and 20 sensors is some cases, though fewer or more sensors may be used. The Boolean functions may be updated every time a new master sequence instruction is loaded and executed. Dedicated flags "load int. func.", "load ext. func.(0)", "load ext. func.(1)" within the instruction may be used to force loading new Boolean functions.

When a large number of sensors (e.g., 16) are used, a most general Boolean function would need to account for each of the $2^{16}$ possible data combinations from these sensors. Such large amounts of data in an instruction can be avoided, by limiting the Boolean function to a subset of the sensors (e.g., up to 4 sensors out of the 16). A Boolean function may then be encoded by selecting four sensors (4×4 bits, identified by the "var. sel." data fields) and allowing for their combination of output values (16 bits=$2^4$).

The illustrative master sequence instruction includes a data field "prog. addr." that identifies the address of a processing-logic instruction to be loaded into gates of processing logic 930 for execution. An example of a processing-logic instruction 980 is depicted in FIG. 9C. A plurality of different processing-logic instructions may be stored in a program table in memory 815. The master sequencer 810 can determine which of the processing-logic instructions is loaded in a next instruction cycle.

Data fields within the processing-logic instruction 980 control the operation of different elements in the processing logic 930. For example, the processing logic may include two multipliers (referred to by data fields "mult. 0" and "mult. 1") that each have two operands. An operand may be selected from one of eight options, which is identified by a "op. sel." data value. These eight options may be output from other elements and/or from memory in the processing logic 930. Similarly, the processing-logic instruction 980 may include data fields for adders. The processing-logic instruction may also include data fields for dynamic variables (e.g., manipulation matrix values "mx(i,j)", dynamic duration lengths "dyn. len. i", and address offsets "goto offset i") that are updated by the processing logic 930 and output for use by other components of the waveform processor 800.

According to some embodiments, an aspect of the processing logic 930 is an arbitrary function calculator that accesses data field value "arb. function," which identifies a data table that stores samples of an arbitrary function. The processing logic 930 can read in sampled values and calculate the arbitrary function by interpolation. Such interpolation makes it possible to apply analog feedback in a program's execution rather than binary feedback, so that amplitudes and phases of pulses generated by the analog sequencer 630 can be tuned continuously in value rather than only being able to be changed by discrete amounts. Continuous tuning may be important for operating on quantum systems (e.g., qubits) which can take on a continuum of superposition states.

During operation, the processing logic may execute an instruction 980 and update several values of the instruction to output to sequencers of the waveform processor 800 (e.g., the analog sequencer) and/or other waveform processors in a cluster. For example, the processing logic 930 may produce four manipulation matrix values $M_{ij}$ (i, j=0, 1) that can be fetched by the analog sequencer 630. It may also output three values ("dyn. len. i") to registers that are treated as dynamic lengths for instruction durations. These three values may be seen by all the sequencers. Any instruction can access values in any of these registers for its duration. The processing logic 930 may output four values ("goto offset i") that are used as offsets when calculating the next instruction address. It may also output a single-side band value ("SSB") that can be used to dynamically change the carrier frequency of an analog output pulse from the analog sequencer 630. The processing logic may also stream four values ("record i") to an external conventional computer or other external device, that may be useful for debugging purposes or for data streaming in a selective and efficient manner so that a conventional computer can keep up with data output from a waveform processor cluster.

Figure 10A:
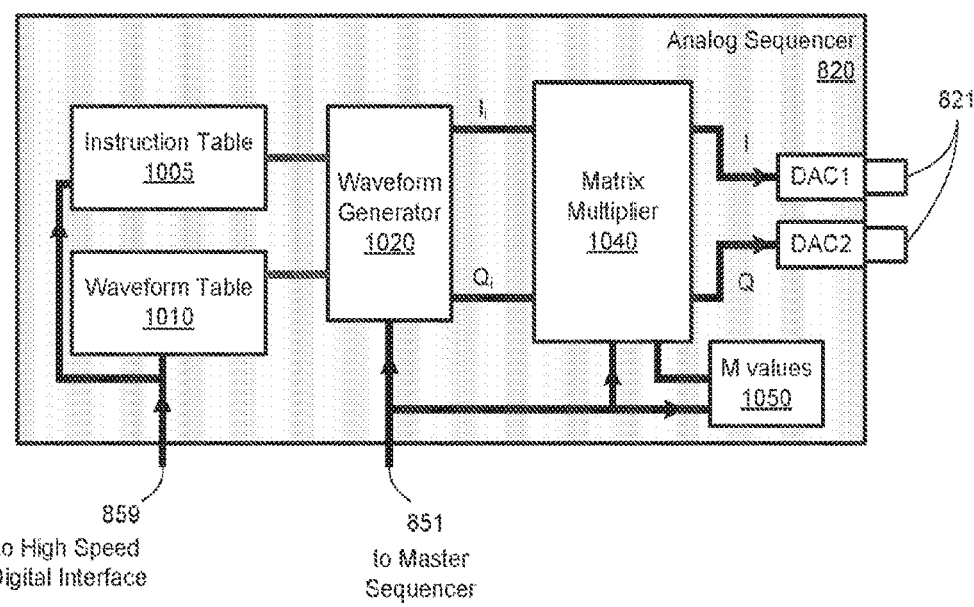
FIG. 10A is a block diagram of an illustrative analog sequencer, according to some embodiments.

FIG. 10A is a block diagram of an illustrative analog sequencer, according to some embodiments. Illustrative analog sequencer 820 comprises an instructions table 1005, a waveform table 1010, a waveform generator 1020 comprising first logic blocks, a matrix multiplier 1040 comprising second logic blocks that operate on waveform data output by the waveform generator, and may include a manipulation matrix data table 1050 that may store values for matrix operations performed by the matrix multiplier 1040. The analog sequencer may further comprise digital-to-analog converters DAC1, DAC2, although these elements may also be located in a separate unit to which the analog sequencer is coupled.

In the example of FIG. 10A, instruction table 1005 includes a plurality of analog sequence instructions that are selected and loaded onto gates of the waveform generator 1020. As discussed above, execution of the analog sequence instructions by the analog sequencer may cause the analog sequencer to generate waveforms to be applied to an external quantum system. In the example of FIG. 10A, waveform generator 1020 is configured to retrieve analog sequence instructions from the instruction table 1005 and execute those instructions. In some cases, an analog sequence instructions may instruct the waveform generator 1020 to generate a waveform, in which case the waveform generator may retrieve waveform data from the waveform table 1010. For example, an analog sequence instruction may include an address location in the waveform table at which waveform data from which to generate the final waveform is located. In some cases, execution of analog sequence instructions by the waveform generator may utilize data received from the master sequencer via communication link 851.

The analog sequence instructions and waveform data may be placed in the tables by a conventional computer over a data link 859 prior to executing a procedure with the waveform processor 800. An analog sequence instruction contains information to generate a pair of data streams for I and Q waveforms. By digitally generating waveforms in pairs and using mixers (as depicted in FIG. 7B), amplitude, phase, and frequency of an output waveform can be readily controlled. An analog sequence instruction describes how to construct the I-Q outputs from waveform data stored in the waveform table 1010.

The waveform table 1010 may comprise memory that stores values and/or representative waveform samples. Each value in the table may correspond to a clock cycle of a waveform (e.g., 4 ns of waveform for a 250 MHz clock). According to some embodiments, a waveform table may contain a limited number of waveform representations. For example, there may be only three types of waveform data in the waveform table 1010. A first type may be a "constant" waveform, for which only a constant value is stored in the table. A second type may be a "unique" waveform, for which an array of waveform data points are stored in the table. These data points may comprise successive samples of a waveform (e.g., successive points on a Gaussian waveform) that are representative of the waveform over a selected duration. A third type of waveform data may be an "interpolated" waveform. Interpolated waveform data may comprise sparse samples of a long-duration, smooth waveform, for which intermediate points can be filled in by interpolation.

Although the unique waveform may require more stored data than the constant and interpolated waveform entries, generating waveforms from each of these waveform types provides an enormous data reduction in waveform generation compared to conventional approaches that use arbitrary waveform generators. For example, instead of storing a full array of data for each sample of a constant waveform, as would typically be the practice when using a conventional arbitrary waveform generator (AWG), the analog sequencer 820 requires only a single value. Instead of storing two full arrays of data for two different versions (e.g., two different frequencies, two different amplitudes, two different phases) of a unique waveform, the analog sequencer 820 requires only a single array, for which any one or combination of amplitude, phase and frequency may be altered by the analog sequencer.

In the example of FIG. 10A, the waveform generator 1020 may be configured to retrieve waveform values from the waveform table 1010 that are identified in an analog sequence instruction retrieved by the waveform generator from the instruction table 1005. The waveform generator may output waveform values in an I-Q pair to the matrix multiplier 1040 for a duration that is passed to the waveform generator from the master sequencer, over data link 851. According to some implementations, the waveform generator may retrieve waveform values from different waveform types to produce I-Q waveform pairs. For example, waveform data for an I waveform may be retrieved from a unique waveform entry, and waveform data for a Q waveform may be retrieved from a constant waveform entry in the waveform table 1010.

Matrix multiplier 1040 may comprise logic blocks configured to carry out several matrix multiplications that transform the bare I-Q waveform data received from the waveform generator 1020 into waveform data suitable for conversion to analog signals that can be used to execute a desired operation on a quantum system (e.g., a π/2 phase flip or an error correction). According to some embodiments, the matrix multiplier 1040 may be configured to perform the following matrix multiplication:

$$\begin{pmatrix} P_0 \\ P_1 \end{pmatrix} = \begin{pmatrix} C_{00} & C_{01} \\ C_{10} & C_{11} \end{pmatrix} \cdot \begin{pmatrix} S_{00} & S_{01} \\ S_{10} & S_{11} \end{pmatrix} \cdot \begin{pmatrix} M_{00} & M_{01} \\ M_{10} & M_{11} \end{pmatrix} \begin{pmatrix} W_0 \\ W_1 \end{pmatrix}$$

where $W_i$ is a 2×1 vector containing I-Q waveform data pairs output by the waveform generator 1020 and received by the matrix multiplier 1040, $M_{ij}$ is a 2×2 manipulation matrix, $S_{ij}$ is a 2×2 single side-band (SSB) matrix, $C_{ij}$ is a correction matrix, and $P_i$ is the pulse to be output by the analog sequencer to the quantum system. The matrix $M_{ij}$ may be used to scale the retrieved waveform values and/or adjust the phase of waveforms and may be supplied by, for example, data within the analog instruction retrieved by the waveform processor that resulted in the matrix multiplication operation or received from the master sequencer. The values used in this matrix may come from the analog sequence instruction or from the processing logic 930. The matrix $S_{ij}$ may comprise an evolving rotation matrix that can rotate at either a static or dynamic frequency. The matrix $S_{ij}$ may be used to effectively change the carrier frequency of the output pulses. The matrix $C_{ij}$ may be used to correct downstream errors that may be introduced by cabling and microwave components. The values of $C_{ij}$ may be static and obtained from calibration measurements. The resulting values from the matrix multiplications may be provided to digital-to-analog converters DAC1, DAC2 to generate output analog I-Q waveforms.

According to some embodiments, $M_{ij}$ may comprise values that are static for the duration of a pulse generation sequence, or may comprise values that are dynamic and change during a pulse generation sequence. The static values may be defined in an analog sequence instruction 1050, which may include data fields as depicted in FIG. 10B. The static values may be stored in the "mixer amplitude" data fields. The dynamic values may be computed by processing logic 930 based on calculation it performs (e.g., to step an amplitude with each successive application of a pulse, as may be done for a power Rabi process). The dynamic values may be stored locally at the analog sequencer in the manipulation matrix data table 1050. The "mixer mask" data fields may be used to indicate, for each entry in the manipulation matrix, whether the value should come from the analog sequence instruction 1050 (static) or the processing logic 930 (dynamic). In some embodiments, a "mixer fetch" data field may be used to indicate whether all values for the manipulation matrix $M_{ij}$ should be fetched from the local manipulation matrix data table 1050.

The analog sequence instruction 1080 may include other data fields for other purposes. A "SSB reload" data field may be used to instruct the analog sequencer 820 to reset the SSB matrix with new values for a new frequency that is determined by the processing logic 930. "Waveform address" data fields (only one shown) may be used to point into the waveform table 1010 so that the waveform generator can retrieve a desired waveform beginning at that address. The type of waveform may be identified by a "unique waveform" field or "interp. pulse" field. Some data fields (e.g., "duration", "branch method", "addressing mode", etc.) may be used for operational flow. FIG. 10C depicts an illustrative example of data stored by the waveform table.

In operation, an analog sequencer 820 may produce waveform data for the DACs in several different ways, according to waveform type. For a constant waveform, the same entry in the waveform table 1010 may be read by the waveform generator 1020 throughout the duration of the instruction. For a unique waveform, the waveform generator 1020 may read a first value from the waveform table specified by the "waveform address" and then step with each clock cycle to a next entry for a duration of the instruction. For an interpolation waveform, the waveform generator 1020 may read a first value from the waveform table specified by the "waveform address," read a next value from the table, and then interpolate values between the first value and next value for a number of clock cycles indicated by the "interp. step" data field in the analog sequence instruction 1050.

According to some embodiments, there may be more than one analog sequencer 820 on each waveform processor 800, so that multiple I-Q waveform pairs may be generated by a waveform processor. Each analog sequencer may receive its own analog sequence instructions 1050. In some cases, outputs from matrix multipliers 1040 from two or more analog sequencers 630 may be summed prior to providing the resulting I-Q waveform data values to output DACs. In some implementations, an analog sequencer may include more than one waveform generator 1020, and I-Q outputs from two or more waveform generators 1020 may be summed prior to providing the resulting $I_1$-$Q_i$ waveform data values to the matrix multiplier 1040. Each waveform generator 1020 may receive data values identifying waveform addresses in the waveform table 1010 from an analog sequence instruction 1050.

In some embodiments, the result of a state measurement as shown in FIG. 5B above can be routed to the processing logic 930 in real-time, which can then effect a change in pulse generation by the analog sequencer 820. Parameters of pulse generation that can be changed include, but are not limited to: pulse scaling (amplitude), phase, and timing of future pulses. Moreover, thresholding may be used to convert the integrated I-Q values into digital signals, for both internal and external use, which themselves can be used to make binary decisions internally and externally based on the measurement result. One example of using results of a measurement to affect pulse generation comprises resetting a qubit to maintain it in the 0 state as often as possible. If the qubit is measured to be in the 0 state, no pulses to rotate the qubit may be applied. If instead the qubit is measured to be in the 1 (excited) state, the processing logic 930 may provide instructions to the analog sequencer to generate a pulse that rotates the qubit back to the 0 state. The architecture of the waveform processor 800 enables this feedback capability, which involves generating and sending read-out signals, receiving a signal from the qubit, demodulating the received signal into an I-Q pair, integrating the I-Q waveform values, analyzing the result, making a decision on what to do next, and executing the decision, to all take place in less than 500 hundred nanoseconds. Such operation is not possible with a conventional computer. These timescales are well within qubit coherence lifetimes and well suited for executing more complex operations with quantum information processors.

Figure 11A:
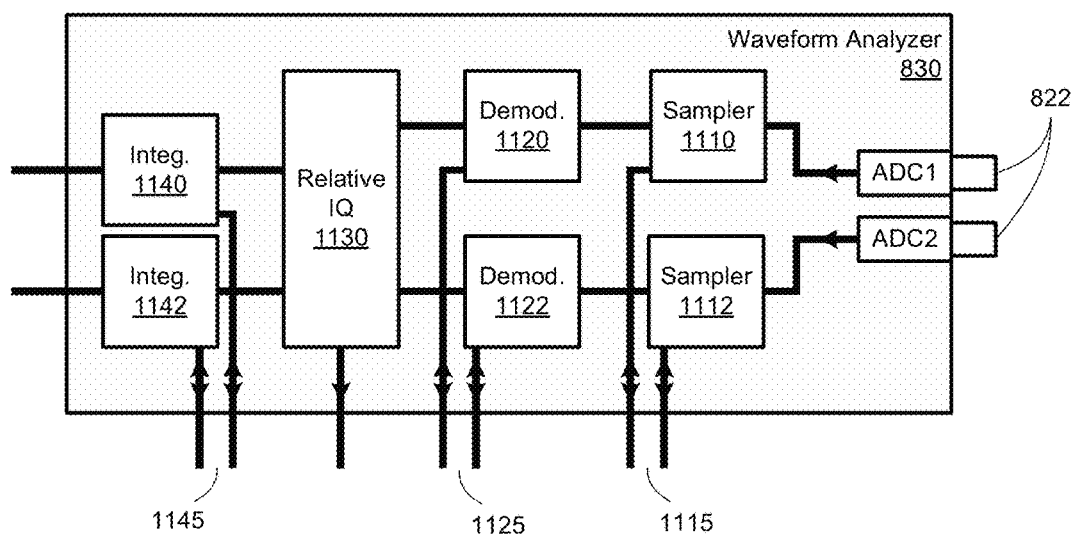
FIG. 11A is a block diagram of an illustrative waveform analyzer, according to some embodiments.

FIG. 11A is a block diagram of an illustrative waveform analyzer, according to some embodiments. In the example of FIG. 11A, waveform analyzer 830 comprises analog-to-digital converters ADC1, ADC2 that connect to samplers 1110, 1112. According to some embodiments, incoming analog signals may be sampled at data rates as high as 1 GHz. The samples may be 12 bits deep corresponding to an input voltage range from −1V to +1V. The samplers 1110, 1112 may receive trigger values over communication links 1115 that determine when samples are to be passed to demodulators 1120, 1122. Each ADC may be controlled independently by one of the two trigger signals.

The waveform analyzer may further comprise demodulator logical blocks 1120, 1122 that are configured to demodulate the sampled signal into in-phase and in-quadrature waveform pairs (I-Q pairs). The modulators 1120, 1122 may receive demodulation coefficients from memory 815 (e.g., from a coefficient table comprising, for example, 50 MHz sine and cosine waveform data with some amplitude and phase) over communication link 1125, and provide demodulated data streams over link 1125 as output data from the waveform processor 800 (e.g., as data to stream to a conventional computer). The resulting I-Q waveform pairs may be compared by a relative I-Q block 1130 and subsequently integrated by integrators 1140, 1142. In some cases, both I-Q waveforms may be measured simultaneously using one of the I-Q waveforms as a reference to rotate the other I-Q pair. The relative I-Q block 1130 may either compute the relative I-Q waveform values, using one as a reference, or use the waveforms as received from the demodulators. The relative waveform generator 1130 may also output relative I-Q pair digital data streams for output from the waveform processor 800. Output I-Q waveform pair values from the relative I-Q block 1130 are provided to the integrators 1140, 1142.

The integrators may integrate received waveforms according to configurations specified by the master sequence 850 and passed by the handler 920. In some embodiments, the master sequencer may choose integration parameters (e.g., threshold values, integration length, and weights) from an integration parameters table in memory 815, based at least in part upon results computed from processing logic 930. In some cases, the selection of integration parameters may be determined ahead of time in a master sequence instruction that is downloaded from a conventional computer, and may not depend upon output from processing logic 930.

Figure 11B:
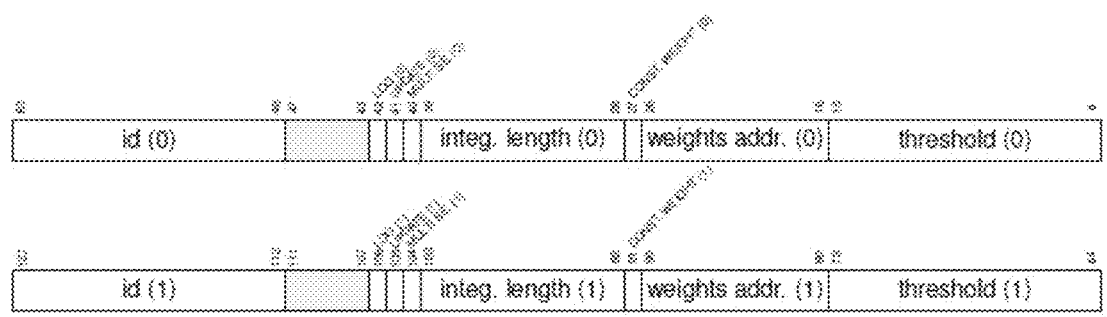
FIG. 11B depicts illustrative data that instructs a sequencer to perform integration of a signal, according to some embodiments.
Figure 11C:
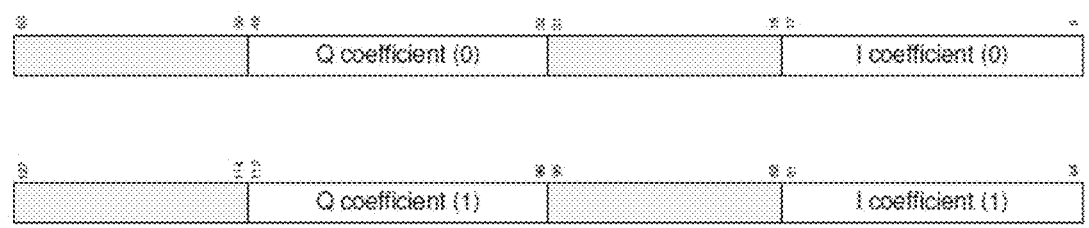
FIG. 11C illustrates data fields of illustrative integration parameters, according to some embodiments.

FIG. 11B depicts an illustrative integration parameters table, which points to the weights to be used during integration via the "weights addr." fields. In some implementations, the integrators may accumulate I-Q waveform values using weights that are identified by the integration parameters. The weights may or may not change during an integration. Weights that change during an integration may be stored as an array of values that are stepped through and provided to the integrators during an integration, of which FIG. 11C depicts an example. The integrated I-Q values may be 16-bit signed integers that correspond to voltage levels ranging from −500 mV to +500 mV. Integrated output values may be provided to the processing logic 730, and used together with external digital signals to affect operational flow of the waveform processor 505. The integrators 1140, 1142 may also output integrated data value streams as output from the waveform processor 505 over data link 1145, e.g., to provide to a conventional computer 705.

According to some embodiments, a waveform processor 800 may output a number of different data streams to a conventional computer for review, further analysis, and/or debugging purposes when executing an operation on a qubit. As described above, the waveform analyzer 830 may provide several data streams for transmission to a conventional computer. These data streams may include raw sampled data from each sampler 1110, 1112, demodulated I-Q waveform pair values from each demodulator 1120, 1122, relative I-Q pair data, and integrated values from each integrator 1140, 1142. In addition to these data streams, a waveform processor 800 may generate results data that can be used for debugging, and can also contain digested waveform data. Results data 1250 is depicted in FIG. 12, and may include operational information (e.g., a time stamp, the address of a current master sequence instruction "current instruction", the address of a current analog sequence instruction "curr. SE instr.", a current cycle, I and Q sums, etc.).

Results data 1250 may also include one or more registers that are used to stream out result summaries. To use a simple process as an example, at the beginning of each cycle in a quantum operation it may be desirable to reset a qubit by measuring it and applying a reset pulse if it is not cold (not in a 0 (ground) state). The waveform processor may detect the qubit state from integration values received from the waveform analyzer, and automatically instruct the analog sequencer to generate a pulse to return the qubit to its 0 state. The number of attempts to cool the qubit might be different each time the process is run. Instead of streaming the integrated waveform results, which would be a significant amount of data, only the number of attempts to cool the qubit may be streamed out through one of the four registers. This may simplify off-line analysis greatly. For more complex quantum operations, the ability to stream out result summaries can greatly reduce data flow to and data-processing burden on the conventional computer 705, whilst enabling complex quantum operations to be executed in the quantum computing system.

FIG. 13 illustrates data fields of an illustrative digital sequencer instruction, according to some embodiments. The illustrative instruction 1300 can be executed by digital sequencer 840, which produces digital signals which can be directed to digital I/O ports 841. Illustrative instruction 1300 includes a marker levels section that can be used to define arbitrary digital patterns in the following manner. The 3-bit mask field encodes a length of a pattern from 1-4 bits, and the pattern field encodes a pattern of the specified length. The duration specifies a number of cycles during which the encoded digital pattern will be output. According to some embodiments, sequential digital sequence instructions may be executed to produce a long digital output signal that concatenates the three specified digital patterns together in output.

Figure 14:
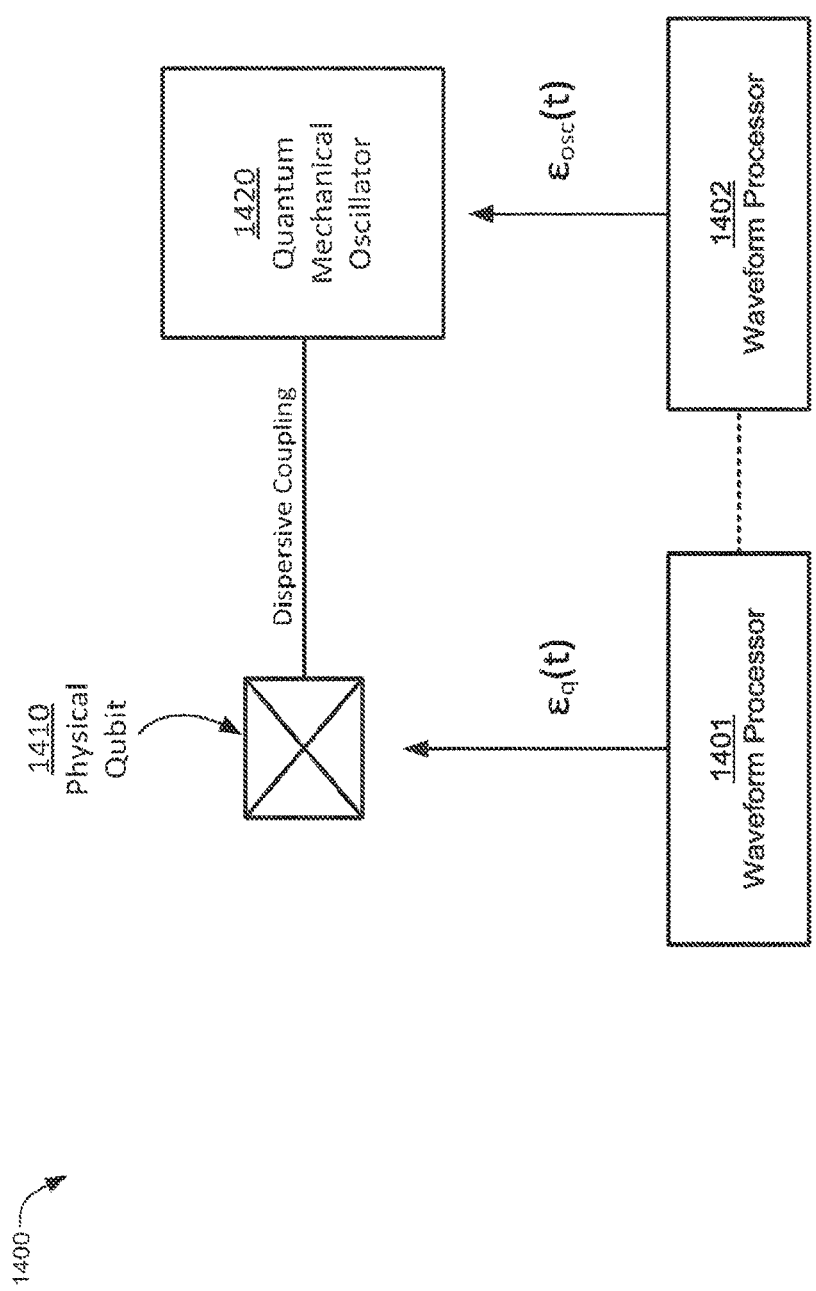
FIG. 14 is a block diagram of an illustrative quantum system coupled to two waveform processors that may each interact with separate elements of the quantum system.

FIG. 14 is a block diagram of an illustrative system 1400 in which two quantum systems are coupled to respective waveform processors. Waveform processors 1401 and 1402 may be instantiations of waveform processor 300 shown in FIG. 3 or waveform processor 800 shown in FIG. 8. The waveform processors 1401 and 1402 in the example of FIG. 14 are communicatively coupled together to form a cluster, as described above, and may be coupled to a common external conventional computing device (not shown). Waveform processors 1401 and 1402 may be operated as described above to execute operations upon the respective quantum systems 1410 and 1420.

Illustrative system 1400 includes a physical qubit 1410 and a quantum mechanical oscillator 1420. In the example of FIG. 14, the qubit and the oscillator are dispersively coupled—that is, the qubit-oscillator detuning is much larger (e.g., an order of magnitude larger) than the coupling strength between the qubit and the oscillator. An electromagnetic signal $\varepsilon_q(t)$ may be applied to the physical qubit 1410 from waveform processor 1401 and an electromagnetic signal $\varepsilon_{osc}(t)$ may be applied to the quantum mechanical oscillator 1420 from waveform processor 1402. As discussed above, such signals may be applied directly or via intermediate hardware (e.g., RF signal generators).

According to some embodiments, pulse waveforms can be determined ahead of time for a particular combination of initial state and final state of system 1400. Then, when the system is in a particular initial state and a target final state is desired, pulse waveforms can be selected from a library of preprepared pulse waveforms and applied to the qubit 1410 and the oscillator 1420 to transition the system from the initial state to the target final state. The waveform processors 1401 and 1402 may be loaded with instructions, as described above, to perform a desired sequence of such state transitions. These transitions may include quantum logic gates in addition to quantum error correction operations.

In some embodiments, certain signals applied to the physical qubit and to the quantum mechanical oscillator may cause a change in state of the qubit that depends upon the state of the oscillator. Thus, by observing the change in the state of the qubit as a result of application of these pulses, information about the state of the oscillator may be determined. As such, certain pulse waveforms may be used as tools to measure a state of the qubit-oscillator system. According to some embodiments, the waveform processors 1401 and 1402 may be loaded with instructions, as described above, to apply such pulse waveforms to measure the state of the qubit-oscillator system. In some embodiments, the waveform processors 1401 and 1402 may be configured to simultaneously effect the application of microwave pulses to both the qubit and oscillator, respectively.

Following below are three appendices that describe illustrative techniques of quantum error correction and quantum control that may be performed using the control electronics described herein. For instance, the below-described techniques may be performed via the waveform processor of FIG. 3 and/or FIG. 8. These techniques should not be viewed as limiting, and are provided as illustrative examples.

APPENDIX A—Techniques of Oscillator State Manipulation for Quantum Information Processing and Related Systems and Methods Conventional quantum information processing schemes couple a number of two-level quantum systems (i.e., "qubits") to encode information. However, quantum information tends to be fragile and susceptible to noise and decoherence processes. Thus, error-correction protocols are frequently employed with a goal of prolonging the amount of time for which quantum information may be reliably stored.

Some quantum error-correction protocols utilize a single logical qubit built from a collection of physical qubits. For instance, the quantum state $|\psi\rangle$, of a logical qubit may be represented by a superposition of the two states, |0> and |1>, e.g., |ψ>=α|0>+β|1>, where α and β are complex numbers representing the probability amplitude of the logical qubit being in state |0> and |1>, respectively. In some error correction schemes, the quantum state of the logical qubit may be encoded physically in a plurality of physical qubits, such as by entangling three physical qubits in a state with the same probability amplitudes as the logical qubit: |ψ>=α|000>+β|111>, which represents the entangled quantum state of three physical qubits.

Other quantum error-correction schemes utilize a quantum mechanical oscillator to encode a bit of quantum information, since such oscillators tend to exhibit longer decoherence times that qubits built from, say, Josephson junctions. Such oscillators have a linear energy spectrum, however, making quantum control of the oscillator's state difficult due to the resulting degeneracy of state transitions. Conventionally, a qubit may be resonantly coupled to the quantum mechanical oscillator, which produces a combined system that has a controllable nonlinearity.

There may be advantages to forming a system in which a qubit is far off-resonantly, or dispersively, coupled to a quantum mechanical oscillator. In particular, a dispersive coupling between a physical qubit and a quantum mechanical oscillator may be selected such that control of the combined qubit-oscillator system can be realized. The physical qubit may be driven with an electromagnetic pulse (e.g., a microwave pulse) and the quantum mechanical oscillator simultaneously driven with another electromagnetic pulse, the combination of which results in a change in state of the qubit-oscillator system.

It may be analytically demonstrated that a suitable combination of electromagnetic pulses (hereinafter, "pulses") separately applied to a physical qubit and to a quantum mechanical oscillator to which the qubit is coupled may produce any arbitrary unitary operation on the oscillator, and thereby provide for universal control. This determination was made under a constraint that the qubit and oscillator were not driven at the same time. However, while this analysis produces techniques for universal control, the constraint causes substantive operations on the oscillator to require application of a long series of pulses to the qubit and the oscillator, which limits the number of operations that are feasible in the presence of decoherence of the system. Accordingly, even if the fidelity of the operations is very high or even perfect, decoherence of the system over the period during which the operations are applied may nonetheless result in a less than desirable fidelity in the aggregate.

By relaxing the constraint that the qubit and oscillator are driven separately, pulse waveforms that produce desired system state changes can be determined via the use of numerical techniques. Numerical techniques have been recognized that can determine pulse waveforms which, when applied to the system, produce very high fidelity state transitions in much less time than would have been required under the constrained approach described above.

According to some embodiments, the pulse waveforms can be determined ahead of time for a particular combination of initial system state and final system state. Then, when the system is in a particular initial state and a target final state is desired, pulse waveforms can be selected from a library of preprepared pulse waveforms and applied to the qubit and the oscillator to transition the system from the initial state to the target final state.

According to some embodiments, pulses may be simultaneously applied to a physical qubit and to a quantum mechanical oscillator to which the qubit is coupled, thereby producing a change in the state of the qubit-oscillator system. In some cases, the pulses may be applied to the qubit and the oscillator for the same amount of time and/or may be applied during the same time period (i.e., with both pulses beginning and ending at substantially the same time).

According to some embodiments, pulses applied to a physical qubit and to a quantum mechanical oscillator may cause a change in a photon number state of the oscillator. In at least some cases, the state of the qubit may change also.

According to some embodiments, pulses applied to a physical qubit and to a quantum mechanical oscillator may cause a change in state of the qubit that depends upon the state of the oscillator. In particular, the state of the oscillator may be mapped onto the state of the qubit via particular pulse waveforms applied to the qubit and to the oscillator. Thus, by observing the change in the state of the qubit as a result of application of these pulses, information about the state of the oscillator may be determined. In at least some cases, the state of the qubit may be measured to determine information about the state of the oscillator without substantially changing the state of the oscillator. Thus, certain pulse waveforms to be used as tools to measure a state of the qubit-oscillator system. In other cases, measuring the state of the qubit to determine information about the state of the oscillator causes a back-action that changes the state of the oscillator.

According to some embodiments, a state of the oscillator may be treated as a multi-qubit register by considering the binary representation of its photon number states. For example, the |5> photon number state of the oscillator may be viewed as the |101> state of a 3-qubit register. Particular types of pulses that may be applied to the qubit and to the oscillator may produce a change in state of the qubit that depends upon the state of a particular "bit" of this multi-qubit register. For example, a pair of pulses applied to the qubit and to the oscillator, respectively, when the qubit is in the ground state, may transition the qubit from the ground state to an excited state when the least significant bit of the multi-qubit register is equal to 1, whereas application of the same pulses may result in the qubit remaining in the ground state when the least significant bit of the register is equal to 0. Pulse waveforms may be determined and applied to the qubit and to the oscillator to read any one or more of any bits of an n-bit multi-qubit register. In some cases, a pulse applied to the qubit and to the oscillator may be configured to measure the X value of a quantum bit in the register, corresponding to determining whether the state is |0>+|1> or |0>-|1>; that is, determining the phase of the coherent superposition.

Accordingly, by determining pulse waveforms via numerical techniques as described herein, the state of the oscillator (whether acting as a multi-qubit register or otherwise) can be both determined and manipulated to a desired target state, thereby providing universal control of the oscillator.

Following below are more detailed descriptions of various concepts related to, and embodiments of, techniques for controlling the state of a quantum mechanical system. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 15:
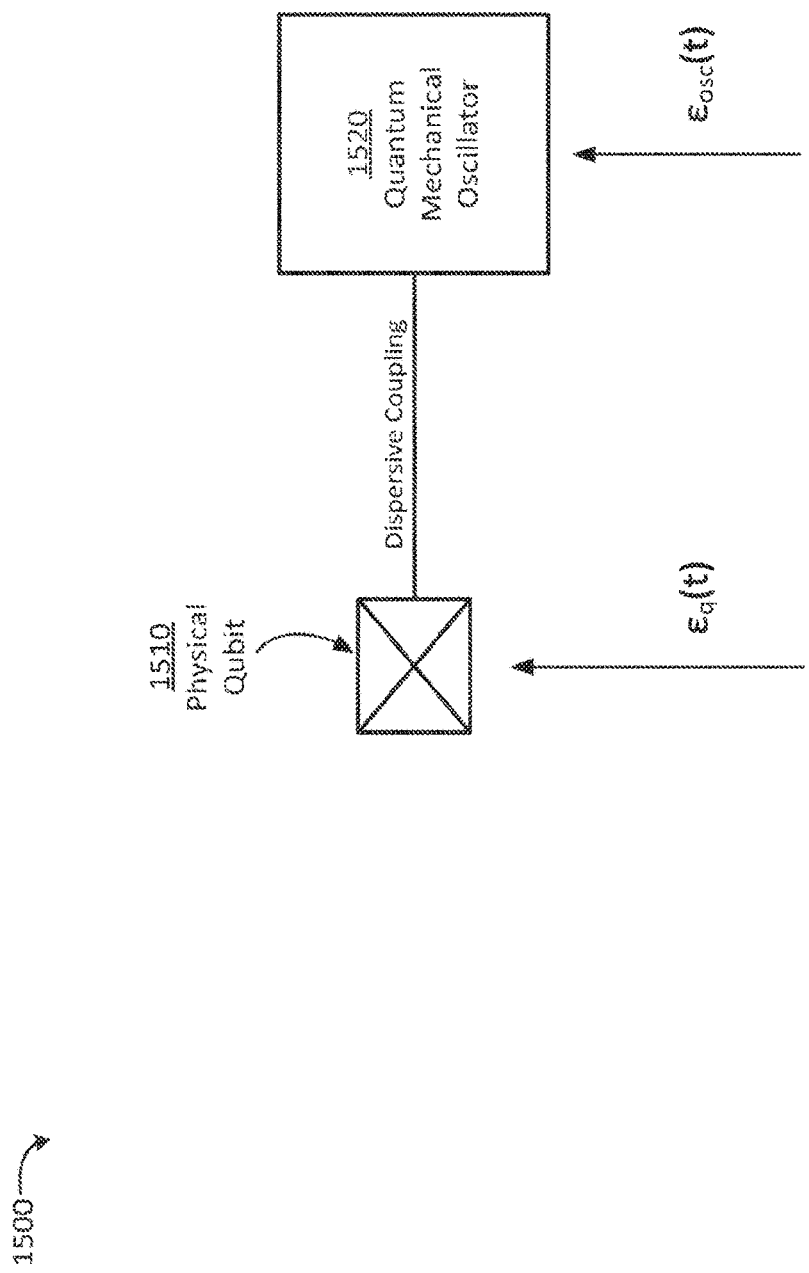
FIG. 15 is a block diagram of a circuit quantum electrodynamics system, according to some embodiments.

FIG. 15 is a block diagram of a circuit quantum electrodynamics system, according to some embodiments. System 1500 includes a physical qubit 1510 and a quantum mechanical oscillator 1520. In the example of FIG. 15, the qubit and the oscillator are dispersively coupled—that is, the qubit-oscillator detuning is much larger (e.g., an order of magnitude larger) than the coupling strength between the qubit and the oscillator. An electromagnetic signal $\varepsilon_q(t)$ may be applied to the physical qubit 1510 and an electromagnetic signal $\varepsilon_{osc}(t)$ may be applied to the quantum mechanical oscillator 1520. Generally in the discussion below, application of such an electromagnetic signal or pulse may also be referred to as "driving" of the qubit or oscillator.

In the example of FIG. 15, the state of the oscillator 1520 may be represented by a superposition of components, each component comprising an excitation number eigenstate (also known as a Fock state), $|n>$, and a corresponding probability amplitude, $c_n$:

$$|\psi>_{osc.} = \Sigma_{n=0}^{\infty} c_n |n>. \quad \text{(Eqn. A1)}$$

According to some embodiments, the quantum mechanical oscillator 1520 may comprise a resonator cavity, such as a microwave cavity. In such embodiments, the system 1500 may be described using the Hamiltonian:

$$H(t) = H_{cavity} + H_{qubit} + H_{interaction} + H_{drive}(t) \quad \text{(Eqn. A2)}$$

$$H_{cavity} = \omega_c \hat{a}^\dagger \hat{a} + \frac{K}{2}(\hat{a}^\dagger)^2 \hat{a}^2 \quad \text{(Eqn. A3)}$$

$$H_{qubit} = \omega_q \hat{b}^\dagger \hat{b} + \frac{\alpha}{2}(\hat{b}^\dagger)^2 \hat{b}^2 \quad \text{(Eqn. A4)}$$

$$H_{interaction} = \chi \hat{a}^\dagger \hat{a} \hat{b}^\dagger \hat{b} + \frac{\chi'}{2} \hat{b}^\dagger \hat{b}(\hat{a}^\dagger)^2 \hat{a}^2 \quad \text{(Eqn. A5)}$$

$$H_{drive}(t) = \varepsilon_C(t)\hat{a} + \varepsilon_T(t)\hat{b} + \text{(Hermitian conjugate)} \quad \text{(Eqn. A6)}$$

where $\chi$ is a dispersive shift of the dispersive coupling between the cavity and the qubit, the annihilation operator corresponding to the cavity and qubit modes is denoted by $\hat{a}$ or $\hat{b}$, respectively, $\omega_c$ is a fundamental frequency of the cavity, $\omega_q$ is the transition frequency of the qubit, K is the cavity anharmonicity (due to the Kerr effect), and $\alpha$ is the transmon anharmonicity.

As discussed above, drive waveforms $\varepsilon_q(t)$ and $\varepsilon_{osc}(t)$ may be determined via numerical techniques for a particular desired state change of the system 1500. In particular, suitable drive waveforms may be determined that allow $\varepsilon_q(t)$ and $\varepsilon_{osc}(t)$ to be applied simultaneously to the physical qubit and the oscillator, respectively. The drive waveforms $\varepsilon_q(t)$ and $\varepsilon_{osc}(t)$ may be applied during the same time period (i.e., may start and end together) or may simply overlap in time.

FIG. 16 is a schematic drawing of an illustrative circuit quantum electrodynamics system, according to some embodiments. System 1600 is an example of system 1500 shown in FIG. 15, including a transmon qubit 1610 and a cavity resonator 1620. In the example of FIG. 16, the cavity resonator 1620 is a λ/4 coax-stub cavity resonator coupled to the transmon 1610 and to a read-out resonator 1611. Input couplers (ports) 1612 and 1622 deliver the time dependent microwave drive signals $\varepsilon_q(t)$ and $\varepsilon_{osc}(t)$, respectively. The transmon may be dispersively coupled to the cavity with a dispersive shift of between −1 MHz and −4 MHz, such as between −3 MHz and −2 MHz, such as −2.2 MHz. According to some embodiments, the microwave drive signals may be full in-phase/quadrature (IQ) modulated microwave fields centered on either the fundamental frequency of the cavity (when being input to port 1622) or the transition frequency of the qubit (when being input to port 1612).

Figure 17A:
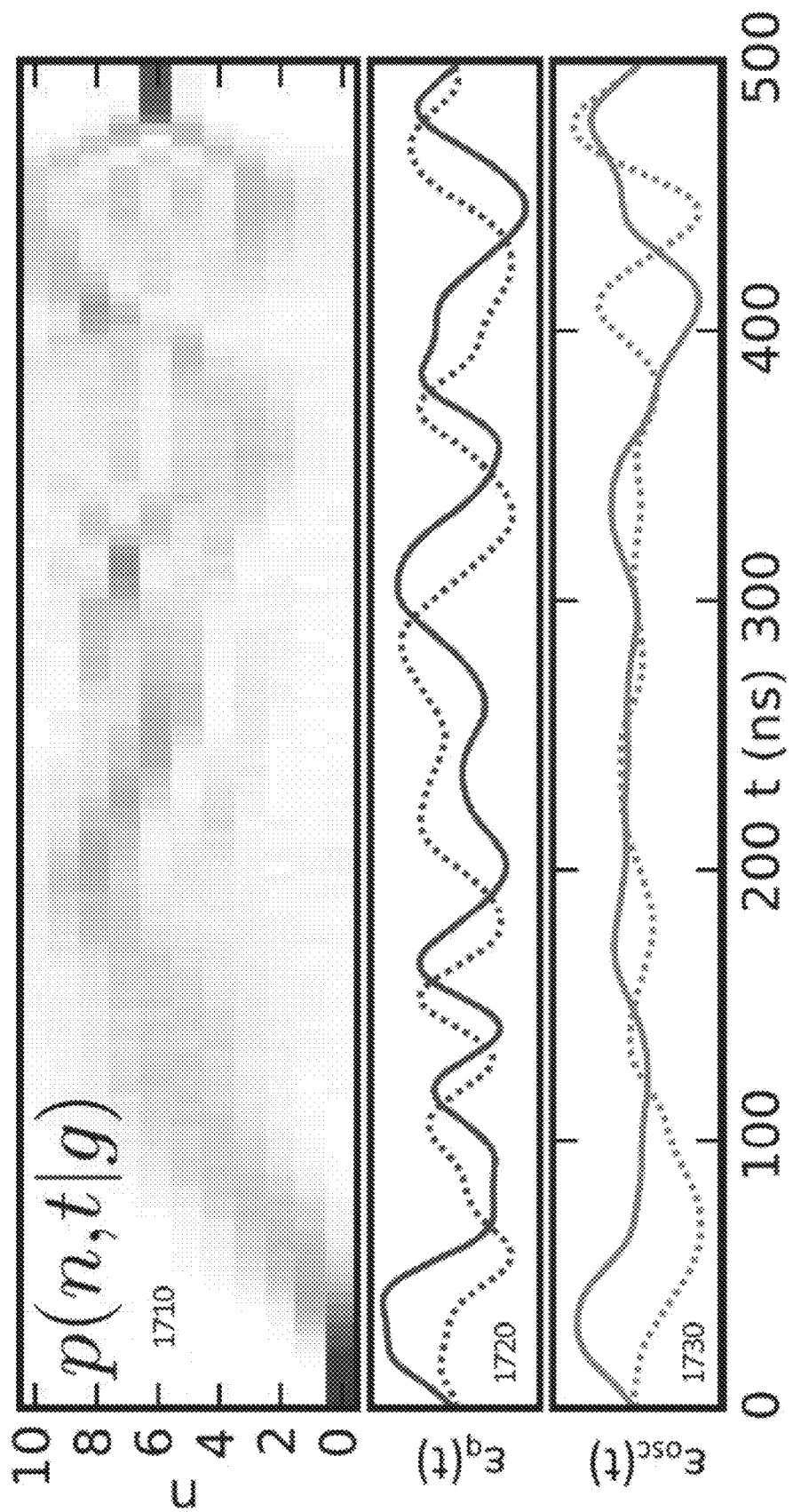
FIG. 17A illustrates a change in photon number state of a quantum mechanical oscillator when the illustrated drive waveforms are applied to the oscillator and to a physical qubit to which it is coupled, according to some embodiments.

FIG. 17A illustrates a change in photon number state of a quantum mechanical oscillator when the illustrated drive waveforms are applied to the oscillator and to a physical qubit to which it is coupled, according to some embodiments. The example of FIG. 17A illustrates the evolution of a quantum mechanical system such as system 1500 shown in FIG. 15 or system 1600 shown in FIG. 16 when drive signals $\varepsilon_q(t)$ and $\varepsilon_{osc}(t)$ are applied concurrently to a physical qubit and a quantum mechanical oscillator, respectively. At least one aspect of the change in state of the system in question as a result of the application of the drive signals shown is to transition the number state of the oscillator from the $|0>$ state to the $|6>$ state, as discussed below.

In the example of FIG. 17A, a number state of the oscillator is represented in graph 1710 at a series of times over the 500 ns period during which the drive signals $\varepsilon_q(t)$ and $\varepsilon_{osc}(t)$ are applied. In graph 1710, the probability that a measurement of the system would produce a measurement of a respective number state is represented by different shades of gray, with darker gray or black representing a high probability of the particular number state being measured and lighter grays representing low probabilities.

Graph 1720 shows the drive waveform $\varepsilon_q(t)$ applied to the qubit of the system and graph 1730 shows the drive waveform $\varepsilon_{osc}(t)$ applied to the oscillator of the system in the example of FIG. 17A. The solid lines represent an in-phase field component of the drive signal whereas the dotted lines represent a quadrature field component of the drive signal.

In the system's initial state (at time t=0 shown in FIG. 17A), the number state of the oscillator is $|0>$ as shown by a very dark gray block at t=0 and n=0. In the system's final state (at time t=500 ns shown in FIG. 17A), the number state of the oscillator is $|6>$ as shown by a very dark gray block at t=500 ns and n=6. At intermediate times during application of the drive waveforms, the number state of the oscillator is generally a superposition of several number states.

Note that while the particular state of the oscillator between the initial state (t=0) and the final state (t=500 ns) of the system may not be known, this has no direct effect on the use of the drive pulses to transition the system from the $|0>$ state to the $|6>$ state. That is, the drive waveforms shown in the example of FIG. 17A have been determined based on the criteria that the current number state of the oscillator is $|0>$ and the target final state of the oscillator after application of the pulses is $|6>$. The numerical techniques to be described below allow this type of determination so that the system can be transitioned from an initial to final state so long as a suitable waveform for the particular pair of states has been determined.

While FIG. 17A is an example of manipulating the number state of the oscillator in a quantum mechanical system, the changes in the state of such a system that may be effected by concurrent application of drive signals to a qubit and to an oscillator to which the qubit is dispersively coupled are not limited to this type of manipulation. As discussed below, one other type of system state change may be to produce a qubit state that is dependent upon the state of the oscillator. This is merely one additional example, however. The numerical techniques described herein allow constraints about the initial and final state of the qubit-oscillator system to be provided as input to the calculation such that shapes of the drive signals $\varepsilon_q(t)$ and $\varepsilon_{osc}(t)$ to cause the state transition as defined by the constraints to be output from the calculation. As such, the types of qubit-oscillator state changes that can be produced is not limited to any particular type of state change described herein, as the numerical techniques are not so limited.

Figure 17B:
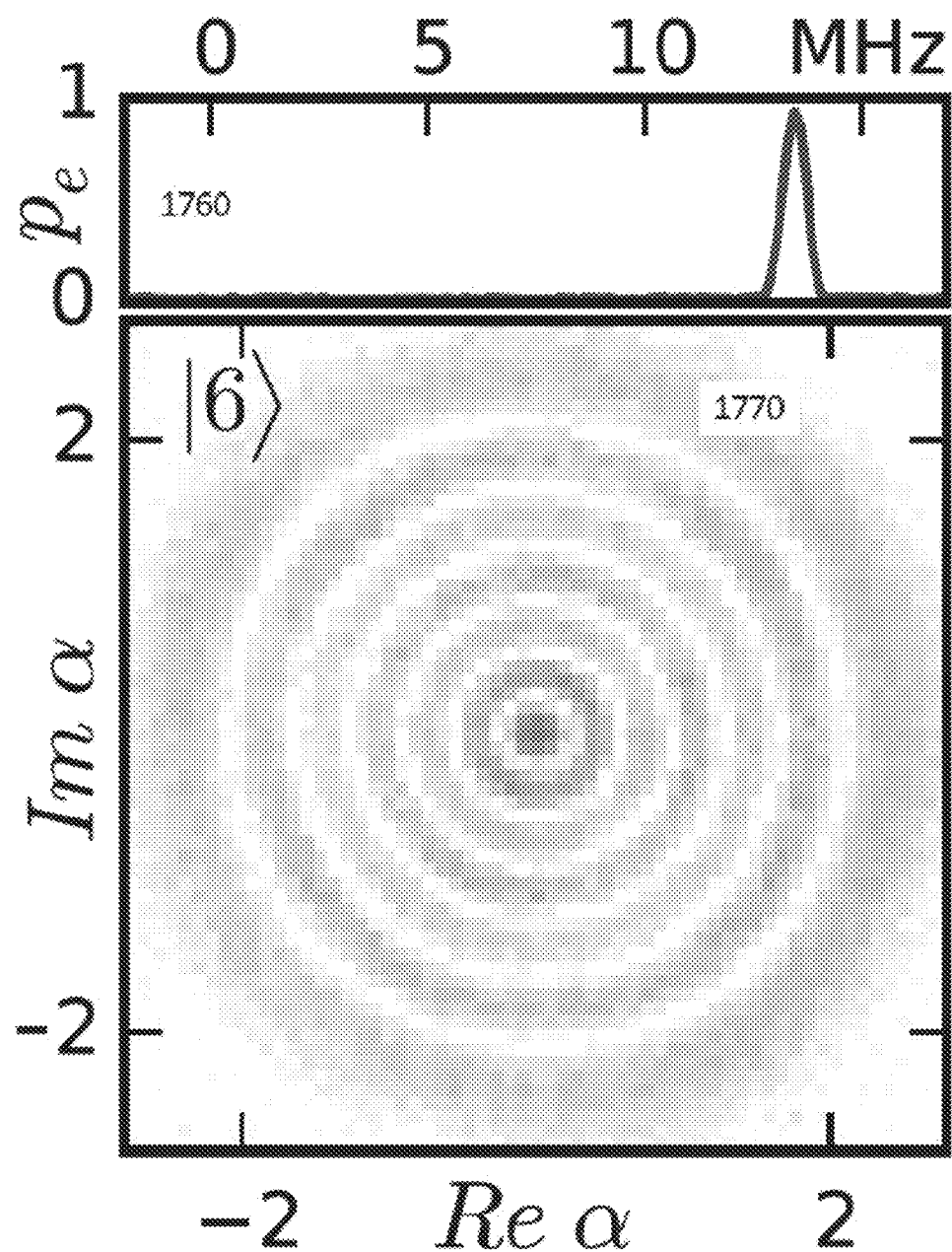
FIG. 17B illustrates a characterization of the state of the oscillator after the change in photon number state shown in FIG. 18A, according to some embodiments.

FIG. 17B illustrates a characterization of the state of the oscillator after the change in photon number state shown in FIG. 17A, according to some embodiments. FIG. 17B includes graph 1760 which illustrates a spectroscopic view of the qubit after producing the transition to the |6> state shown in FIG. 17A. As can be seen in graph 1760, the power is concentrated around 13 MHz, which in the example of FIG. 17B is approximately equal to six times the dispersive shift $\chi$ of the qubit-oscillator coupling (i.e. $\chi \approx 2.2$ MHz). Graph 1770 shown in FIG. 17B illustrates Wigner tomography of the oscillator state after transition to the |6> state as shown in FIG. 17A.

Figure 18A:
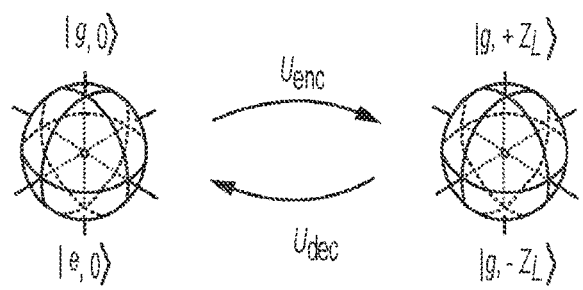
FIGS. 18A-18D illustrate encoding of a cat state qubit, according to some embodiments.
Figure 18B:
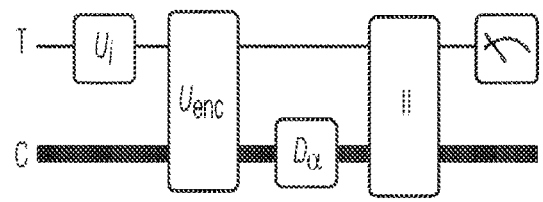
Figure 18C:
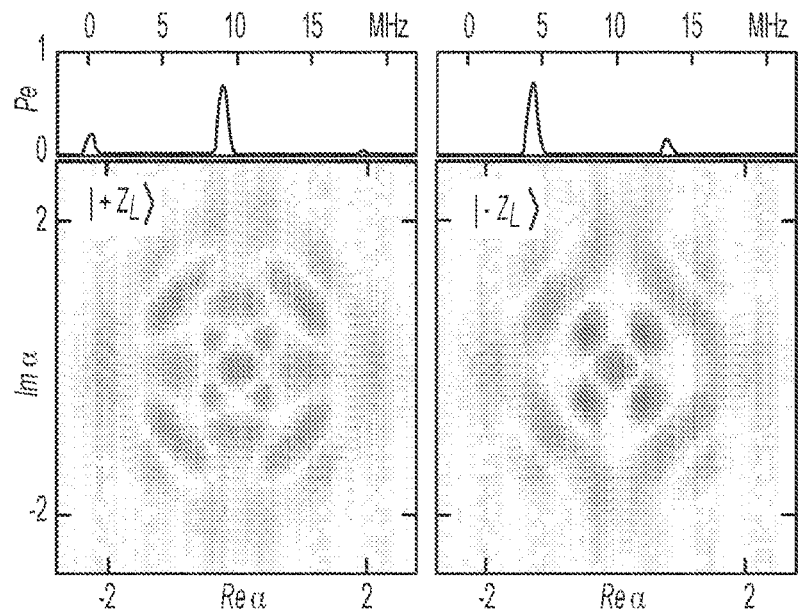

FIGS. 18A-18C illustrate encoding of a cat state qubit, according to some embodiments. FIG. 18A illustrates operations $U_{enc}$ and $U_{dec}$ which may be used to coherently map between two distinct two-dimensional subspaces, represented by Bloch spheres. The first subspace (left of FIG. 18A) consists of a transmon qubit's ground and excited states, |g> and |e>, respectively, with a cavity to which the transmon qubit is coupled in the vacuum state. The second subspace (right of FIG. 18B), is given by the oscillator-encoded states $|+Z_L\rangle$ and $|-Z_L\rangle$.

FIG. 18B illustrates a sequence of operations that may be applied to the transmon qubit (labeled "T") and/or to the cavity to which the qubit is coupled (labeled "C"). A transmon state is prepared by applying an initial rotation $U_i$ and is then mapped to the cavity via the encoding operation $U_{enc}$. A cavity displacement $D_\alpha$ is then applied to the cavity following a parity mapping operation $\Pi$ that provides for measurement of the cavity Wigner function $W(\alpha)$. The parity mapping operation $\Pi$ may be implemented by determining a suitable drive waveform using the numerical techniques described herein.

As shown in FIG. 18C, applying $U_{enc}$ to the transmon states |g> and |e> produces states whose Wigner functions are consistent with the encoded basis states given by four-component cat states:

$$|+Z_L\rangle = \frac{1}{N}(|\alpha\rangle + |i\alpha\rangle + |-\alpha\rangle + |-i\alpha\rangle)$$

$$= \frac{1}{N}\sum_n \frac{\alpha^{4n}}{\sqrt{(4n)!}}|4n\rangle$$

$$|-Z_L\rangle = \frac{1}{N}(|\alpha\rangle - |i\alpha\rangle + |-\alpha\rangle - |-i\alpha\rangle)$$

$$= \frac{1}{N}\sum_n \frac{\alpha^{4n+2}}{\sqrt{(4n+2)!}}|4n+2\rangle$$

A transmon spectroscopy experiment (top panels, showing probability densities for each number state of the cavity) illustrates that only photon number states with n=0 mod 4 (n=2 mod 4) are present for logical state $|+Z_L\rangle$ ($|-Z_L\rangle$).

Figure 18D:
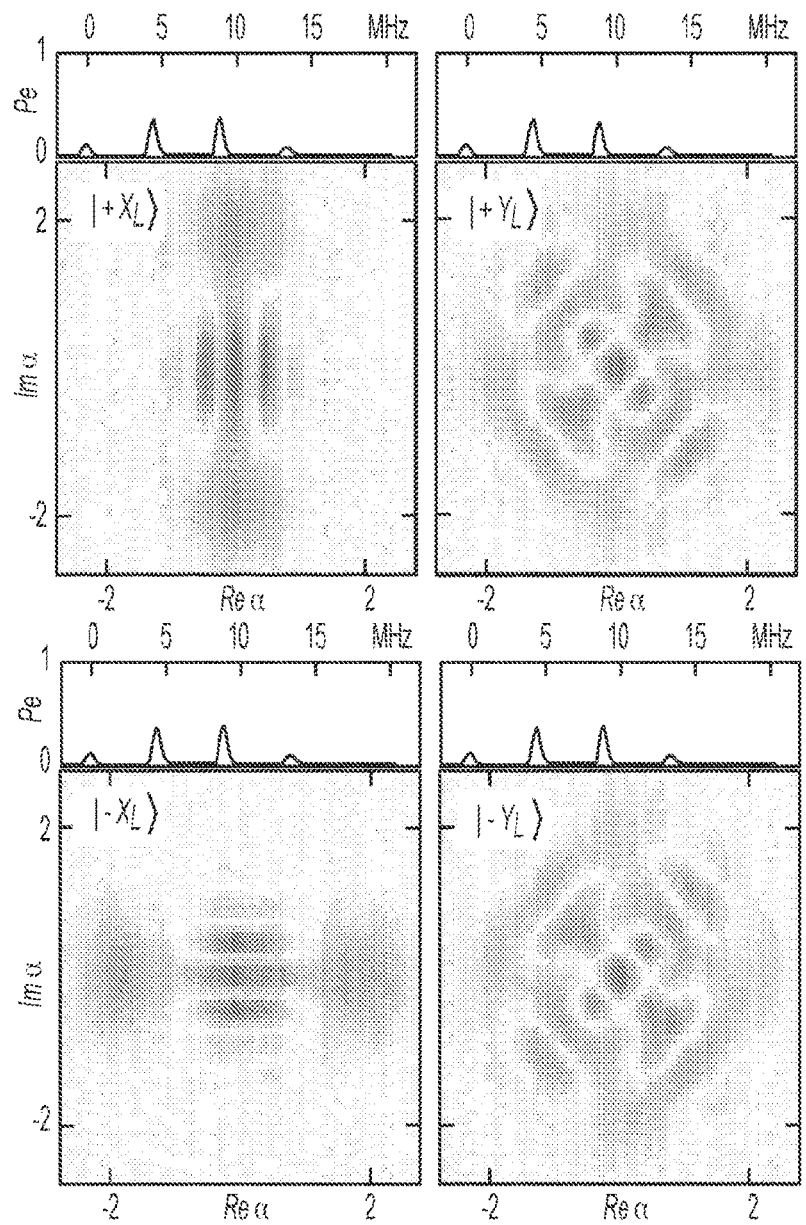

As shown in FIG. 18D, applying $U_{enc}$ to superpositions of the transmon basis states demonstrates that the relative phase is preserved and that $U_{enc}$ is a faithful map between the transmon and logical qubit Bloch spheres. These states, on the equator of the Bloch sphere, are equally weighted superpositions of $|+Z_L\rangle$ and $|-Z_L\rangle$, and therefore contain all even photon numbers present in the basis states.

Figure 19:
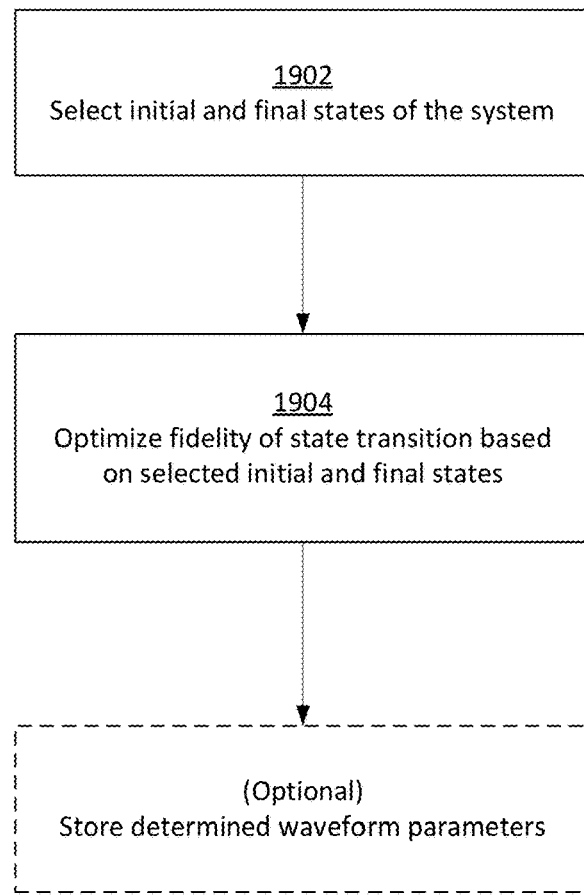
FIG. 19 is a flowchart of a method of determining drive waveforms to be applied to a circuit quantum electrodynamics system to produce a desired change in the state of the system, according to some embodiments.

FIG. 19 is a flowchart of a method of determining drive waveforms to be applied to a circuit quantum electrodynamics system to produce a desired change in the state of the system, according to some embodiments. In method 1900, numerical techniques are applied based on the Hamiltonian of the quantum system in question (e.g., system 1500 shown in FIG. 15 or system 1600 shown in FIG. 16) with added constraints (one or more of which constrain the final state of the system) to numerically determine the parameters of drive waveforms that can produce a system transition that respects the constraints.

Based on Equation A2 above, the capacity of known decoherence sources to impact the fidelity of operations on the system can be simulated using a Markovian Lindblad master equation of the form:

$$\frac{\partial}{\partial t}\rho(t) = \qquad \text{(Eqn. A7)}$$
$$\frac{i}{\hbar}[H(t), \rho(t)] + \left(\frac{1}{T_{1,C}}D[\hat{a}] + \frac{1}{T_{1,T}}D[\hat{b}] + \frac{1}{T_\phi}D[\hat{b}^\dagger \hat{b}]\right)(\rho(t))$$

$$D[a](\rho) = a\rho a^\dagger - \frac{1}{2}\{a^\dagger a, \rho\} \qquad \text{(Eqn. A8)}$$

In the above equations and in the example described below, it is assumed for the sake of example that the qubit of the system is a transmon qubit and the oscillator is a resonating cavity. Non-limiting, illustrative values for the system parameters in the above equations are shown in Table A1, below.

| Description | Hamiltonian Term | Illustrative Value |
| --- | --- | --- |
| Transmon frequency | $\omega_T \hat{b}^\dagger \hat{b}$ | 5663.9 MHz |
| Cavity frequency | $\omega_C \hat{a}^\dagger \hat{a}$ | 4452.5 MHz |
| Dispersive shift | $\chi\, \hat{a}^\dagger \hat{a} \hat{b}^\dagger \hat{b}$ | −2.2 MHz |
| Transmon anharmonicity | $\frac{\alpha}{2}(\hat{b}^\dagger)^2 \hat{b}^2$ | −236 MHz |
| Cavity anharmonicity (Kerr) | $\frac{K}{2}(\hat{a}^\dagger)^2 \hat{a}^2$ | −3.7 kHz |
| Second order dispersive shift | $\frac{\chi'}{2}(\hat{a}^\dagger)^2 \hat{a}^2 \hat{b}^\dagger \hat{b}$ | −17.7 kHz |
| Transmon relaxation | $\frac{1}{T_1}D[\hat{b}]$ | 170 μs |
| Transmon excitation | $\frac{1}{T_\uparrow}D[\hat{b}^\dagger]$ | — |
| Transmon dephasing | $\frac{1}{T_\phi}D[\hat{b}^\dagger \hat{b}]$ | 43 μs |
| Cavity relaxation | $\frac{1}{T_{cav}}D[\hat{a}]$ | 2.7 μs |
| Cavity dephasing | $\frac{1}{T_{\phi,cav}}D[\hat{a}^\dagger \hat{a}]$ | — |

According to some embodiments, operations on the quantum system performed via the drive waveforms applied to the qubit and to the oscillator may be defined in terms of a set of simultaneous state transfers. That is, an operation, for each i), takes an initial state of the system $|\psi_{init}^{(i)}\rangle$ to a final system state $|\psi_{final}^{(i)}\rangle$. In act 1902 of method 1900, these initial and final states may be selected.

In order to prepare a desired operation on the joint cavity-transmon Hilbert space, numerical techniques can be used to maximize the (coherent) average fidelity of these state transfers over the drive waveforms $\varepsilon(t) \equiv (\varepsilon_C(t), \varepsilon_T(t))$:

$$\underset{\varepsilon(t)}{\text{maximize}}\ \mathcal{F}(\varepsilon(t)) \qquad \text{(Eqn. A9)}$$

where $$\mathcal{F}(\varepsilon(t)) = \left| \sum_i \langle \psi_{final}^{(i)} | U(T, \varepsilon(t)) | \psi_{init}^{(i)} \rangle \right|^2, \qquad \text{(Eqn. A10)}$$

and where the unitary U defined by the waveforms $\varepsilon(t)$ is given by the time-ordered exponential of the Hamiltonian up to some final time T, $$U(T, \varepsilon(t)) = \mathcal{T} \exp(-\int_0^T dt H(\varepsilon(t))). \qquad \text{(Eqn. A11)}$$

In act 1904 of method 1900, the optimization of Equation A9 is performed to determine the drive waveforms $\varepsilon(t) = (\varepsilon_C(t), \varepsilon_T(t))$ based on the initial and final states selected in act 1902. The optimization may be performed using any suitable numerical technique(s), as the present disclosure is not limited to any particular numerical technique or techniques.

According to some embodiments, $\varepsilon(t)$ may be represented by a set of parameters that characterize the drive waveforms. For instance, the drive waveforms may be represented by parametric curves and the parameters of the curves optimized within the context of Equation A9 to determine the shape of the drive waveforms. According to some embodiments, $\varepsilon(t)$ may be represented as a piecewise constant function with $N=T/\Delta t$ steps of length $\Delta t$ (e.g., $\Delta t=2$ ns), corresponding to a time resolution of the waveform generation process.

$$U(T, \varepsilon(t)) = U_N U_{N-1} \ldots U_2 U_1 \qquad \text{(Eqn. A12)}$$

$$U_k = \exp\left(\frac{i\Delta t}{\hbar} H(\varepsilon(k\Delta t))\right) \qquad \text{(Eqn. A13)}$$

For example, using 4 parameters per time point (for the real and imaginary components of each of the cavity and transmon drive waveforms) and N=550 time points representing a 1.1 µs pulse, there would be 2200 parameters over which to optimize.

The optimization problem of Equation A9 may, in at least some cases, produce multiple solutions of $\varepsilon(t)$ that achieve equally high fidelities when applied to the quantum system. As such, in some embodiments, additional constraints upon the system may be applied by adding additional terms to Equation A9:

$$\underset{\varepsilon(t)}{\text{maximize}}\ \mathcal{F}(\varepsilon(t)) - \sum_i \lambda_i g_i(\varepsilon(t)) \qquad \text{(Eqn. A14)}$$

where the constraints $g_i$ are each multiplied by a Lagrange multiplier $\lambda_i$. Accordingly, in act 1904, Equation A14 may be optimized as an alternative to optimization of Equation A9 to determine the drive waveforms. While any number and type of suitable constraints $g_i$ may be used within Equation A14, some examples are described below.

One illustrative constraint that may be included in Equation A14 enforces an upper limit on the amount of amplitude that may be applied with the drive pulses, i.e., that $\varepsilon(t) \leq \varepsilon_{max}$ for all t. This constraint may be written as:

$$g_{amplitude}(\varepsilon(t)) = \int dt (|\varepsilon(t)| - \varepsilon_{max})^2 \Theta(|\varepsilon(t)| - \varepsilon_{max})$$

$$= \sum_n (|\varepsilon(n\Delta t)| - \varepsilon_{max})^2 \Theta(|\varepsilon(n\Delta t)| - \varepsilon_{max})$$

Additionally, or alternatively, an illustrative constraint that may be included in Equation A14 may be designed to minimize the bandwidth of the applied pulses (e.g., because interactions between the electromagnetic source of the pulses and the quantum system become more uncertain as the pulses move away from resonance). This constraint may be applied via the following "penalty term" in Equation A14:

$$g_{derivative}(\varepsilon(t)) = \int dt \left(\frac{\partial \varepsilon(t)}{\partial t}\right)^2$$

Additionally, or alternatively, an illustrative constraint that may be included in Equation A14 may be to enforce a hard cutoff on the minimum and maximum frequencies allowed in the solution. For example, Equation A14 may be reparametrized in terms of the Fourier transform of the pulses and conditions that the drive signals are equal to zero above and below the maximum and minimum frequencies may be applied. The fidelity may then be maximized with respect to the Fourier transform of the pulses.

Any one or more of the constraints above and/or any other constraints may be applied in Equation A14, as the above are merely provided as illustrative examples.

In order to optimize Equations A9 or A14 in a numerically tractable manner, it may be necessary to adapt the equation in light of the infinite-dimensional nature of the Hilbert space. That is, since computer memory is finite, vectors or matrices of infinite length cannot be represented without truncation or otherwise representing the vector or matrix in a finite form. As such, act 1904 may include such a step of truncation or other manipulation of vectors or matrices of infinite length.

According to some embodiments, Equation A14 may be adapted in light of the infinite Hilbert space by choosing a photon number truncation N such that the operator â becomes a N×N matrix. When we do this, we are in effect replacing our infinite-dimensional oscillator with a finite-dimensional qudit. This replacement is only valid if all of the system dynamics relevant for the desired state transfers occurs within the $\{|0\rangle, \ldots, |N-1\rangle\}$ subspace. For generic applied drives this is not the case, however, such an approach may naturally fit with some approaches described herein (see FIGS. 21A-21D and FIG. 22 described below) or may otherwise apply in some embodiments.

In order to enforce this property, the optimization problem of Equation A14 can be modified to find a solution that operates identically under several different values of N. Writing the fidelity as computed with a truncation N as $\mathcal{F}_N$, we have:

$$\underset{\varepsilon(t)}{\text{maximize}}\left(\sum_k \mathcal{F}_{N+k}(\varepsilon(t))\right) - \left(\sum_i \lambda_i g_i(\varepsilon(t))\right) \qquad \text{(Eqn. A15)}$$

Furthermore, to enforce that the behavior is identical in the different truncations, the following penalty term can be included in Equation A15:

$$g_{discrepancy}(\varepsilon(t)) = \sum_{k_1 \neq k_2} (\mathcal{F}_{N+k_1}(\varepsilon(t)) - \mathcal{F}_{N+k_2}(\varepsilon(t)))^2 \quad \text{(Eqn. A16)}$$

The constraint of Equation A16 ensures that the determined fidelity of a space of size N is equal to the determined fidelity of a space of size N+1, and to the determined fidelity of a space of size N+2, etc.

According to some embodiments, the choice of a value of N may, at least in part, determine a maximum photon number population that can be produced by a pulse, and/or may determine, at least in part, a minimum time necessary to complete the operation in question (e.g., faster pulses may be achieved with a higher value of N). The approach of Equation A15, coupled with the constraint of Equation 16, ensures that the truncation point does not affect the end result of the determined pulse waveforms.

Irrespective of which of Equations A9, A14 and A15 is optimized to determine the pulse waveforms, the optimization may use any suitable numerical techniques, including any nonlinear optimization techniques. According to some embodiments, the numerical techniques may include one or more gradient descent methods, including but not limited to, Broyden-Fletcher-Goldfarb-Shannon (BFGS).

Figure 20:
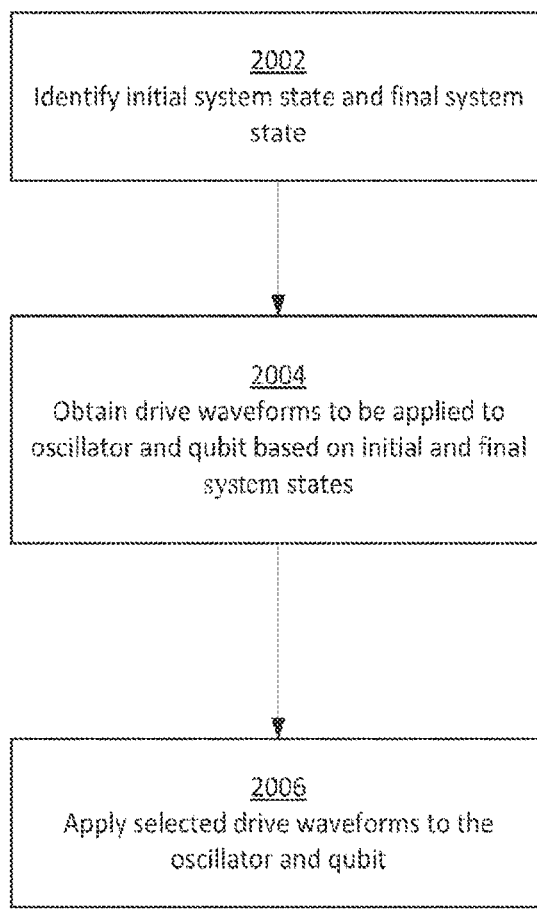
FIG. 20 is a flowchart of a method of selecting and applying drive waveforms to a circuit quantum electrodynamics system, according to some embodiments.

Once drive waveforms have been determined via the above-described process or otherwise in method 1900, the waveforms may be optionally stored in a suitable computer readable medium for later retrieval. According to some embodiments, method 1900 may be performed a number of times for various combinations of initial and final system states and the waveforms determined for each combination stored in one or more computer readable media. As such, a "library" of pulse waveforms may be produced so that any desired system state transition can be produced by retrieving and applying pulse waveforms that will produce the desired transition. FIG. 20 is a flowchart illustrating such a method of selecting and applying drive waveforms to a circuit quantum electrodynamics system, according to some embodiments.

Method 2000 may be performed within any suitable quantum mechanical system such as system 1500 shown in FIG. 15 or system 1600 shown in FIG. 16. In act 2002, an initial system state and a target system state are identified. According to some embodiments, at least part of the initial system state may be identified via application of pulse waveforms to the system as described in relation to FIGS. 21A-21D and FIG. 22 below.

According to some embodiments, the initial and final system states may include information about states of the qubit, the oscillator, or both the qubit and the oscillator. For instance, the initial system state may include a known photon number state of the oscillator yet may not include any known state of the qubit (that is, in some cases the state of the qubit may be irrelevant to the initial state for a particular system transition). As another example, the initial system state may include only a known state of the qubit. As another example, the final system state may include information about a state of the qubit and information about the state of the oscillator.

In act 2004, drive waveforms are selected based on the initial and final system states identified in act 2002. As discussed above, in some embodiments drive waveforms may be precomputed and stored in one or more a computer readable media. In such cases, act 2004 may comprise a lookup into the media using the initial and final states as a lookup key. In some embodiments, act 2004 may comprise calculation of part or all of the drive waveforms based on the initial and final states identified in act 2002 (e.g., via the techniques discussed in relation to FIG. 19).

In act 2006, the drive waveforms obtained in act 2004 are applied concurrently to the oscillator and qubit of the system as described above in relation to FIGS. 15 and 16.

As discussed above, certain pulses applied to a physical qubit and to a quantum mechanical oscillator may cause a change in state of the qubit that depends upon the state of the oscillator. Thus, by observing the change in the state of the qubit as a result of application of these pulses, information about the state of the oscillator may be determined. As such, certain pulse waveforms may be used as tools to measure a state of the qubit-oscillator system.

To illustrate one example of pulses that perform such a measurement technique, FIGS. 21A-21D illustrate results of applying selected drive pulses to a circuit quantum electrodynamics system (e.g., system 1500 shown in FIG. 15 or system 1600 shown in FIG. 16) in order to perform measurement of a quantum mechanical oscillator. In the examples of FIGS. 21A-21D, the oscillator is being treated as a multi-qubit register. That is, since the photon number levels can be manipulated as discussed above, this state can be used to store multiple bits of information by viewing the state as a binary value. For example, when treating the oscillator as a two qubit register, the number states 0, 1, 2 and 3 may be viewed as storing the binary values 00, 01, 10 and 11, respectively. The oscillator may be viewed as a multi-qubit register having any suitable bit depth.

FIGS. 21A-21D illustrate results of applying pulse waveforms to a qubit and an oscillator to which the qubit is dispersively coupled, thereby measuring the parity of each bit of the oscillator's number state value. In the example of FIGS. 21A-21D, the qubit is initially in the ground state (e.g., may be driven to ground or otherwise) and pulse waveforms are applied to the qubit and oscillator. These pulse waveforms have been produced via the numerical techniques described above such that the measured state of the qubit after application of the pulses indicates the parity of a particular bit of the oscillator when treated as a multi-qubit register.

Figure 21A:
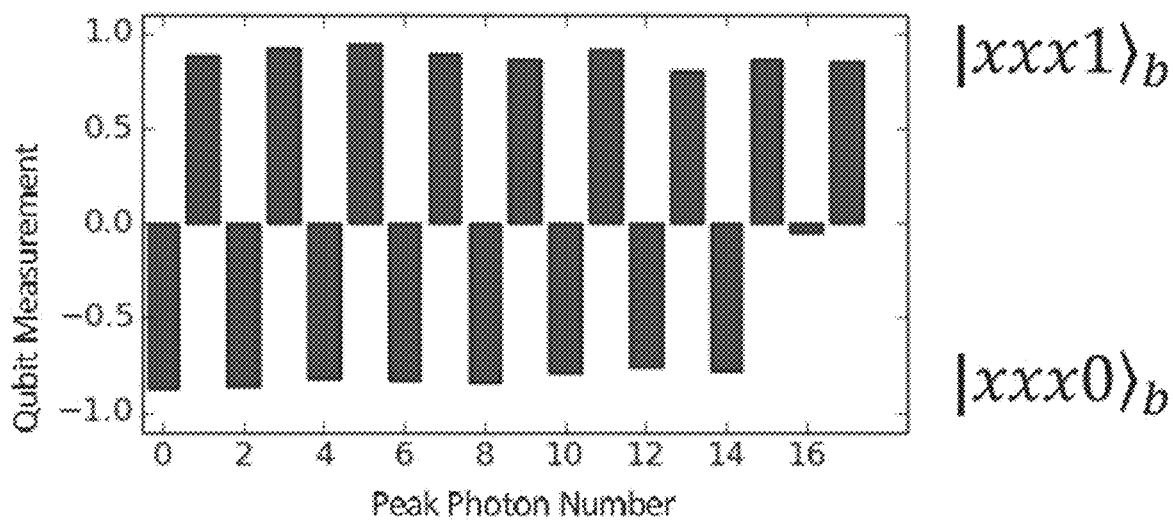
FIGS. 21A-21D illustrate results of applying selected drive pulses to a circuit quantum electrodynamics system in order to measure respective selected bits of a quantum mechanical oscillator being treated as a multi-qubit register, according to some embodiments.

In FIG. 21A, chart 2100 illustrates results of measuring the qubit after application of pulse waveforms designed to measure parity of the least significant bit of the oscillator being treated as a four qubit register. After application of the pulse waveforms, the qubit is in the excited state when the oscillator has odd parity and remains in the ground state when the oscillator has even parity. That is, the qubit is in the excited state when the photon number is odd, and is in the ground state when the photon number is even.

Figure 21B:
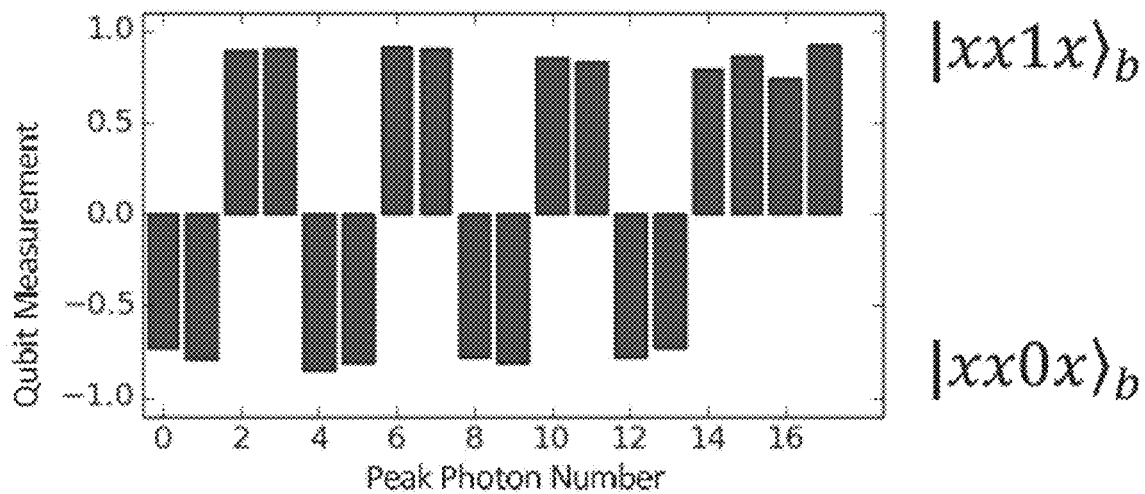
Figure 21C:
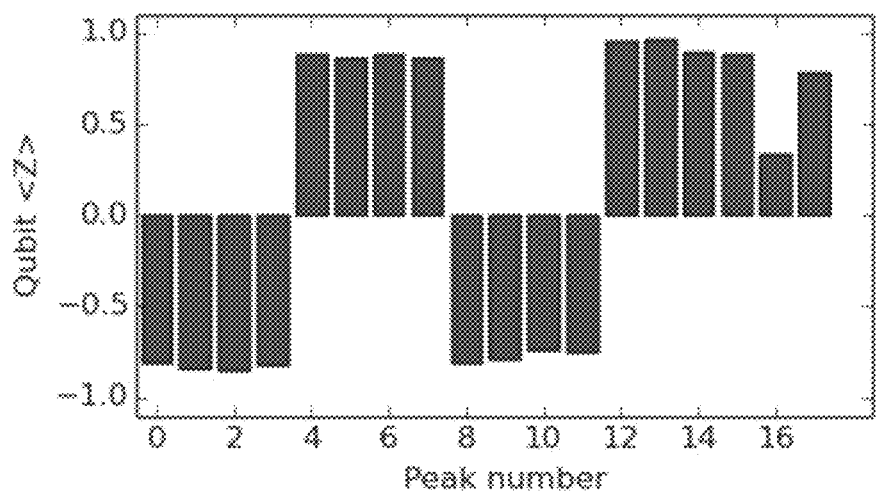
Figure 21D:
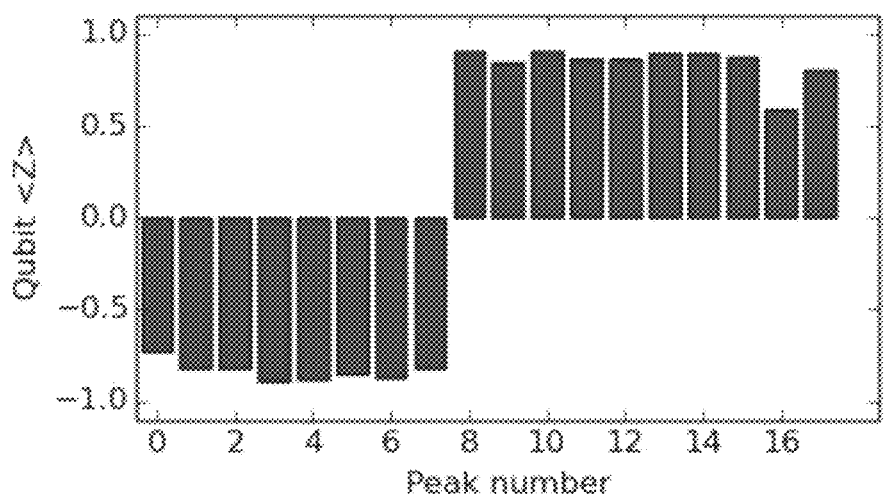

FIG. 21B illustrates results of measuring the qubit after application of pulse waveforms designed to measure parity of the second least significant bit. In this case, the qubit is in the excited state when the photon number divided by 2 is an odd number (ignoring remainders) and is in the ground state when the photon number divided by 2 is an even number (ignoring remainders). FIGS. 21C-21D similarly depict results of measuring the qubit after application of pulse waveforms designed to measure parity of the other bits of the four qubit register.

Figure 22:
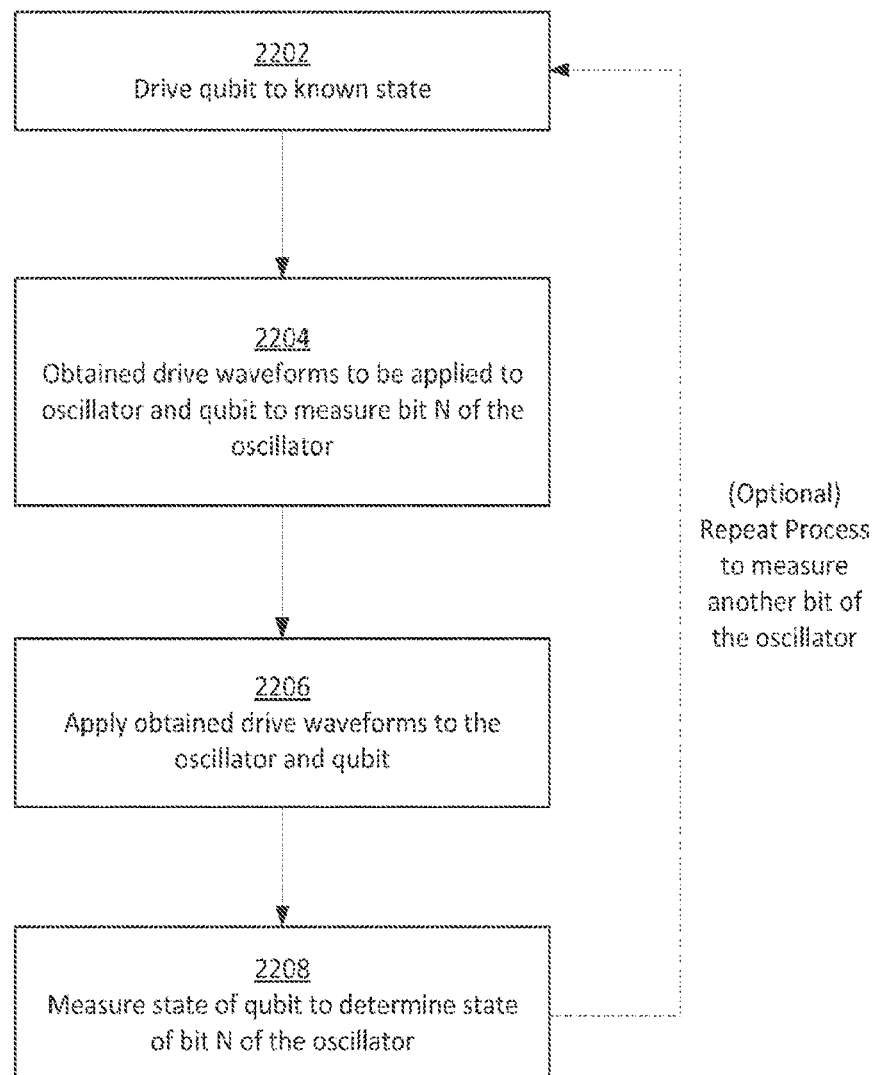
FIG. 22 is a flowchart of a method of measuring selected bits of a quantum mechanical oscillator being treated as a multi-qubit register, according to some embodiments.

FIG. 22 is a flowchart of a method of measuring selected bits of a quantum mechanical oscillator being treated as a multi-qubit register, according to some embodiments.

Method 2200 may be performed within any suitable quantum mechanical system such as system 1500 shown in FIG. 15 or system 1600 shown in FIG. 16.

In act 2202, the qubit of the system is driven to a known state (e.g., the ground state or the excited state). As discussed above, pulse waveforms may be produced that cause a change in the state of the qubit based on a state of the oscillator to which the qubit is coupled; as such, it is desirable that the qubit be in a known state prior to application of the pulse waveforms so the change in the qubit's state can be ascertained.

In act 2204, drive waveforms are obtained (e.g., from a library of precomputed drive waveforms) to measure a particular bit N of the oscillator when treated as a multi-qubit register. N may have any suitable value. In act 2206, the obtained drive waveforms may be applied to the qubit and oscillator as described above.

In act 2208, the state of the qubit may be measured and information about the state of the oscillator (e.g., bit N of the multi-qubit register) may be determined. The process of acts 2202, 2204, 2206 and 2208 may be optionally repeated any number of times to measure multiple bits of the register.

Figure 23:
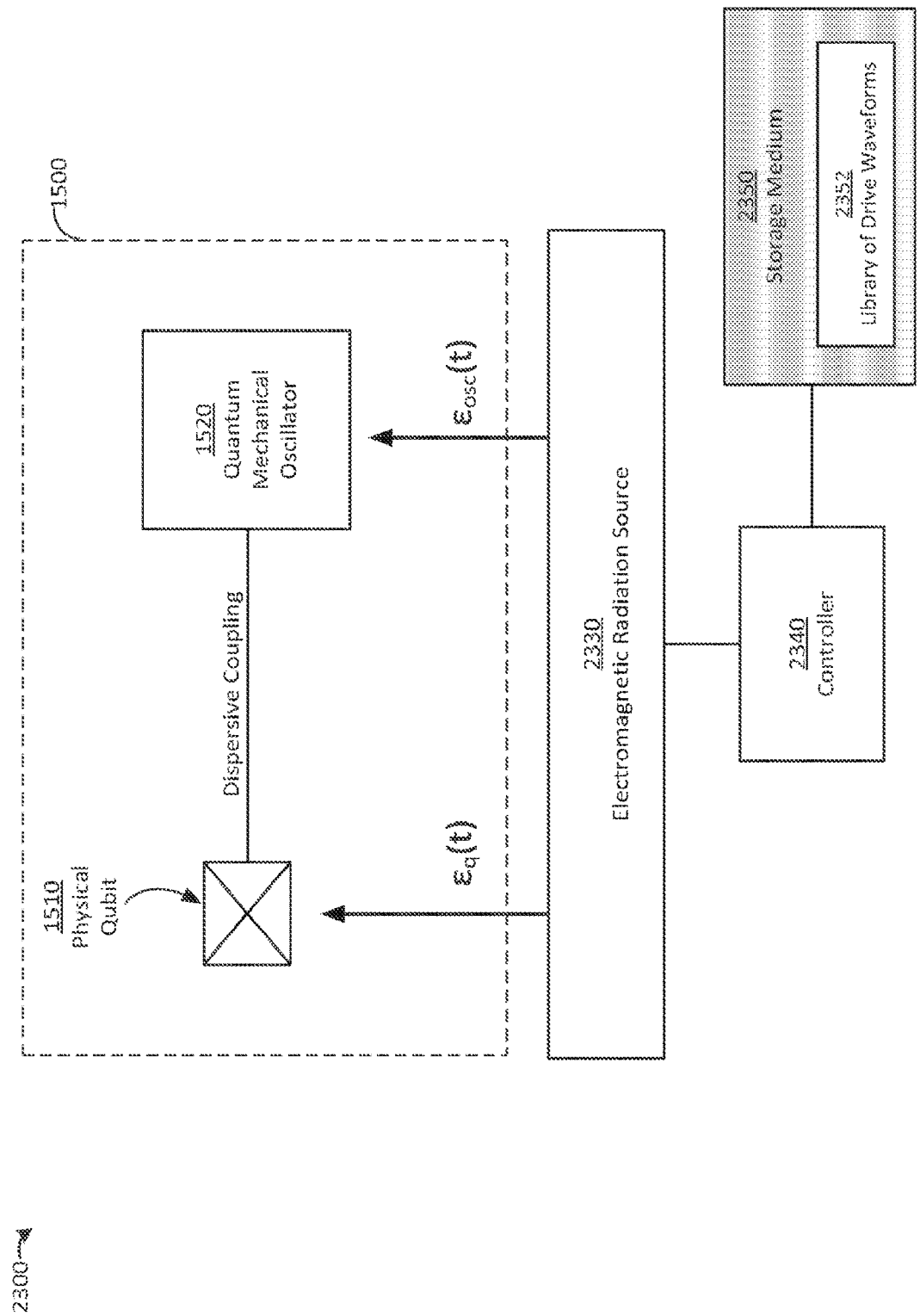
FIG. 23 is a block diagram of a circuit quantum electrodynamics system, according to some embodiments.

FIG. 23 is a block diagram of a circuit quantum electrodynamics system, according to some embodiments. System 2300 includes system 1500 in addition to electromagnetic radiation source 2330, controller 2340 and storage medium 2350. As discussed above, in some embodiments a library of precomputed drive waveforms may be stored on a computer readable storage medium and accessed in order to apply said waveforms to a quantum system. In the example of FIG. 23, controller 2340 accesses drive waveforms 2352 stored on storage medium 2350 (e.g., in response to user input provided to the controller) and controls the electromagnetic radiation source 2330 to apply the drive waveforms $\varepsilon_q(t)$ and $\varepsilon_{osc}(t)$ to the qubit and oscillator, respectively.

APPENDIX B—Techniques for Quantum Error Correction Using Bosonic Modes and Related Systems and Methods The techniques described in this appendix relate to an improved quantum error correction technique for correcting errors in the state of a quantum system exhibiting one or more bosonic modes. An "error" in this context refers to a change in the state of the quantum system that may be caused by, for instance, boson losses, boson gains, dephasing, time evolution of the system, etc., and which alters the state of the system such that the information stored in the system is altered.

As discussed above, quantum multi-level systems such as qubits exhibit quantum states that, based on current experimental practices, decohere in around ~100 μs. While experimental techniques will undoubtedly improve on this and produce qubits with longer decoherence times, it may nonetheless be beneficial to couple a multi-level system to another system that exhibits much longer decoherence times. As will be described below, bosonic modes are particularly desirable for coupling to a multi-level system. Through this coupling, the multi-level system's state may be represented by the bosonic mode(s) instead, thereby maintaining the same information yet in a longer-lived state than would otherwise exist in the multi-level system alone.

Quantum information stored in bosonic modes may nonetheless have a limited lifetime, such that errors will still occur within the bosonic system. It may therefore be desirable to manipulate a bosonic system when errors in its state occur to effectively correct those errors and thereby regain the prior state of the system. If a broad class of errors can be corrected for, it may be possible to maintain the state of the bosonic system indefinitely (or at least for long periods of time) by correcting for any type of error that might occur.

The fields of cavity quantum electrodynamics (cavity QED) and circuit QED represent one illustrative experimental approach to implement quantum error correction. In these approaches, one or more qubit systems are each coupled to a resonator cavity in such a way as to allow mapping of the quantum information contained in the qubit(s) to and/or from the resonator(s). The resonator(s) generally will have a longer stable lifetime than the qubit(s). The quantum state may later be retrieved in a qubit by mapping the state back from a respective resonator to the qubit.

When a multi-level system, such as a qubit, is mapped onto the state of a bosonic system to which it is coupled, a particular way to encode the qubit state in the bosonic system must be selected. This choice of encoding is often referred to simply as a "code."

As an example, a code might represent the ground state of a qubit using the zero boson number state of a resonator and represent the excited state of a qubit using the one boson number state of the resonator. That is:

$$(\alpha|g\rangle + \beta|e\rangle) \otimes |0\rangle \rightarrow |g\rangle \otimes (\alpha|0\rangle + \beta|1\rangle)$$

where $|g\rangle$ is the ground state of the qubit, $|e\rangle$ is the excited state of the qubit, $\alpha$ and $\beta$ are complex numbers representing the probability amplitude of the qubit being in state $|g\rangle$ or $|e\rangle$, respectively, and $|0\rangle$ and $|1\rangle$ are the zero boson number state and one boson number state of the resonator, respectively. While this is a perfectly valid code, it fails to be robust against many errors, such as boson loss. That is, when a boson loss occurs, the state of the resonator prior to the boson loss may be unrecoverable with this code.

The use of a code can be written more generally as:

$$(\alpha|g\rangle + \beta|e\rangle) \otimes |0\rangle \rightarrow |g\rangle \otimes (\alpha|W_\downarrow\rangle + \beta|W_\uparrow\rangle)) \quad \text{(Eqn. B1)}$$

where $|W_\downarrow\rangle$ and $|W_\uparrow\rangle$ are referred to as the logical codewords (or simply "codewords"). The choice of a code—equivalently, the choice of how to encode the state of a two-level system (e.g., a qubit) in the state of the bosonic system—therefore includes choosing values for $|W_\downarrow\rangle$ and $|W_\uparrow\rangle$. FIGS. 24A-24B graphically depict this process of encoding for some choice of $|W_\downarrow\rangle$ and $|W_\uparrow\rangle$.

When an error occurs, the system's state transforms to a superposition of resulting states, herein termed "error words," $|E_\downarrow^k\rangle$ and $|E_\uparrow^k\rangle$ as follows:

$$\alpha|W_\downarrow\rangle + \beta|W_\uparrow\rangle \rightarrow \alpha|E_\downarrow^k\rangle + \beta|E_\uparrow^k\rangle \quad \text{(Eqn. B2)}$$

where the index k refers to a particular error that has occurred. As discussed above, examples of errors include boson loss, boson gain, dephasing, amplitude dampening, etc.

In general, the choice of code affects how robust the system is to errors. That is, the code used determines to what extent a prior state can be faithfully recovered when an error occurs. A desirable code would be associated with a broad class of errors for which no information is lost when any of the errors occurs and any quantum superposition of the logical codewords can be faithfully recovered. Some codes, while robust against certain errors, may however be impractical to realize in a physical system.

A class of codes has been recognized and appreciated that protect against a wide array of errors that can occur in a bosonic system, including boson gain, boson loss, dephasing, and amplitude dampening, and that can be realized experimentally. Codes from this class are referred to herein as "binomial codes," since the class of codes may be described by a binomial distribution, as described below. Techniques for correcting errors have been developed when a code from this class is utilized to store a state in a bosonic system. In particular, unitary operations have been developed that may be applied to the bosonic system based upon a detected error. Furthermore, experimental configurations have been recognized and appreciated in which energy may be applied to a bosonic system, such as a cavity resonator, to perform the above-mentioned unitary operations.

According to some embodiments, a binomial code may be used to configure a state of a single mode bosonic system. Bosonic systems may be particularly desirable systems in which to apply the techniques described herein, as a single bosonic mode may exhibit equidistant spacing of coherent states. A resonator cavity, for example, is a simple harmonic oscillator with equidistant level spacing. Bosonic modes are also helpful for quantum communications in that they can be stationary for quantum memories or for interacting with conventional qubits, or they can be propagating ("flying") for quantum communication (e.g., they can be captured and released from resonators). A single bosonic mode in particular may allow for states having lower mean bosonic numbers than states produced by multiple bosonic modes. Since boson loss rate tends to scale with mean boson number, a single bosonic mode will generally have a lower error rate than multiple bosonic modes. Moreover, error correction of a single bosonic mode does not require mode-to-mode entangling operations that would otherwise be needed for multiple bosonic modes. The binomial codes described herein utilize bosonic number states of a single bosonic mode to represent the codewords, as described below.

According to some embodiments, a bosonic system may be used in conjunction with a binomial code to act as a quantum memory device. A multi-level system, such as a qubit, may store one or more quantum bits in a state that will decoherence in a short time scale, as described above. This state may instead be stored in a bosonic system encoded via the selected binomial code. This system will also decoherence, although typically in a longer time scale than that exhibited by the multi-level system. The binomial code may allow for correction of errors that occur to a perfect, or near perfect, degree such that the state of the bosonic system can be maintained. In this manner, the bosonic system acts as a quantum memory with respect to the quantum bit(s) originally stored in the multi-level system. If desired, the state in the bosonic system can be later transferred back to the multi-level system.

According to some embodiments, a detector may be configured to monitor the bosonic system to detect when an error occurs. It is a feature of the binomial codes described herein that such a detector may be able to detect whether any error occurred, and also detect which type of error occurred, whilst preserving the state of the bosonic system. This type of measurement is sometimes referred to as a quantum nondemolition measurement (QND). Not all codes exhibit this feature, as for some codes a detection of an error may yield information on which of the two codewords is a more likely state of the system (recall that a given code stores a state in a quantum superposition of the two selected codewords). This carrying away of information as result of the measurement causes a change in the state of the quantum system.

In contrast, the binomial codes described herein provide for detection of a broad class of errors, where in each case detection does not change the boson number of the state of the system. When a measurement of the bosonic system does not detect an error, however, the backaction of this operation causes amplitude damping of the bosonic mode. Amplitude damping does not change the boson number of the bosonic system, but does change the probabilities of measuring each of the different boson numbers. The binomial codes described herein provide an explicit construction for repumping energy into the bosonic system to recover from amplitude damping, however. Accordingly, whether an error is detected or not, techniques described herein in conjunction with a binomial code allow maintenance of the bosonic system's state via application of a unitary operation to counteract the amplitude dampening effect.

An illustrative example of correcting errors using one of the binomial codes may be instructive. One of the binomial codes uses the following codewords (that is, a bosonic system is encoded in a superposition of the two codeword states as shown in FIGS. 24A-24B):

$$|W_\downarrow\rangle = \frac{1}{2}\{|0\rangle + |4\rangle\} \quad \text{(Eqn. B3)}$$

$$|W_\uparrow\rangle = |2\rangle$$

Note that, for this pair of codewords, the mean boson number $\bar{n}=2$ for each state. Accordingly, the loss or gain of a boson (for example) does not produce information on which of the two codeword states the photon came from. This preserves the number state of the bosonic system upon detection of the boson loss or gain.

If this bosonic system were to lose a boson (e.g., due to energy loss), it would be transformed as follows:

$$a|W_\downarrow\rangle = |E_\downarrow^1\rangle = \sqrt{2}|3\rangle$$

$$a|W_\uparrow\rangle = |E_\uparrow^1\rangle = \sqrt{2}|1\rangle$$

where a is the annihilation operator.

One way to think about this transformation is that, if the system were in the $|W_\downarrow\rangle$ state, which is a superposition of $|0\rangle$ and $|4\rangle$, clearly a lost boson must have come from the $|4\rangle$ state and not the ground state. As such, the resulting state would be the $|3\rangle$ state. Similarly, if the system were in the $|W_\uparrow\rangle$ state, which is the $|2\rangle$ state, the resulting state after boson loss would be the $|1\rangle$ state.

If the bosonic system were a photonic system, one way to detect the photon loss would be to detect the photon exiting the system using a photodetector. In many experimental configurations, however, this may be difficult or impractical to perform. As such, another way to detect boson loss is to examine the parity (odd or even boson number state). Before the error, both codeword states would produce even parity, since all of the boson number states of those codewords are even parity states. After the boson loss, the parity would be odd, irrespective of the particular superposition of error word states, since both have odd parity. This is an example of a measurement that, as described above, does not alter the bosonic number state of the system, since the information that is carried away is that a boson was lost, yet this information is provided without including any information on which of the codeword states the system is in.

Once the boson loss has been detected, the system can be driven to the previous state by applying a unitary operation that performs the following transformation:

$$|3\rangle \rightarrow |W_\downarrow\rangle$$

$$|1\rangle \rightarrow |W_\uparrow\rangle \quad \text{(Eqn. B4)}$$

A system configured to have universal control over the quantum state of a system, examples of which are discussed below, can be operated to perform this type of state transformation. One reason the binomial codes allow for this type of correction is that the error words (e.g., |3> and |1> in the above example) for a binomial code are orthogonal. Therefore, a conditional unitary operation can be applied to transform the error word states into the corresponding codeword states irrespective of which of the error word states the system was in.

Figure 25:
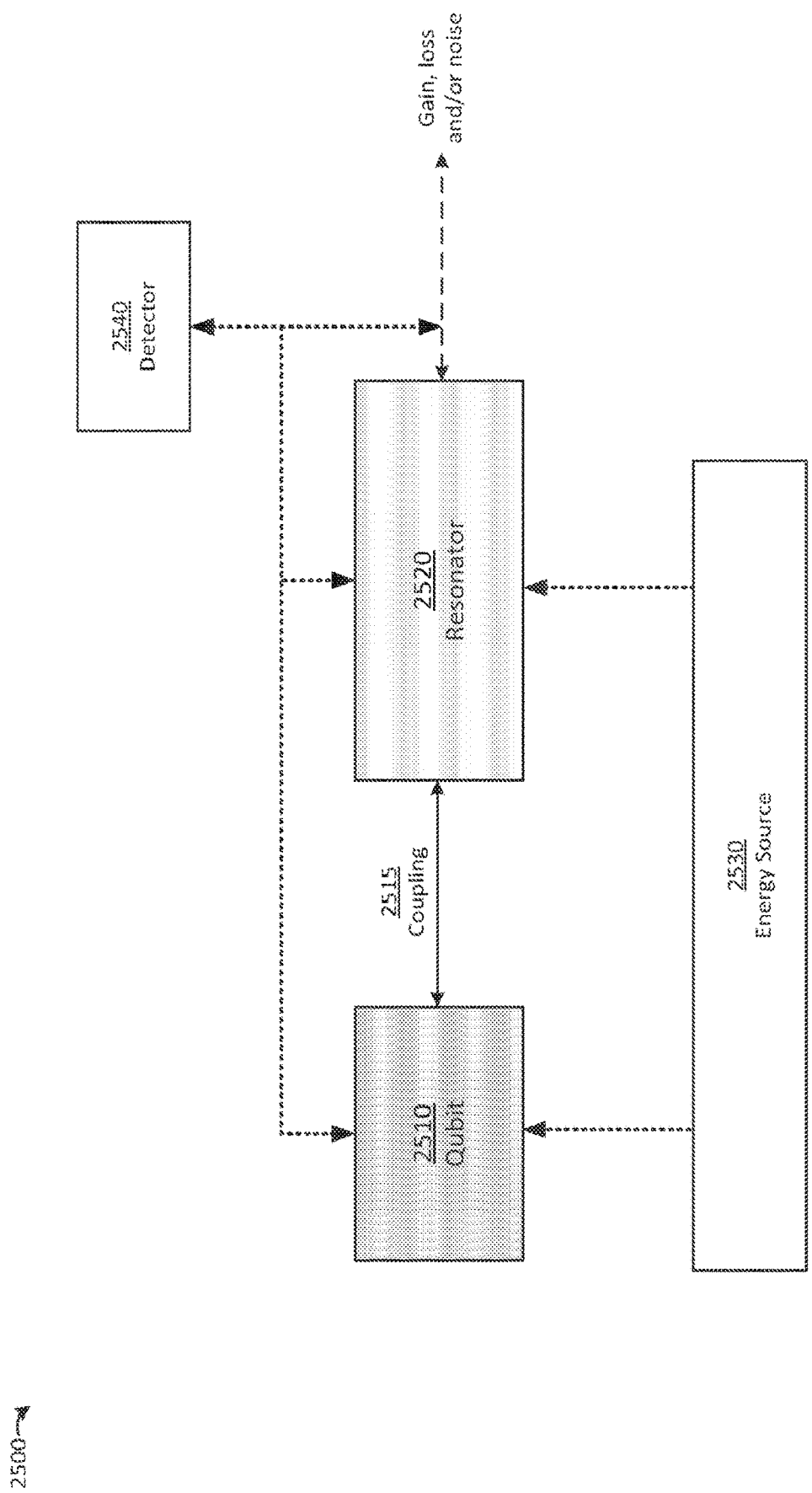
FIG. 25 depicts an illustrative system suitable for practicing quantum control techniques described herein.

FIG. 25 depicts an illustrative system suitable for practicing aspects of the quantum control techniques described herein. In system 2500, qubit 2510 is coupled to a resonator 2520 via coupling 2515. The resonator may lose or gain energy (e.g., lose or gain bosons), may dephase, etc. and in the process may gain or lose energy as shown in the figure. Energy source 2530 may supply energy to one or both of qubit 2510 and resonator 2520 in order to perform operations on the system such an encoding the state of the qubit in the resonator, encoding the state of the resonator in the qubit, applying unitary operations to the resonator (e.g., to correct an error detected in the resonator), applying unitary operations to the qubit, or combinations thereof.

It will be appreciated that any multi-level quantum system coupled to a bosonic system may be utilized with the binomial codes, as discussed above, but system 2500 is provided as one illustrative system in which a qubit is coupled to a resonator. A mode of the resonator provides the bosonic mode in this example.

System 2500 also includes detector 2540 which may be operated to detect the occurance of an error in the resonator 2520. A number of suitable approaches may be employed to operate such a detector, which may measure energy gain and/or loss from the resonator, may interact with the qubit 2510 (e.g., may apply one or more unitary operations to the qubit and/or may measure the state of the qubit), and/or may interact with the resonator 2520 (e.g., may apply one or more unitary operations to the resonator and/or may measure the state of the resonator). Any combination of such operations may obtain sufficient information about the qubit-resonator system to determine whether an error has occurred in the resonator 2520. In some embodiments, detector 2540 applies one or more unitary operations to the qubit 2510 and/or the resonator 2520 by application of energy from energy source 2530.

According to some embodiments, the detector 2540 comprises a photodetector or other particle detector configured to detect particles entering and/or exiting the resonator 2520. According to some embodiments, detector 2540 may perform a sequence of operations to measure one or more of parity mod 2, parity mod 3, parity mod N, etc. of the state of the resonator. As discussed below, such measurements may indicate whether boson losses or gains have occurred.

Qubit 2510 may include any suitable quantum system having two distinct states, such as but not limited to, those based on a superconducting Josephson junction such as a charge qubit (Cooper-pair box), flux qubit or phase qubit, or combinations thereof. The qubit 2510 may be coupled to the resonator 2520 via coupling 2515 which couples the state of the qubit to the state of the resonator. The resonator 2520 may include any resonator supporting one or more bosonic modes, which may be implemented using any electromagnetic, mechanical, magnetic (e.g., quantized spin waves also known as magnons), and/or other techniques, such as but not limited to any cavity resonator (e.g., a microwave cavity). According to some embodiments, resonator 2520 may be a transmission line resonator.

As an illustrative embodiment, qubit 2510 may be a charge qubit coupled to a superconducting transmission line cavity (an example of resonator 2520) comprising a central conductor and ground planes on either side of the conductor separated by a length selected based upon the wavelength of photons trapped in the cavity. For instance, the length of the resonator may be a multiple of one half of such a wavelength. A length of the transmission line may also be selected based upon a desired impendence of the transmission line. According to some embodiments, a transmission line may have a length between 1 µm and 100 µm, such as between 5 µm and 50 µm, such as 10 µm. According to some embodiments, a transmission line may have a length between 5 mm and 50 mm, such as between 10 mm and 30 mm, such as 25 mm. The qubit may interact with the electric fields in the transmission line such that an adjustment to the state of the qubit causes an adjustment in the state of the resonator.

Coupling 2515 may utilize any technique(s) to couple the qubit and the resonator, such as by coupling the electric and/or magnetic fields generated by the qubit and the resonator. According to some embodiments, the qubit and the resonator may be dispersively coupled via the coupling 2515. According to some embodiments, the qubit (e.g., a transmon) may be coupled to the resonator, being a mechanical resonator, via a piezoelectric coupling. According to some embodiments, the qubit may be coupled to the resonator, being a magnetic resonator, by coupling the qubit (e.g., a transmon) to phonons, which in turn couple to magnons via magnetostrictive coupling.

The system of FIG. 25 may be used in at least the following two use case scenarios. First, resonator 2520 may be used as a memory to store the state of qubit 2510. The state of the resonator may be error-corrected using the techniques described herein. Subsequently, the state may be mapped to qubit 2510 and/or any other qubit. Second, the resonator 2520 may be used as a transmission medium to transport the state of qubit 2510 to another qubit, along a transmission line, and/or to another resonator. The state of the resonator during transmission may be error-corrected using the techniques described below. Subsequently, the state may be mapped to a target of the transmission. In each of these use cases, and in any other suitable use of the system 2500, a state may be represented in the resonator 2520 using one of the binomial codes. Furthermore, the energy source 2530 may apply energy to the qubit and/or the resonator to correct errors based on the selected binomial code, as described in further detail below.

As discussed above, quantum error correction comprises selecting logical codewords with which to represent a state, such as the state of a qubit. These codewords are states embedded in a large Hilbert space, such as the space of a harmonic oscillator, such that no information is lost if any one of the single, independent error $\hat{E}_k \in \varepsilon$ occurs and any quantum superposition of the logical codewords $|W_\sigma\rangle$, where $\sigma = \uparrow, \downarrow$, can be faithfully recovered. This is equivalent to finding two logical codewords that satisfy the quantum error correction criteria, known also as the Knill-Laflamme conditions:

$$\langle W_\sigma | \hat{E}_l^\dagger \hat{E}_k | W_{\sigma'} \rangle = \alpha_{lk} \delta_{\sigma\sigma'}, \quad \text{(Eqn. B5)}$$

for all $\hat{E}_{l,k} \in \varepsilon$ (where $\varepsilon$ is the set of correctable errors for the code) such that $\alpha_{kl}$ are entries of a Hermitian matrix and independent of the logical words. The diagonal entries $\alpha_{kk}$ are the probabilities of the errors $\hat{E}_k$. The independence of entries $\alpha_{kl}$ from the logical codewords and the structure of the non-diagonal entries cause the different errors to be distinguishable and correctable.

In system 2500, a binomial code may be used to encode the state of the resonator 2520 based on the state of the qubit 2510. Techniques for universal control may be applied to produce a superposition of the codeword states in the resonator based on the superposition of the ground and excited states present in the qubit, as shown in FIGS. 24A-24B. As discussed above, in general such techniques may comprise operating energy source 2530 to apply energy in a sequence of steps, wherein each step comprises application of energy to the qubit 2510, to the resonator 2520, or simultaneously to both the qubit and resonator.

For example, the encoding of a qubit state into a resonator state, as show in FIGS. 24A-24B, may be achieved as follows. Beginning with the state shown in FIG. 24A, with the resonator in the ground state (zero bosons), drive pulses are simultaneously applied to the qubit 2510 and the resonator 2520, which excite the bosonic mode while ultimately returning the qubit to the ground state. If the qubit 2510 is initially in the ground state $|g\rangle$, the drive pulses excite the bosonic mode 2520 to state $|W_\downarrow\rangle$ but ultimately return the qubit 2510 to its ground state. If the qubit 2510 is initially in the excited state $|e\rangle$, the drive pulses excite the bosonic mode to state $|W_\uparrow\rangle$ while driving the qubit 2510 back to its ground state $|g\rangle$. In other words, the final state of the bosonic mode 2520 is conditioned on the initial state of the qubit 2510. Put another way, these drive pulses carry out the unitary state transfer operation:

$$U = |g\rangle|W_\downarrow\rangle\langle 0|\langle g| + |g\rangle|W_\downarrow\rangle\langle 0|\langle e| + |g\rangle|0\rangle\langle W_\downarrow|\langle g| + |e\rangle|0\rangle\langle W_\uparrow|\langle g| + U_{rest}$$

where the remaining terms $U_{rest}$ of the unitary operation are irrelevant to the particular unitary state transfer operation. The freedom to choose $U_{rest}$ may be used to vary the applied drive pulses to optimize the fidelity of the state transfer operation.

According to some embodiments, the binomial codes may protect against up to L boson loss events occurring in the time interval dt between two consecutive quantum correction stages. Consider the set of discrete errors $\bar{\varepsilon}_L = \{1, \hat{a}, \hat{a}^2 \ldots \hat{a}^L\}$ where a is the annihilation operator, and "1" is the identity operator and represents no error.

Although protection against boson loss errors will be initially discussed, this will be generalized below to codes that are designed to also protect against boson gain $\hat{a}^\dagger$, dephasing errors $\hat{n}$, and amplitude damping. As used herein, a code that "protects" against a particular error means that the code is such that, when the error occurs, the previous state is recoverable via one or more unitary operations.

As discussed above, one example of a code protecting against $\bar{\varepsilon}_1 = \{1, \hat{a}\}$ (either no error or the loss of a single boson) is $$W_\uparrow = \frac{|0\rangle + |4\rangle}{\sqrt{2}}, W_\downarrow = |2\rangle. \quad \text{(Eqn. B6)}$$

A boson loss error brings the logical codewords $|W_\downarrow\rangle$ and $|W_\uparrow\rangle$ to a subspace with odd boson numbers that is disjoint from the even-parity subspace of the logical codewords and therefore, the off-diagonal parts of the QEC matrix $\alpha$ in (Eqn. B5) are identically zero. The remaining diagonal part of $\alpha$ indicates that the mean boson number is identical for both of the states, here $\bar{n}=2$, meaning that the probability of a boson jump to occur or not to occur is equally likely for both of the states implying that the quantum state is not deformed under an error. Explicitly, if a quantum state $|\psi\rangle = \alpha|W_\uparrow\rangle + \beta|W_\downarrow\rangle$ suffers a boson jump, it is transformed to $|\psi'\rangle = \hat{a}|\psi\rangle/\sqrt{\langle\psi|\hat{a}^\dagger\hat{a}|\psi\rangle} = \alpha|E_\uparrow^1\rangle + \beta|E_\downarrow^1\rangle$, where the error words are $|E_\uparrow^1\rangle = |3\rangle$ and $|E_\downarrow^1\rangle = |1\rangle$, and $\hat{a}^\dagger$ and $\hat{a}$ are the creation and annihilation operators, respectively.

An example of a code protecting against $\bar{\varepsilon}_2 = \{1, \hat{a}, \hat{a}^2\}$ is:

$$|W_\uparrow\rangle = \frac{|0\rangle + \sqrt{3}|6\rangle}{2}, |W_\downarrow\rangle = \frac{\sqrt{3}|3\rangle + |9\rangle}{2}. \quad \text{(Eqn. B7)}$$

For this code, in addition to the codewords having the same mean boson number, the error words $|E_o^1\rangle = \hat{a}|W_o\rangle/\sqrt{\langle W_o|\hat{a}^\dagger\hat{a}|W_o\rangle}$, $|E_\uparrow^1\rangle = |5\rangle$ and $|E_\downarrow^1\rangle = (|2\rangle + |8\rangle)/\sqrt{2}$ have the same mean boson number. In contrast, the code of (Eqn. B6) has codewords with the same mean boson number but, upon loss of a boson, the error words have different mean boson numbers. In view of this, the code of (Eqn. B7) can tolerate another boson loss error and the protected error set is $\bar{\varepsilon}_2 = \{1, \hat{a}, \hat{a}^2\}$. For this case, the boson loss errors can be detected by measuring boson number mod 3. The error recovery procedure is similar as above: an error detection is followed by a unitary operation performing a state transfer $|W_o\rangle \leftrightarrow |E_o^k\rangle$. It may be shown that a family of codes can be developed that protect against any arbitrary number of boson loss errors L.

In system 2500, another error that might occur is dephasing of the resonator 2502 due to frequency fluctuations of the resonator (e.g., noise coupling to the boson number $\hat{n}$, for example caused by transitions of the coupled qubit 2501). The code of (Eqn. B7) also protects also against a dephasing error $\hat{n}$, and thus the full error set is $\bar{\varepsilon}_2 = \{1, \hat{a}, \hat{a}^2, \hat{n}\}$. Since a dephasing error does not change the boson number, it leads to an error state $|\psi'\rangle = \hat{n}|\psi\rangle/\sqrt{\langle\psi|\hat{n}^2|\psi\rangle}$, $$|\psi'\rangle = \alpha\frac{\sqrt{3}|W_\uparrow\rangle - |E_\uparrow^n\rangle}{2} + \beta\frac{\sqrt{3}|W_\downarrow\rangle - |E_\downarrow^n\rangle}{2}. \quad \text{(Eqn. B8)}$$

which is a superposition of the original words and the error words related to the dephasing $|E_\uparrow^n\rangle = (\sqrt{3}|0\rangle - |6\rangle)/2$ and $|E_\downarrow^n\rangle = (|3\rangle - \sqrt{3}|9\rangle)/2$. One way to detect the dephasing error is to apply unitary operations that produce projective measurements into the logical word basis $\hat{P} = W \Sigma_o |W_o\rangle\langle W_o|$, and if the answer is negative (and no boson loss errors were detected) dephasing is detected. The original state can then be recovered by making a unitary operation performing a state transfer $|E_o^n\rangle \leftrightarrow |W_o\rangle$.

The code of (Eqn. B7) can instead be chosen to protect against errors $\bar{\varepsilon}'_2 = \{1, \hat{a}, \hat{a}^\dagger, \hat{n}\}$ (=no error, single boson loss, single boson gain, dephasing) since a boson addition error and two boson loss errors have the same change in the boson number mod 3, and the logical code words already obey the QEC condition for the boson gain error: $\langle W_o|\hat{a}\hat{a}^\dagger|W_{o'}\rangle = (\bar{n}+1)\delta_{oo'}$. As a special case, one can choose to protect only against $\varepsilon'_1 = \{1, \hat{a}, \hat{n}\}$ achieved by the same Fock state coefficients as with the code (Eqn. B7) but with spacing of the code (Eqn. B6):

$$|W_\uparrow\rangle = \frac{|0\rangle + \sqrt{3}|4\rangle}{2}, W_\downarrow = \frac{\sqrt{3}|2\rangle + |6\rangle}{2}, \quad \text{(Eqn. B9)}$$

It may be noted that the broader the class of error for which a code protects against, the larger the error rates are, as codes involve higher Fock states the broader the class becomes and higher Fock states produce more errors.

The above codes can be generalized to protect against the error set that includes up to L boson losses; up to G boson gain errors; and up to D dephasing events:

$$\bar{\varepsilon} = \{1, \hat{a}, \hat{a}^2, \ldots, \hat{a}^L, \hat{a}^\dagger, \ldots, (\hat{a}^\dagger)^G, \hat{n}, \hat{n}^2, \ldots, \hat{n}^D\}. \quad \text{(Eqn. B10)}$$

Figure 29:
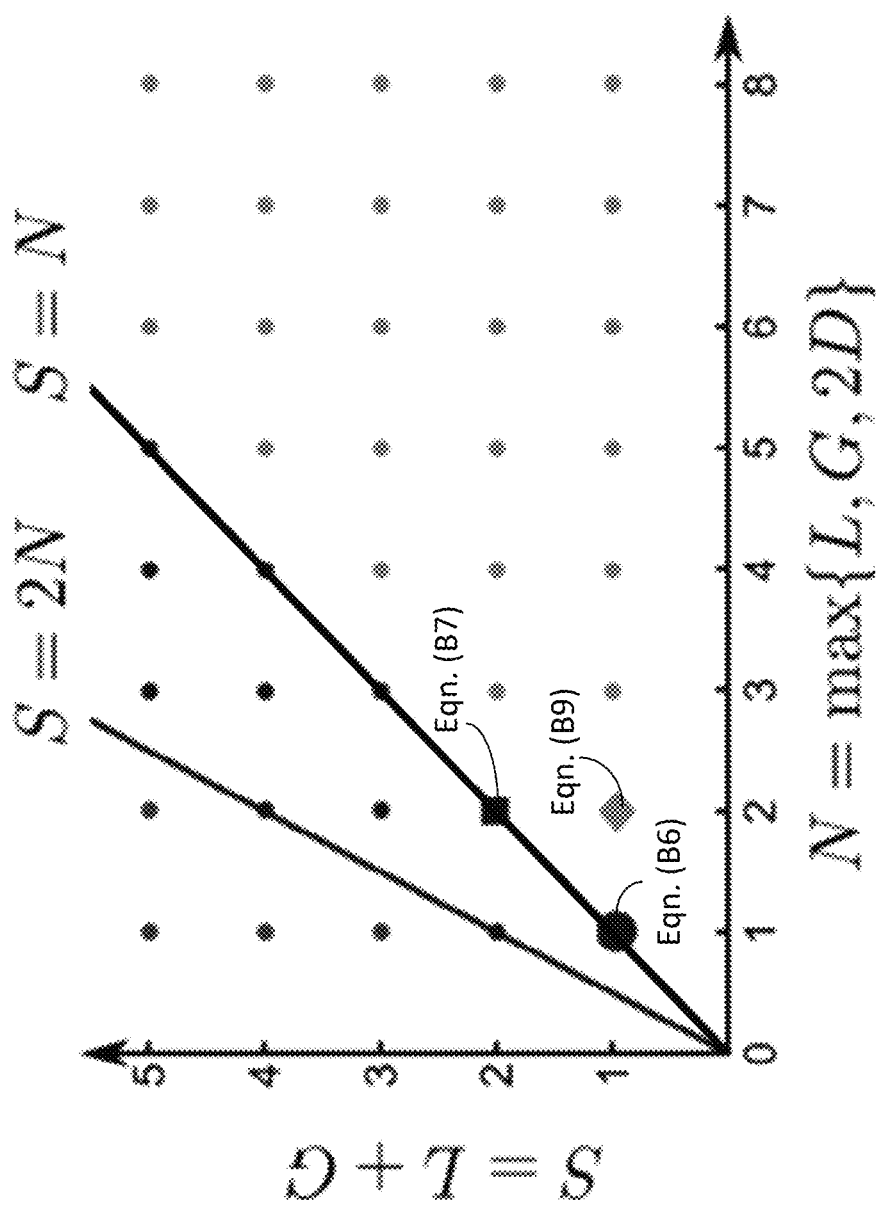
FIG. 29 illustrates a two-parameter (N, S) space of binomial quantum error correction codes, according to some embodiments.

It has been recognized that a class of codes which can correct for errors arising from this error set are:

$$|W_{\uparrow/\downarrow}\rangle = \frac{1}{\sqrt{2^N}} \sum_{p \text{ even/odd}}^{N+1} \sqrt{\binom{N+1}{p}} |p(S+1)\rangle, \quad \text{(Eqn. B11)}$$

where S=L+G and N=max{L, G, 2D}. For example, Eqn. B11 with the values L=1, G=0 and D=0 produces the codewords of Eqn. B6. These codes have been referred to herein as "binomial codes" because the state amplitudes involve binomial coefficients (which, it should be noted, are independent of the spacing S). The two-parameter (N, S) code space of Eqn. B11 is shown in FIG. 29. To apply the error correction techniques described herein, a bosonic system that has a state encoding a two-level system may use any pair of codewords given by Eqn. B10 (i.e., for any combination of values of L, G and D) to describe the two level system; that is, the bosonic system may have a state $\alpha|W_\downarrow\rangle + \beta|W_\uparrow\rangle$ where $|W_\downarrow\rangle$ and $|W_\uparrow\rangle$ are given by Eqn. B11 for some combination of values of L, G and D.

It will be noted that the binomial codes operate in a restricted Hilbert space, which could be beneficial for the practical construction of the unitary operators required for error diagnosis and recovery. This may particularly apply to errors involving $\hat{a}^\dagger$ operators, whose operation on conventional codes may be less straightforward than $\hat{a}$ operators alone.

Returning to FIG. 25, the codes selected from the above-described class of binomial codes may be used to represent the state of qubit 2510 in the resonator 2520. Once an error occurs in the resonator, the error may be detected and operations may be performed to correct the error. The error-correction process is described in detail below with respect to FIG. 26.

Figure 26:
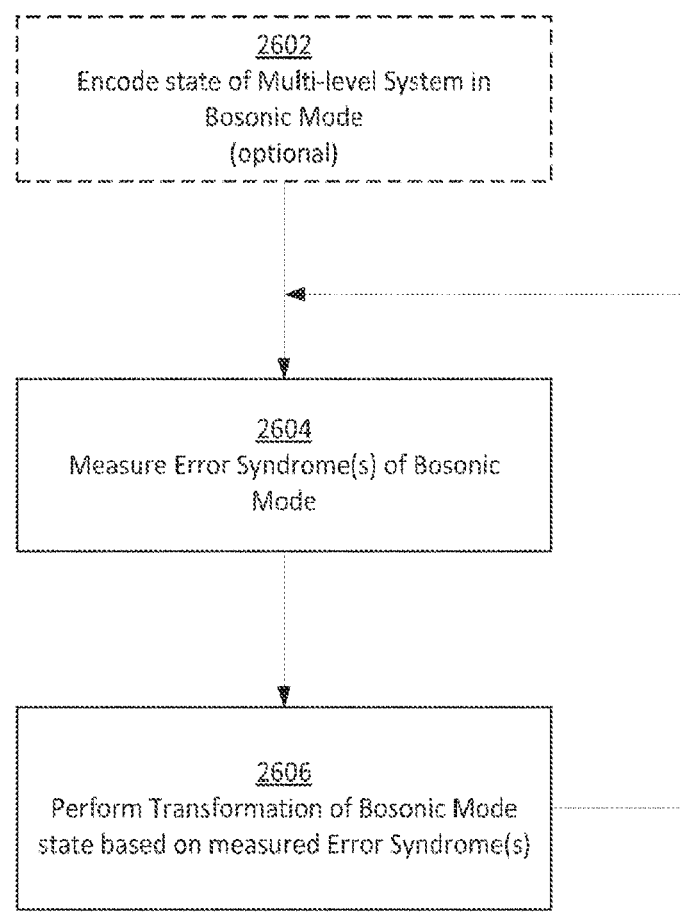
FIG. 26 is a flowchart of a method of correcting errors that occur within a bosonic system, according to some embodiments.

FIG. 26 is a flowchart of a method of correcting errors that occur within a bosonic system, according to some embodiments. FIG. 26 may be performed within system 2500 shown in FIG. 25, for example. Method 2600 includes steps of measuring an error syndrome of a bosonic system and performing a correction based on the measured error syndrome. Method 2600 also includes an optional initial step in which the bosonic mode's state is encoded based on a coupled multi-level system.

Method 2600 can optionally begin in act 2602 in which the state of a multi-level system is encoded in the state of a bosonic mode. In the case where the multi-level system is a qubit, this encoding may utilize any code selected from the above-described binomial codes to represent the state of the qubit in the bosonic mode. Alternatively, if the multi-level system is a qudit, this encoding may utilize a multinomial code to represent the state of the qubit in the bosonic mode. Any suitable technique may be applied to encode the state of a multi-level system in a bosonic mode, examples of which are described above.

Alternatively, method 2600 may begin in act 2604 wherein a bosonic mode has been previously configured with a state that is a superposition of a pair of codewords selected from the class of binomial codes or class of multinomial codes. Accordingly, irrespective of whether method 2600 includes the optional encoding act 2602, prior to act 2604 the bosonic mode is in a state that is a superposition of a pair of codewords selected from the class of binomial codes or class of multinomial codes. For example, if the bosonic mode of method 2600 represents a two-level system, it has a state that is a superposition of one of the pairs of codewords given by Eqn. B11.

In act 2604, an error syndrome of the bosonic mode is measured. An "error syndrome" as used herein refers to a measurement that is indicative that a particular error (or one of a group of particular errors) has occurred. One example of an error syndrome discussed above is a measurement that shows there has been a change in parity of the bosonic number state of the bosonic mode (or parity mod 3, parity mod 4, etc.). Another error syndrome is a measurement that indicates dephasing has occurred (an example of this type of measurement is discussed above). Another error syndrome is a measurement that indicates no error has occurred. Since the act of measuring the bosonic mode can cause amplitude damping of the mode, a measurement indicating no error has occurred may nonetheless lead to action based on this measurement, and therefore "no error" is also considered an error syndrome.

According to some embodiments, detecting a boson loss or gain error in act 2604 may comprise a sequence of operations in which energy is applied to the bosonic mode directly and/or to another system to which the bosonic mode is coupled. For example, in a system comprising a resonator (e.g., microwave cavity) with a strong dispersive coupling to a qubit, where the strength of the dispersive coupling is stronger than the decay rates of the qubit and the resonator, the qubit can be driven conditioned on given boson number states of the resonator. The electromagnetic pulse applied to the qubit can be selected such that, for example, the qubit will be in a particular state after application of the pulse that depends upon the boson number state of the resonator. Measurement of the qubit then indicates the parity of the coupled resonator. According to some embodiments, a measurement of boson number mod (S+1) comprises performing S sequential measurements of the two-level qubit.

According to some embodiments, detection of a dephasing error in act 2604 may be made by projective measurements $\hat{P}_d = \Sigma_\sigma |E_\sigma^d\rangle\langle E_\sigma^d|$, for d=0, 1, ..., N. Here, $|E_\sigma^d\rangle$ are linear combinations of $\{n^l|W_\sigma\rangle\}_{l=0, 1, \ldots, N}$ that satisfy the orthonormal condition:

$$\langle E_\sigma^d | E_{\sigma'}^{d'} \rangle = \delta_{d,d'} \delta_{\sigma,\sigma'}$$

for d, d'=0, 1, ..., N. Similar to the detection of boson gain or loss errors, the detection of a dephasing error may comprise a sequence of operations in which energy is applied to the bosonic mode directly and/or to another system to which the bosonic mode is coupled.

For example, in a system comprising a resonator (e.g., microwave cavity) with a strong dispersive coupling to a qubit, electromagnetic pulses applied to the resonator and qubit can be selected such that, after application of the pulse(s), the qubit will be in a particular state that depends on the resonator being in the subspace spanned by $\{|E_\uparrow^d\rangle, |E_\downarrow^d\rangle\}$ for some d. Measurement of the qubit would then indicate whether the oscillator is in the subspace spanned by $\{|E_\uparrow^d\rangle, |E_\downarrow^d\rangle\}$ or not. If the oscillator is found to be within this subspace, one or more electromagnetic pulses (which may be, for example, pre-computed) can be applied to the system to carry out unitary state transfer from $|E_\uparrow^d\rangle$ to $|W_\uparrow\rangle$, and from $|E_\downarrow^d\rangle$ to $|W_\downarrow\rangle$.

According to some embodiments, a measurement of $\hat{P}_d$ for d=0, 1, ..., N may comprise performing N+1 sequential measurements of a two-level qubit.

According to some embodiments, act 2604 comprises detection of "no error," also referred to herein as a "no-jump error." As discussed above, there can be a measurement backaction produced upon the bosonic mode as a result of observing no change in the boson number state. This backaction reduces the relative probability of the higher Fock states with respect to the lower ones, formally expressed with the factor $\exp(-\kappa dt \hat{n}/2)$ in the error operators (see Eqn. B14 below). Correction of this error syndrome is discussed below.

In act 2606, one or more operations are performed upon the bosonic mode to transform its state based on the error syndrome detected in act 2604. This transformation is configured to counteract the error implied by the measured error syndrome—that is, to attempt to transition the system back to the state it was in prior to the error. In some, but not all, cases, this transformation can be exact. In other cases, the transformation may approximately return the system to its previous state.

According to some embodiments, act 2606 may apply the one or more operations based on an analysis of a bosonic mode that evolves over time. For example, the standard Lindblad time evolution of a density matrix $\hat{\rho}$ of a cavity coupled to a zero-temperature bath with a cavity energy decay rate $\kappa$ is (represented in the frame rotating at the cavity frequency)

$$\frac{d\hat{\rho}}{dt} = \frac{\kappa}{2}(2\hat{a}\hat{\rho}\hat{a}^\dagger - \hat{a}^\dagger\hat{a}\hat{\rho} - \hat{\rho}\hat{a}^\dagger\hat{a}). \qquad \text{(Eqn. B12)}$$

In a finite time interval dt, continuous time evolution results in an infinite set of errors and exact quantum error correction of the full set of errors is not possible. However, the probabilities of the errors scale with powers of $\kappa dt$ and we can choose to correct only the most important errors in $\kappa dt$. Formally, we exploit the notion and theory of the field of approximate quantum error correction (AQEC). Roughly speaking, each error operator is expanded in powers of $\kappa dt$ and the errors corrected up to a given highest order of the expansion. To be consistent with choosing to correct only the errors that occur with probabilities to a specified highest order in $\kappa dt$, it may be enough to satisfy the QEC criteria of Eqn. B5 only approximately such that the resulting recovery of the original state has an accuracy given by the same highest order in $\kappa dt$.

Consider initially only amplitude damping by boson loss errors, that is, the time-evolution of Eqn. B12, and extend the discussion for boson gain and dephasing processes later. One can 'unravel' the Lindblad Equation (Eqn. B12) by considering the conditional quantum evolution of the system based on the measurement record of a photomultiplier that clicks whenever a boson is lost. In this quantum trajectory picture, one views the first term in Eqn. B12 representing the boson loss jump of the system when the detector clicks $\hat{\rho} \to \hat{a}\hat{\rho}\hat{a}^\dagger$. This is not normalized because it includes the fact that the click probability is proportional to $\text{Tr}(\hat{a}\hat{\rho}\hat{a}^\dagger)=\bar{n}$. The last two term terms inside the brackets represent time-evolution of the system under an imaginary non-Hermitian Hamiltonian $$\hat{V}/\hbar = -i\frac{\kappa}{2}\hat{a}^\dagger\hat{a}$$

when no bosons are detected. Above when considering an idealized error set $\bar{\varepsilon}_L = \{1, \hat{a}, \hat{a}^2, ..., \hat{a}^L\}$ we for simplicity ignored a part of the physical error process, namely this no-jump evolution occurring inbetween boson loss jumps. Much like a Feynman path integral, we can express the evolution of the density matrix from time 0 to t in terms of a sum over all possible trajectories with jumps occurring at all possible times during the time interval t:

$$\hat{\rho}(t) = \sum_{\ell=0}^{\infty} \hat{\rho}_\ell(t) = \sum_{\ell=0}^{\infty} \hat{E}_\ell \hat{\rho}(0) \hat{E}_\ell^\dagger, \qquad \text{(Eqn. B13)}$$

where $\hat{E}_\ell$ are Kraus operators encapsulating the time-evolution generated by exactly $\ell$ boson losses and the no-jump evolution in between the boson loss events. By integrating over all the possible jump times of exactly $\ell$ boson jumps during the time interval t we can derive an analytic expression for $\hat{E}_\ell$:

$$\hat{E}_\ell = \sqrt{\gamma_\ell}\, e^{-\frac{\kappa dt}{2}\hat{n}} \hat{a}^\ell = \sqrt{\gamma_\ell e^{\ell \kappa dt}}\, \hat{a}^\ell e^{-\frac{\kappa dt}{2}\hat{n}}, \qquad \text{(Eqn. B14)}$$

where $\gamma_\ell = (1 - e^{-\kappa t})^\ell / \ell!$. A noteworthy feature of the damped simple harmonic oscillator is that the precise timing of the boson jumps plays no role. This can also be seen in the interchangeability of the order of the operators in Eqn. B14. If a self-Kerr non-linearity is present, the precise timing of the jumps matters and tracing over them leads to dephasing. Taken together, when correcting against boson loss errors up to order $(\kappa dt)^L$, the correct set of errors the codes should be protected against is $\varepsilon_L = \{\hat{E}_0, \hat{E}_1, ..., \hat{E}_L\}$ including contributions of both the jump and no-jump parts of the non-unitary time-evolution.

According to some embodiments, in act 2606 where the error syndrome measured in act 2604 indicated loss or gain of one or more bosons, the transformation applied in act 2606 is configured to transition the bosonic mode from a state that is a superposition of error word states back to the superposition of codeword states that the mode previously exhibited (e.g., produce the state transitions given by Eqn. B4).

According to some embodiments, this transformation may be performed by application of a correction unitary $\hat{U}_k$ to the bosonic mode to perform a state transfer between the logical codewords and the error words. Errors $\hat{E}_k$ may be recovered to the accuracy of $(\kappa dt)^M$ by a recovery process R chosen to recover the errors $\hat{B}_k$, where the set of errors $\hat{E}_k$:

$$\hat{E}_k = \hat{B}_k + \hat{C}_k + O\left[(\kappa dt)^{\frac{2M+1}{2}}\right]$$

is split to two parts, where $$\hat{B}_k = \sum_{\mu=0}^{M} \hat{E}_{\mu k} \kappa dt^{\frac{\mu}{2}}, \hat{C}_k = \sum_{\mu=M+1}^{2M} \hat{E}_{\mu k} (\kappa dt)^{\frac{\mu}{2}}. \qquad \text{(Eqn. B15)}$$

The Kraus operators of the recovery process R can be written as $$\hat{R}_k = \beta_{kk} \Sigma_\sigma |W_\sigma\rangle\langle W_\sigma| \hat{B}_k = \hat{U}_k \hat{P}_k$$

where the error detection is projected to the error subspace, $\hat{P}_k = \Sigma_\sigma \hat{B}_k |W_\sigma\rangle\langle W_\sigma| \hat{B}_k^\dagger$, and the correction unitary $\hat{U}_k = \Sigma_\sigma |W_\sigma\rangle\langle W_\sigma| \hat{B}_k^\dagger$ performs state transfer between the logical codewords and the error words.

For example, the unitary operation for correcting a single boson loss error is:

$$U_1 = |W_\downarrow\rangle\langle 3| + |W_\uparrow\rangle\langle 1| + |3\rangle\langle W_\downarrow| + |1\rangle\langle W_\uparrow|.$$

According to some embodiments, where the bosonic mode is a mode of a resonator (e.g., resonator 2520 shown in FIG. 25), correction unitary $\hat{U}_k$ may be applied to the resonator by an energy source supplying energy (e.g., a time-varying electromagnetic pulse) to the resonator and/or to a qubit to which the resonator is coupled (e.g., as described below in relation to FIG. 28). In at least some cases, a plurality of operations may be performed to apply correction unitary $\hat{U}_k$ to the resonator. Such operations may comprise one or more steps in which energy (e.g., a time-varying pulse) is applied to the qubit, to the resonator, or to the qubit and the resonator simultaneously.

According to some embodiments, in act 2606 where the error syndrome measured in act 2604 indicated one or more dephasing errors, the transformation applied in act 2606 is configured to recover the state prior to dephasing by performing a state transfer between the subspaces of the error and logical codewords (e.g., produce the state transitions given by Eqn. B4). In the event of a dephasing error, the operator $\hat{n}$ takes the state to a superposition of the logical codewords and an orthogonal set of errors words, as in Eqn. B8. This event can be diagnosed and the quantum state restored by a projective measurement followed by a conditional unitary operation.

According to some embodiments, in act 2606 where the error syndrome measured in act 2604 indicated a no jump error syndrome, the transformation applied in act 2606 is configured to recover a state prior to when the measurement was made.

According to some embodiments, when the error syndrome measured in act 2604 indicated a no jump error symdrome (e.g., no boson loss was detected), the quantum state $|\psi\rangle = \alpha|W_\uparrow\rangle + \beta|W_\downarrow\rangle$ transforms to $$|\psi'\rangle = \hat{E}_0|\psi\rangle / \langle\psi|\hat{E}_0^\dagger \hat{E}_0|\psi\rangle^{\frac{1}{2}}$$

under the no-jump evolution given by $\hat{E}_0 = \exp(-\kappa dt\hat{n}/2)$. The code of Eqn. B6 is protected against the single boson loss error that occurs with probability $P_1 = \langle \hat{E}_1^\dagger \hat{E}_1 \rangle \approx \bar{n}\kappa dt + O[(\kappa dt)^2]$. Thus, according to some embodiments the no-jump evolution can be determined to the same accuracy:

$$|\psi'\rangle \approx \left[1 - \frac{\kappa dt}{2}(\hat{n} - \bar{n})\right]|\psi\rangle + O[(\kappa dt)^2] \quad \text{(Eqn. B16)}$$
$$= \alpha(|W_\uparrow\rangle + \kappa dt|E_\uparrow^0\rangle) + \beta|W_\downarrow\rangle + O[(\kappa dt)^2],$$

where $|E_\uparrow^0\rangle = (|0\rangle - |4\rangle)/\sqrt{2}$ is the error word associated with the no-jump evolution. Note that $|W_\downarrow\rangle = 2$ is unaffected by the no-jump evolution as its excitation number is equal to the mean boson number. To the first order in $\kappa dt$, the no-jump evolution causes deterministic rotation inside the subspace $\{|W_\uparrow\rangle, |E_\uparrow^0\rangle\}$. By applying a unitary operation, $$\hat{U}_0 = \cos \kappa dt (|W_\uparrow\rangle\langle E_\uparrow^0| - |E_\uparrow^0\rangle\langle W_\uparrow|) + \sin \kappa dt$$
$$(|W_\uparrow\rangle\langle W_\uparrow| + |E_\uparrow^0\rangle\langle E_\uparrow^0|) + |W_\downarrow\rangle\langle W_\downarrow|, \quad \text{(Eqn. B17)}$$

the original state can be recovered to first order in $\kappa dt$.

Alternatively, the recovery may be performed by a measurement projecting to the subspace of logical codewords. By combining detection and correction of both the boson loss and the no-loss errors, the total recovery process is $R = \{\hat{R}_0, \hat{R}_1\}$ described by the Kraus operators $\hat{R}_k = \hat{U}_{kk \bmod 2} \hat{P}_{k \bmod 2}$, where $\hat{P}_{k \bmod 2}$ is a projector to the boson number subspace k mod 2, that is, to a parity subspace. The recovery processes results in, $R(\varepsilon(\hat{\rho})) = \hat{\rho} + O[(\kappa dt)^2]$, that is, correction of the error process to the first order in $\kappa dt$ as desired.

In summary, in act 2606 the single mode codes described above can protect against up to L boson loss errors and against no-jump evolution up to order $(\kappa dt)^L$ using the above-described techniques. That is, the codes are approximate quantum error correction codes protected against $\varepsilon_L = \{\hat{E}_0, \hat{E}_1, \ldots, \hat{E}_L\}$ with the same accuracy. Physically this means that if observation of boson loss errors up to a maximum of L times does not yield any information on population and phases between the logical code words $|W_\sigma\rangle$, then also the observation of no-jump errors $\leq L$ times yields no information and has measurement backaction that does not deform the state. In other words, the codes for $\bar{\varepsilon}_L = \{1, \hat{a}, \hat{a}^2, \ldots, \hat{a}^L\}$ are protected against the no-jump evolution to the same order than the codes are protected against boson jump errors.

Figure 27:
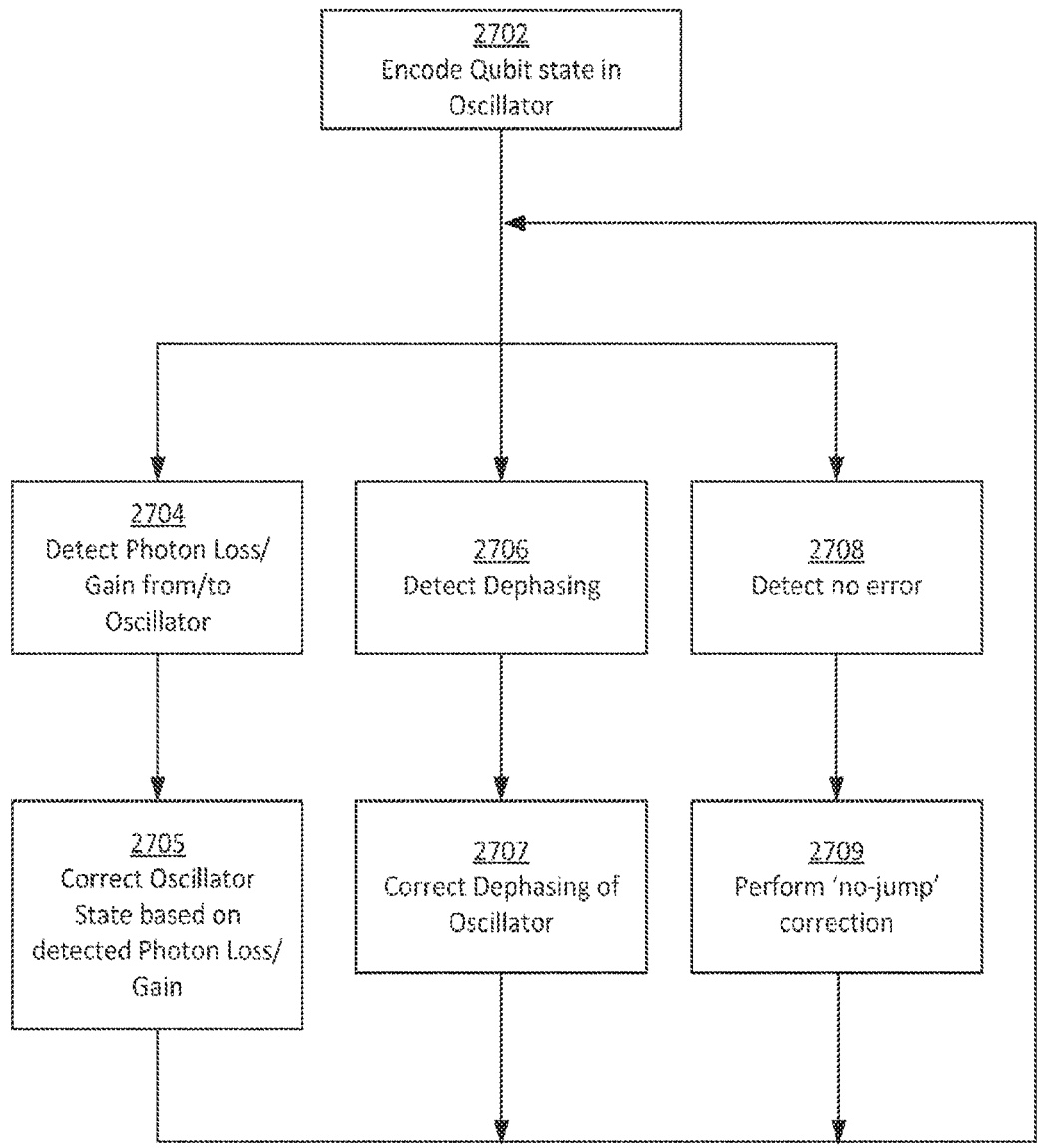
FIG. 27 is a flowchart of a method of correcting one of three classes of errors that occur within a bosonic system, according to some embodiments.

FIG. 27 is a flowchart of a method of correcting one of three classes of errors that occur within a bosonic system, according to some embodiments. Method 2700 is a particular example of method 2600 performed within a system comprising a qubit coupled to an oscillator (e.g., system 2800 discussed below in relation to FIG. 28).

In act 2702 the state of the qubit is encoded in the oscillator using one of the binomial codes to represent the state of the qubit in the oscillator, illustrative techniques for which are discussed above. In acts 2704, 2706 or 2708, an error syndrome is detected that may be a photon gain/loss, dephasing, or a no-jump error, respectively. Illustrative techniques to detect such errors are discussed above. In acts 2705, 2707 or 2709, respectively, transformations are applied to the qubit-oscillator system to correct these errors. In some embodiments, acts 2705, 2707 and/or 2709 may comprise application of electromagnetic pulses to the qubit and/or to the oscillator to perform unitary operations that perform such corrections. For example, those unitary operations discussed above in relation to FIG. 26 may be performed via said application of pulses.

Figure 28:
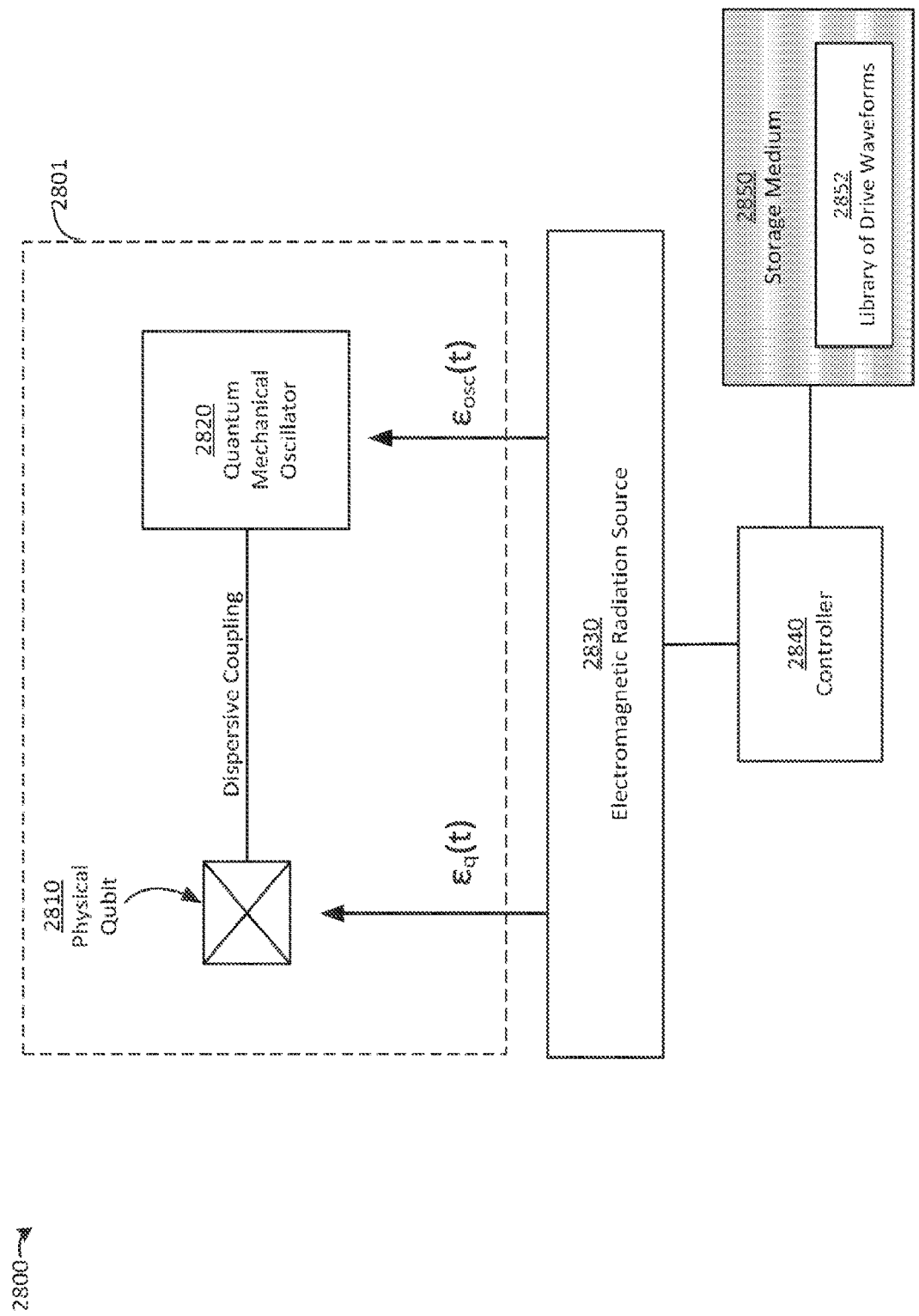
FIG. 28 is a block diagram of a circuit quantum electrodynamics system, according to some embodiments.

FIG. 28 is a block diagram of a circuit quantum electrodynamics system, according to some embodiments. System 2800 includes a system 2801 in addition to electromagnetic radiation source 2830, controller 2840 and storage medium 2850. In some embodiments, a library of precomputed drive waveforms may be stored on a computer readable storage medium and accessed in order to apply said waveforms to a quantum system. In the example of FIG. 28, controller 2840 accesses drive waveforms 2852 stored on storage medium 2850 (e.g., in response to user input provided to the controller) and controls the electromagnetic radiation source 2830 to apply drive waveforms $\varepsilon_q(t)$ and $\varepsilon_{osc}(t)$ to the qubit and oscillator, respectively.

System 2801 includes a physical qubit 2810 and a quantum mechanical oscillator 2820. In the example of FIG. 28, the qubit and the oscillator are dispersively coupled—that is, the qubit-oscillator detuning is much larger (e.g., an order of magnitude larger) than the coupling strength between the qubit and the oscillator. An electromagnetic signal $\varepsilon_q(t)$ may be applied to the physical qubit 2810 and an electromagnetic signal $\varepsilon_{osc}(t)$ may be applied to the quantum mechanical oscillator 2820. As used herein, application of such an electromagnetic signal or pulse may also be referred to as "driving" of the qubit and/or oscillator.

According to some embodiments, drive waveforms $\varepsilon_q(t)$ and $\varepsilon_{osc}(t)$ may be determined via numerical techniques for a particular desired state change of the system 2800. In particular, suitable drive waveforms may be determined that allow $\varepsilon_q(t)$ and $\varepsilon_{osc}(t)$ to be applied simultaneously to the physical qubit and the oscillator, respectively. The drive waveforms $\varepsilon_q(t)$ and $\varepsilon_{osc}(t)$ may be applied during the same time period (i.e., may start and end together) or may simply overlap in time. These drive waveforms may be stored in the storage medium 2850 in library 2852, having been previously computed to transition the system 2801 from an initial state to a desired final state. According to some embodiments, the drive waveforms may include waveforms that, when applied to the qubit 2810 and oscillator 2820, transition the oscillator from state that is a superposition of error words into a superposition of logical codeword states, as described above. For example, the drive waveforms may include waveforms that, when applied to the qubit and the oscillator, produce the state transitions given by Eqn. B4.

FIG. 29 illustrates a two-parameter (N, S) labeling of the binomial codes (Eqn. B11). The largest circle denotes the code (Eqn. B6) protected against a boson loss error L=1, the large square is the code (Eqn. B7) protected against $\bar{\varepsilon}_2 = \{1, \hat{a}, \hat{a}^2, \hat{n}\}$ or $\bar{\varepsilon}'_2 = \{1, \hat{a}, \hat{a}^\dagger, \hat{n}\}$, and the large diamond denotes the code (Eqn. B9) protected against $\bar{\varepsilon}'_1 = \{1, \hat{a}, \hat{n}\}$. The parameter S=L+G sets the total number of detectable boson loss errors L and gain errors G. The parameter N sets the maximum order the code is protected against boson loss, gain and dephasing errors N=max{L, G, 2D}. The codes shown on or between the lines labeled "S=2N" and "S=N" have protection against boson loss and gain errors set by S=L+G and in addition they are protected against dephasing up to $\hat{n}^{L/2}$. The codes to the left of the line labeled "S=2N" allow in addition heralding of S−2N uncorrectable boson loss or gain errors. The codes to the right of the line labeled "S=N" are protected against a total of S boson loss and gain errors, as well as against up to $\hat{n}^{N/2}$ dephasing errors. The error words of a binomial code are also valid logical codewords but with a reduced value for the parameter N, since a boson loss or gain error decreases N→N−1 and a dephasing error reduces N→N−2.

Note that the spacing between the occupied Fock states is S+1 in the codewords (Eqn. B11). This means that all boson loss and gain errors can be uniquely distinguished by measuring boson number mod S+1. Next, the quantum error correction conditions in Eqn. B5 imply that $<W_o|(\hat{a}^\dagger)^l \hat{a}^l|W_o>$ for all l≤max{L, G} be equal for the two logical codewords, just as the mean boson number of the logical codewords (Eqn. B6) was required to be equal. Inclusion of dephasing errors makes the QEC matrix (Eqn. B11) non-diagonal, but it follows from the binomial coefficients that dephasing errors up to order [max{L, G}/2] (where the square brackets indicate integer part of) are also corrected by these codes. The spacing S=L+G sets the maximum number of detectable and correctable boson loss and gain errors and L+1 can be seen as the distance of the binomial quantum codes. The highest degree of dephasing correction can be increased via N without limit. Note also that since the binomial codes are protected against the error set in (Eqn. B10), they are also protected against all errors that are superpositions of these, such as displacement errors $\hat{D}(\alpha) = \exp(\alpha \hat{a}^\dagger - \alpha^* \hat{a})$ for small α.

Figure 30:
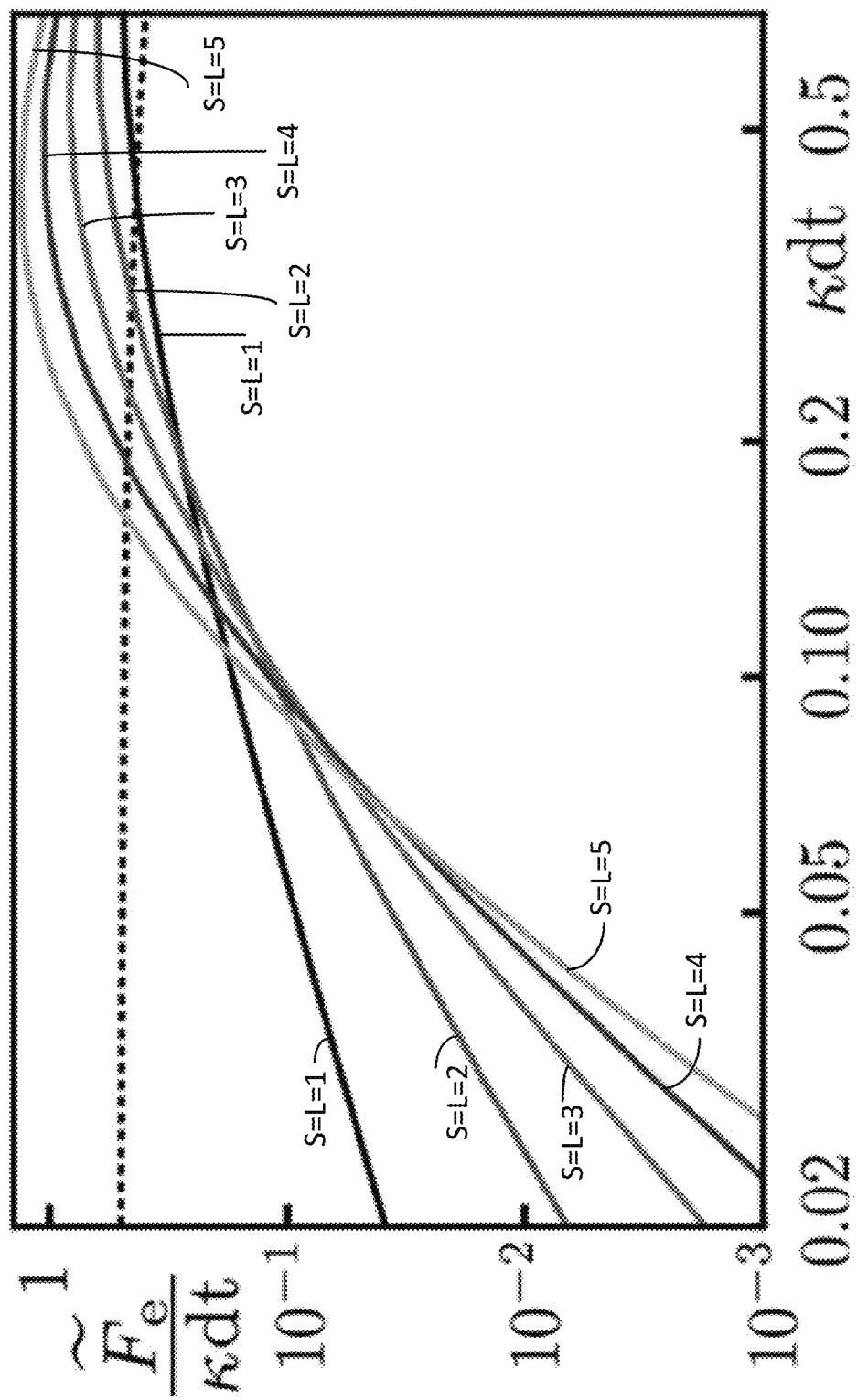
FIG. 30 illustrates the rate of entanglement infidelity for binomial quantum error correction codes, according to some embodiments.

FIG. 30 illustrates the rate of entanglement infidelity for binomial quantum error correction codes, according to some embodiments. Ignoring first infidelities in the recovery process, the performance of a binomial code may be estimated by the rate of uncorrectable errors. When including several error channels, that is boson loss, boson gain and dephasing errors with rates κ, $\kappa_+$ and γ, the exact expression for the dominant uncorrectable error depends on the relative ratio of these rates. However, it is physically reasonable to assume that the boson loss channel is the dominating one, κ>$\kappa_+$, γ. Then, the rate of uncorrectable errors is also dominated by the largest uncorrectable boson loss error rate, that is, the error rate $P_{L+1}/dt = \langle \hat{E}_{L+1}^\dagger \hat{E}_{L+1} \rangle/dt$ of losing L+1 bosons during dt. This scales as $(\kappa dt)^L S^{L+1}$ which implies that for a time step dt there exists an optimal binomial code with finite L, S and N that minimizes the uncorrectable error rate among different binomial codes.

FIG. 30 illustrates the rate of entanglement infidelity $\tilde{F}_e/dt$, in units of κ, plotted as a function of the time step dt, in units of 1/κ, for the binomial codes of Eqn. B11 with S=L=1, 2, 3, 4 and 5 as labeled in the figure. In the example of FIG. 30, a perfectly faithful recovery process is assumed for the purposes of illustration. Note the logarithmic scale of each axis. The dashed line in FIG. 30 indicates the performance of a naive encoding, $|W_{\uparrow/\downarrow}\rangle = |0/1\rangle$, whose rate of entanglement infidelity at small dt approaches κ/2 corresponding to the rate of a boson loss with $\bar{n}=1/2$. The binomial codes described herein outperform the naive encoding approach with time step dt0.4$\kappa^{-1}$ and the binomial codes with L≥2 become favorable with time step dt0.2$\kappa^{-1}$. Entanglement infidelity may be calculated as $\tilde{F}_e = 1 - F_e = 1 - \sum_{k=0}^L \sum_{l=0}^\infty |\text{Tr}(\hat{\rho}_c \hat{R}_k \hat{E}_l)|^2$, where $\hat{\rho}_c = \Sigma_o |W_o\rangle\langle W_o|/2$. The entanglement infidelity is in general dependent on the input state. However, here we use the fully mixed state $\hat{\rho}_c$ as an input since then the entanglement fidelity is equal to the $\chi_{II}$ component of the process map. At small dt, the slopes of $\tilde{F}_e/dt$ agree well with the slopes for the rate of the largest uncorrectable error $P_{L+1}/dt$.

In the example of FIG. 30, we have demonstrated the performance of the binomial codes for S=L=0, . . . , 5 via the rate of the entanglement infidelity which, in the absence of infidelities in the recovery process and at small time steps dt, is well approximated by largest uncorrectable error rate. Physically the observed scaling can be understood since the mean boson number $$\bar{n} = \frac{1}{2}(L+1)(S+1)$$

increases quadratically with the number of protected boson loss errors L implying faster decay of the code words and that to achieve the advantage of higher-order protection, the checking times dt may be made appropriately smaller. Larger codes are preferable for smaller checking times. However, an experimental infidelity e related to a single recovery stage increases the error rates by ε/dt favoring low-order binomial codes with longer time steps. The optimality of a code depends also on the detailed structure of the experimental recovery process; some of the infidelities can be correctable errors suppressed by the next round of the recovery process. In the presence of known error sources, the confidence of the error detection and consequently the fidelity of the recovery process can be improved by the means of quantum state filtering and smoothing, that is, using effectively the measurement record.

Aside from improving lifetimes of quantum memories and quantum bits, bosonic mode quantum error correction is also useful for quantum communication which consists of quantum state transfer and generation of high-fidelity entangled pairs of quantum bits between two distant locations or nodes in a quantum network. As discussed above, a photonic or other bosonic system may be used as a communication medium wherein a qubit (or other quantum system) has its state mapped onto the bosonic system, which transmits or otherwise transfers the state across physical space, and maps the state onto a second qubit system. In this manner, the bosonic system acts akin to a fiber optic or other communication medium utilizing light by transporting information across a physical space.

Figure 31A:
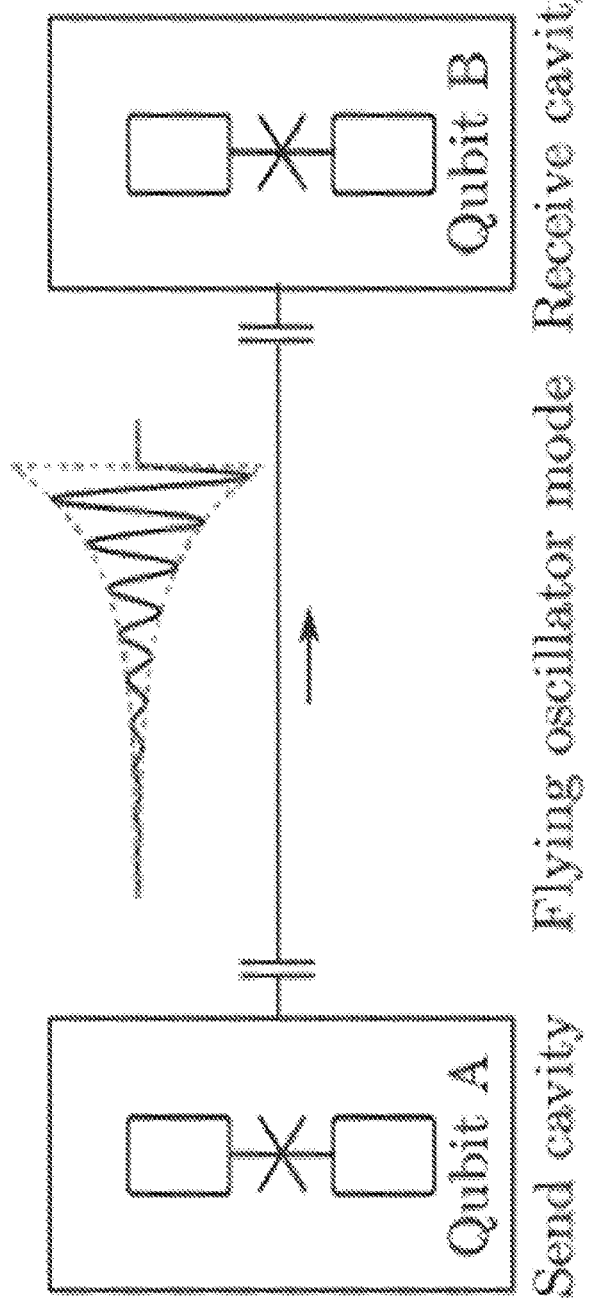
FIG. 31A is a sketch of an illustrative circuit QED system.
Figure 31B:
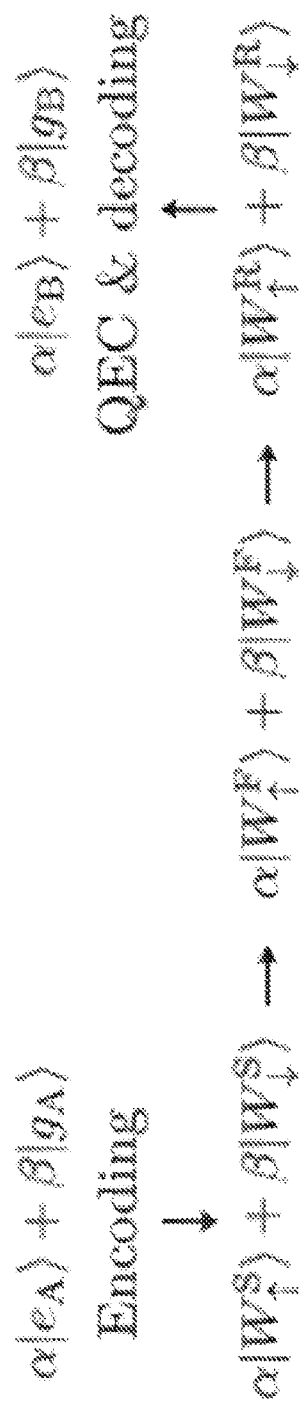
FIG. 31B is a schematic of a quantum state transfer scenario for the system depicted in FIG. 31A, utilizing encoding and quantum error correction of the binomial quantum states.

We consider here an illustrative task, namely the 'pitch-and-catch' scenario for a quantum state, schematized in FIGS. 31A-31B. FIG. 31A is a sketch of a circuit QED hardware proposal and FIG. 31B is a schematic of a quantum state transfer scenario utilizing encoding and quantum error correction of the binomial quantum states. In the example of FIGS. 31A-31B, after encoding the qubit state to the send cavity, by controlling the cavity decay one can tailor a temporal mode for the flying, traveling oscillator mode that is fully absorbed by the receiving cavity. The received cavity state may have suffered from photon loss errors (Eqn. B14), dephasing and photon gain errors that can be recovered by performing the recovery process before decoding it to the physical qubit.

The illustrative scenario of FIGS. 31A-31B comprises initializing the qubit A into a superposition of the ground and excited state $\alpha|e\rangle_A+\beta|g\rangle_A$, encoding (a unitary swap operation) of the qubit state into the logical codewords of the send cavity $\alpha W_\uparrow^S+\beta W_\downarrow^S$ using one of the binomial codes, letting the cavity state leak in a time-reversal symmetric manner (pitch) into a transmission line or to other kind of a flying oscillator $\alpha W_\uparrow^F+\beta W_\downarrow^F$ such that the inverse process (catch) is most efficient into the receiving cavity $\alpha W_\uparrow^R+\beta W_\downarrow^R$. The transfer is finalized by decoding (a unitary swap operation) the received cavity state to the qubit B resulting in $\alpha|e\rangle_B+\beta|g\rangle_B$, corresponding to a transfer of the qubit state between the qubits. The remote physical qubits can be entangled by replacing the first swap with a CNOT-gate between the physical qubit A and logical qubit of the cavity.

The process is vulnerable to various errors and infidelities at the different stages of the transfer process. The most obvious imperfection is the attenuation of the state of the flying oscillator by photon loss processes, similar to (Eqns. 12-14), during the transmission. The local decoding and encoding operations between the cavity and qubit states can be imperfect as well. An important part of the 'pitch-and-catch' process is the engineering of the temporal mode of the flying oscillator so that the catch by the receiving cavity is as reflectionless as possible. Reflection can be modeled as an additional photon loss process. In addition, the cavities can suffer dephasing events through uncontrolled transitions of the qubits and the cavity states can decay also to unwanted channels not just to the transmission channel. If one uses naive encoding $W_{\uparrow/\downarrow}^i$ photon loss errors lead to exponential loss of process fidelity as a function of transmission distance and similarly other errors lead to unfaithful transmission. When using the binomial codewords or other quantum codes as the logical codewords in the cavities, the fidelity can be increased by performing a recovery process on to the received cavity state before decoding it to the receiving qubit B. This way one can improve the fidelity by the amount that the correctable errors (Eqn. B10) contribute to the full error process.

In classical communication we typically use the continuous variables of amplitude and/or phase of the electromagnetic field to transmit a signal. One of the popular coding schemes is the phase-shift keying (PSK), which is a digital modulation scheme that conveys data by changing/modulating the phase of a reference signal. For example, the quadrature phase-shift keying uses the 4 equal-spaced points $(\alpha, i\alpha, -\alpha, -i\alpha)$ on a circle with radius $\alpha$ in the phase space to encode 2 classical bits of information. Generally, we can use d equal-spaced points on a circle $\{\omega^k \alpha\}_{k=1, 2, \ldots, d-1}$ with $\omega=e^{i2\pi/d}$ to encode $\log_2$ d classical bits of information. In the presence of signal attenuation, PSK can reliably encode the information so long as the phase of the reference signal can be reliably extracted. Owing to its simplicity, PSK is widely used in existing technologies in classical communication, such as the Bluetooth 2 standard and wireless LAN standard.

There may be a class of quantum continuous variable codes that is closely related to classical PSK encoding. The binomial codes can be regarded as a code that can correct multiple excitation loss errors, which can be used for quantum communication. In particular, it can be used for correcting photon loss errors in the third generation of quantum repeaters. In the perspective of secure quantum communication (quantum key distribution, QKD), the binomial codes defeat eavesdroppers. While an eavesdropper could try to probe the communicated codewords by removing a small number of photons from the code words or by acting with another operator that the code is protected against, the eavesdropper would not acquire any information about the word being sent. This is because those photon losses do not give any hint as to which code word they came from. Indeed, this is precisely why the intended receiver can still recover code words despite losses.

According to some embodiments, the example of FIGS. 31A-31B could be repeated a number of times to cross a larger distance. In other words, a quantum repeater could be produced that utilized a number of cavities between an initial send cavity and a final receive cavity that each receive, then send the state (by leaking the state out of the cavity).

According to some embodiments, a quantum communication system may be formed that links microwave resonators via optical fiber(s) and/or via other suitable means for propagating electromagnetic signals. For instance, optomechanical transducers can perform quantum state transfer from a microwave resonator to flying optical photons (and the reverse down-conversion) via an optomechanical transducer. Such converters could play a central role in quantum communications. According to some embodiments, such communication comprises up-conversion from microwave to optical, transmission of the optical state through a fiber and then down-conversion from optical to microwave at the remote location. All three steps could involve photon loss, gain or dephasing errors. Thus rather than using the 0 and 1 photon number states to hold the quantum information it may be useful to use binomial codewords $|W_\uparrow\rangle$, $|W_\downarrow\rangle$ which can be corrected for such errors as described herein.

Figure 32:
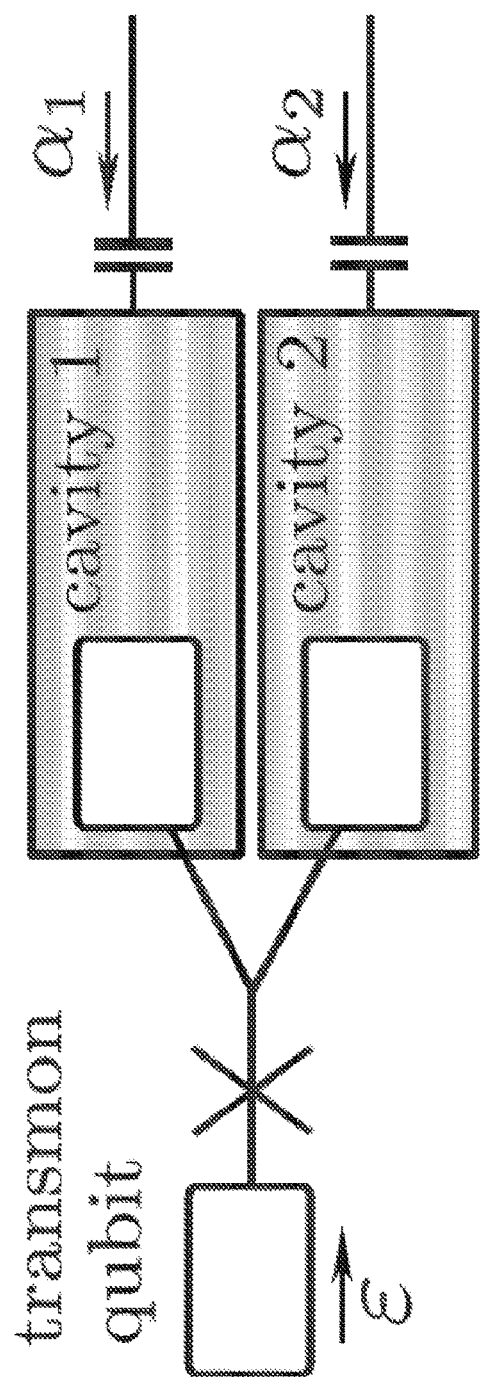
FIG. 32 is a block diagram of a single-qubit, two-cavity system suitable for implementing two-mode codes.

FIG. 32 is a block diagram of a single-qubit, two-cavity system suitable for implementing two-mode codes. System 3200 is another example of a system in which the two-mode (binomial) codes described above may be implemented. The single-qubit, two-cavity experimental configuration shown in FIG. 32 is in principle sufficient to realize universal control of the two modes for the following reasons.

The Hamiltonian of the dispersive coupling between the qubit and the cavities is of the form $$H_{disp} = \sum_{j=1}^{2} \chi_j \hat{a}_j^\dagger \hat{a}_j \hat{\sigma}_z,$$

where $\hat{a}_j$ is the annihilation operator for the jth mode. Additional Hamiltonian terms come from independent drives on the cavities $H_{j,d} = \alpha_j^* \hat{a} + \alpha_j \hat{a}^\dagger$, and the qubit $\hat{H}_Q = \vec{n} \cdot \vec{\sigma}$, where the $\alpha_j$ and $\vec{n}$ are externally controlled. The existing Hamiltonian terms can generate a more complex effective Hamiltonian using the approximate identities:

$$e^{i\hat{A}dt} e^{i\hat{B}dt} e^{i\hat{B}dt} e^{i\hat{A}dt} = e^{2i(\hat{A}+\hat{B})dt} + \mathcal{O}(\delta t^3) \quad \text{(Eqn. B18)}$$

$$e^{-i\hat{A}dt} e^{-i\hat{B}dt} e^{i\hat{A}dt} e^{i\hat{B}dt} = e^{[\hat{A},\hat{B}]dt^2} + \mathcal{O}(\delta t^3) \quad \text{(Eqn. B19)}$$

These identities can be applied and combined multiple times to produce superpositions of higher order commutators; $[\hat{A},[\hat{A},\hat{B}]]$.

To establish universal control of the multimode system, it may be sufficient to show that each mode can be universally controlled, and that it is possible to generate a beamsplitter interaction $\hat{x}_i \hat{p}_j - \hat{x}_j \hat{p}_i$ (equivalent to $\hat{a}_i \hat{a}_j^\dagger + \hat{a}_j \hat{a}_i^\dagger$) between different modes $i \neq j$. Using the identity (Eqn. B19), the cavity drives along with the dispersive interaction generate effective, qubit-coupled drives on an individual cavity:

$$i\hat{H}_{j,eff} = \left[ \alpha_j \hat{a}_j - \alpha_j^* \hat{a}_j^\dagger, i \sum_{k=1}^{2} \chi_k \hat{a}_k^\dagger \hat{a}_k \hat{\sigma}_z \right] \quad \text{(Eqn. B20)}$$

$$= i\chi_j \hat{\sigma}_z (\alpha_j \hat{a}_j + h.c.)$$

Choosing $\alpha_j$ to be real or imaginary results in effective operators $\propto \hat{p}_i \hat{\sigma}_z$ or $\hat{x}_i \hat{\sigma}_z$. Combining these with pre- and post-rotations of the qubit yields, e.g. $\hat{x}_i \hat{\sigma}_y$. Applying (Eqn. B19) again enables the construction of products of the mode operators, for example:

$$[i\hat{x}_i \hat{\sigma}_y, i\hat{x}_j \hat{\sigma}_z] = i\hat{x}_i \hat{x}_j \hat{\sigma}_x \quad \text{(Eqn. B21)}$$

$$[i\hat{p}_i \hat{\sigma}_y, i\hat{p}_j \hat{\sigma}_z] = i\hat{p}_i \hat{p}_j \hat{\sigma}_x \quad \text{(Eqn. B22)}$$

$$[i\hat{x}_i \hat{\sigma}_y, i\hat{p}_j \hat{\sigma}_z] = i(\hat{x}_i \hat{p}_j + \hat{p}_j \hat{x}_i) \hat{\sigma}_x \quad \text{(Eqn. B23)}$$

Using (Eqn. B18) to sum (Eqn. B21) and (Eqn. B22) with i=j gives a single mode dispersive interaction, which in combination with external cavity drives is enough to produce single mode universal control. Superposing (Eqn. B23) with the same term with the opposite sign and i↔j produces the beamsplitter interactions that are sufficient to give universal control of the multimode system.

APPENDIX C—Techniques for Manipulation of Two-Qubit Quantum States and Related Systems and Methods Developing a quantum computer involves a number of different technical developments, some of which build upon each other. As an initial step, a quantum system must be developed that can be controlled sufficiently well to hold one bit of quantum information (a 'qubit') long enough for the qubit to be written, manipulated, and read. Once this has been achieved, quantum algorithms can be performed on these quantum systems if a number of additional requirements, known as the DiVincenzo criteria, are also satisfied. One of these criteria is the ability to implement a universal set of gates. That is, to implement gates that in combination can realize complex quantum algorithms. Unlike in classical computing, however, in which any desired Boolean gate can be implemented from NAND (or NOR) gates alone, in a quantum computer universality can only be achieved with a combination of arbitrary single qubit gates and a two-qubit gate (e.g., a CNOT gate).

Another of the DiVincenzo criteria is to produce qubits that have sufficiently long decoherence times to be able to perform computation. Some techniques to help meet this criteria employ quantum error correction techniques to correct decoherence errors in a quantum system once they occur. If the error correction operations are sufficiently effective, the state of a quantum system can be maintained for a long time, and possibly indefinitely.

Techniques for implementing a universal set of quantum logic gates in a system that satisfies the DiVincenzo criteria have been recognized and appreciated. Quantum information may be stored in linear quantum mechanical oscillators that are coupled to one another by a multi-level (e.g., nonlinear) quantum system. The states of the linear quantum mechanical oscillators act a logical qubit for storing a single bit of quantum information. By controlling the quantum mechanical oscillators and the multi-level quantum system with driving signals, a universal set of quantum logic gates can be implemented. For example, arbitrary single qubit rotations can be performed, as well as entangling and disentangling operations between two or more qubits.

These techniques comprise an operation for generating an entangled state between two quantum mechanical oscillators. Such a state may enable logical operations between two logical qubits, where each logical qubit is represented by a state of one of the oscillators, and may further enable quantum error correction techniques to be applied to these qubits. Accordingly, these techniques may support the two DiVincenzo criteria discussed above, by simultaneously (i) allowing logical operations to be performed upon two qubits, and by (ii) lengthening decoherence times by enabling quantum error correction techniques.

In some embodiments, a suitable device architecture may include a multi-level quantum system, such as a transmon or other nonlinear quantum system, dispersively coupled to two qubits each implemented as a quantum mechanical oscillator. The oscillators may be, for example, resonator cavities or other suitable linear quantum oscillators. The multi-level quantum system may be used as an ancilla to create, manipulate, and/or to measure the quantum states of each of the oscillators to which it is coupled. By accessing multiple energy levels of the ancilla, the techniques described herein make it possible to realize universal quantum control of the two qubits and to monitor the error syndrome of the two qubits by performing quantum non-demolition (QND) measurements.

A nonlinear quantum system is a quantum system that does not have an infinite number of energy levels (e.g., energy eigenstates) separated by a constant energy difference. In contrast, a linear quantum system has an infinite number of evenly distributed energy levels. An example of a linear quantum system is a quantum mechanical oscillator. An example of a nonlinear quantum system is a two-level quantum system (e.g., a two-level atom) which only has two energy eigenstates. Another example of a nonlinear quantum system is a multi-level quantum system such as a superconducting qubit (e.g., a transmon).

Conventionally, nonlinear quantum systems are used to store quantum information. For example, it has been shown that transmons can be used to implement a qubit. It has been recognized and appreciated that storing quantum information in linear quantum mechanical oscillators has several advantages over storing the information in nonlinear quantum systems. One such advantage is an increase in coherence time. In particular, it has been recognized and appreciated that so-called "cat states" may be a particularly useful type of state of the quantum mechanical oscillators to which to apply the techniques described herein.

A cat state is a coherent superposition of two coherent states with opposite phase. For example, in a quantum harmonic oscillator a cat state can be described by $$\frac{1}{\sqrt{2}}(|\alpha\rangle + |-\alpha\rangle),$$

where $|\alpha\rangle$ is a coherent state with a first phase and $|-\alpha\rangle$ is a coherent state with a second phase that is shifted 180 degrees relative to the first phase. At large $|\alpha|$, the two components of the cat state correspond to distinct quasi-classical wave-packets, drawing analogy to Schrödinger's symbolic paradox of an unfortunate cat inside a closed box being simultaneously dead and alive. Cat states have so far been realized with single-mode optical or microwave fields with up to about 100 photons, but are increasingly susceptible to decoherence as the number state increases in magnitude.

According to some embodiments, an entangled state across two quantum mechanical oscillators may be produced by entangling cat states of the oscillators. Techniques for producing such a state are discussed below, but initially properties of the entangled state will be described. The entangled state may be expressed as:

$$|\psi_\pm\rangle = \frac{1}{\sqrt{2}}(|\alpha\rangle_A|\alpha\rangle_B \pm |-\alpha\rangle_A|-\alpha\rangle_B) \quad \text{(Eqn. C1)}$$

where $|\pm\alpha\rangle_A$ and $|\pm\alpha\rangle_B$ are coherent states of two oscillator eigenmodes whose amplitudes are prepared to be equal for convenience. The two oscillators are referred to herein as "Alice" and "Bob." Each of the two modes are predominantly localized in one of the two oscillators that are weakly connected via the ancilla.

Despite a nonzero (but small) spatial overlap of the two modes, for convenience we refer to the two modes herein as the states of the two oscillators. For larger $|\alpha|$ (e.g., $|\alpha|^2 \geq 2$), $|\psi_\pm\rangle$ can be considered a single cat state living in two boxes whose superposed components are coherent states in a hybridized mode involving both Alice and Bob. Alternatively, in the more natural eigenmode basis, $|\psi_\pm\rangle$ may also be understood as two single-oscillator cat states that are entangled with each other.

Multi-oscillator cat states can be a useful way of encoding quantum information that allows fault-tolerant quantum computation, where quantum information is redundantly encoded in the coherent state basis of the multiple oscillators. In this context, the techniques described herein realize an architecture of two coupled logical qubits. The two-mode cat state can be considered a two-qubit Bell state $$\frac{1}{\sqrt{2}}(|0\rangle|0\rangle + |1\rangle|1\rangle)$$

of the logical qubits, where the first quasi-orthogonal coherent states $|\alpha\rangle$ represents the logical state $|0\rangle$ for each of the two oscillators and the second quasi-orthogonal coherent state $|-\alpha\rangle$ represents the logical state $|1\rangle$ for each of the two oscillators.

According to some embodiments, the quantum mechanical oscillators may be bosonic systems. In such cases, the two-mode cat state is an eigenstate of the joint boson number parity operator $P_J$:

$$P_J = P_A P_B = e^{i\pi a^\dagger a} e^{i\pi b^\dagger b} \quad \text{(Eqn. C2)}$$

where $a(a^\dagger)$ and $b(b^\dagger)$ are the annihilation (creation) operators of bosons in Alice and Bob, and $P_A$ and $P_B$ are the boson number parity operators on the individual oscillators. Remarkably, $|\psi_+\rangle$ (or $|\psi_-\rangle$) has definitively even (or odd) number of bosons in two cavities combined, while the boson number parity in each cavity is maximally uncertain. The error syndrome of the two-mode cat state may therefore be monitored by performing quantum non-demolition (QND) measurements of the cat state.

According to some embodiments, QND measurements of the joint parity may be performed by probing the two-mode cat state via the coupled ancilla. The results of such measurements, discussed below, are not only illustrative of the highly non-classical properties of the state, but also the fundamental tools for quantum error correction in general. According to some embodiments, the system may include a readout unit coupled to the ancilla (which is in turn coupled to each of the two quantum mechanical oscillators). The readout unit may be, for example, a resonating cavity that may be used to projectively measure the ancilla state. The readout unit may thereby provide for the above-mentioned QND measurements of the two oscillators, including but not limited to joint and/or single parity measurements of the oscillators.

Following below are more detailed descriptions of various concepts related to, and embodiments of, techniques for techniques for generating, manipulating and/or probing an entangled state across two quantum mechanical oscillators. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 33:
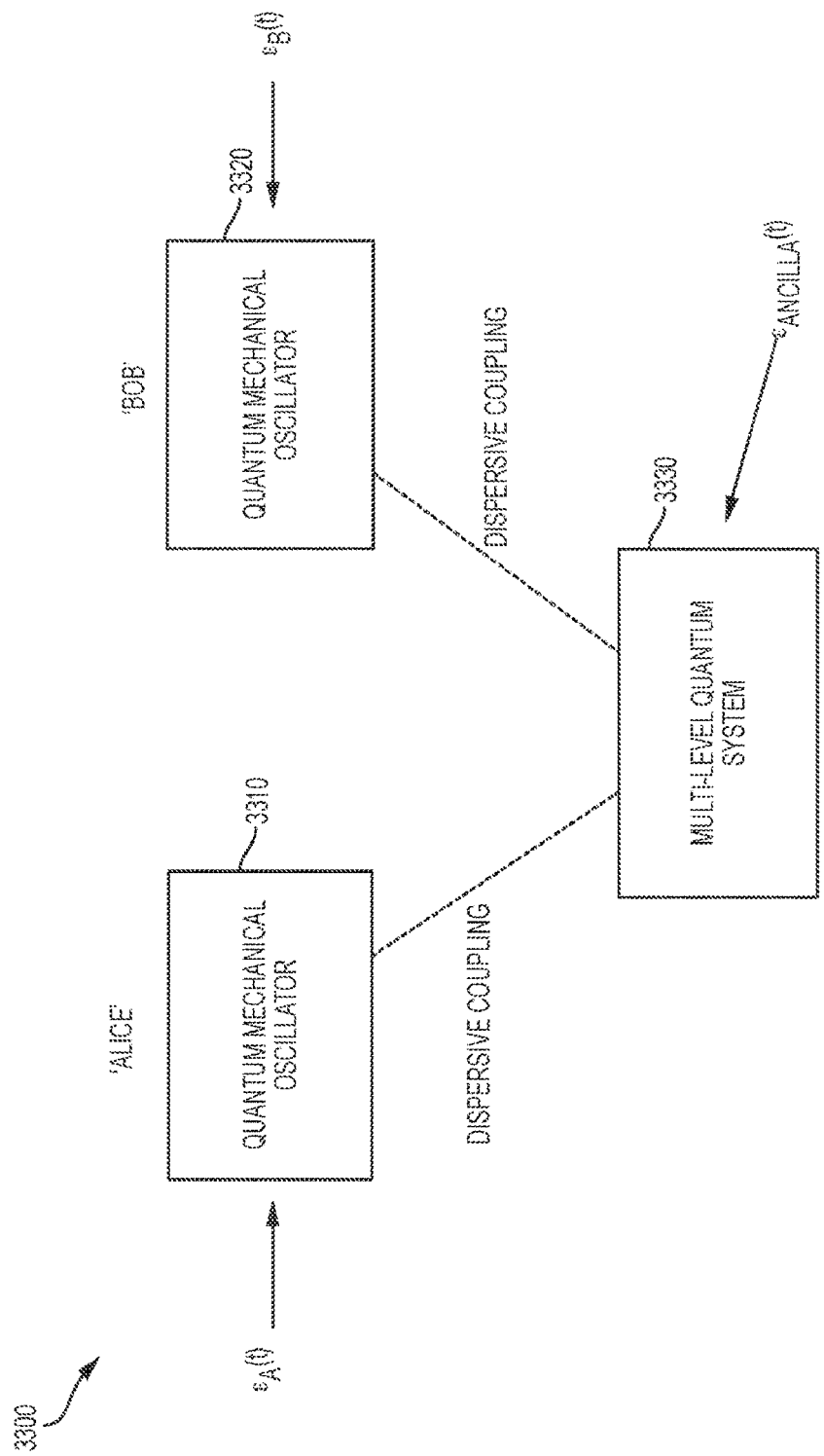
FIG. 33 is a block diagram of a circuit quantum electrodynamics system suitable for practicing aspects of the present disclosure.

FIG. 33 is a block diagram of a circuit quantum electrodynamics system suitable for practicing aspects of the present disclosure. System 3300 includes quantum mechanical oscillators 3310 ("Alice") and 3320 ("Bob") dispersively coupled to a multi-level quantum system 3330 ("ancilla"). An electromagnetic signal $\varepsilon_A(t)$ may be applied to the oscillator 3310, an electromagnetic signal $\varepsilon_B(t)$ may be applied to the oscillator 3320, and an electromagnetic signal $\varepsilon_{ancilla}(t)$ may be applied to the multi-level system 3330. Generally in the discussion below, application of such an electromagnetic signal or pulse may also be referred to as "driving" of the oscillator or ancilla. In some embodiments, the multi-level quantum system 3330 may be a nonlinear quantum system.

As discussed above, to manipulate the states of the two oscillators, the multi-level quantum system 3330 may be used as an ancilla. One or more energy levels of the multi-level system may be accessed in this process. For instance, the lowest two energy levels, the lowest three energy levels, etc. or any other group of energy levels may be accessed by $\varepsilon_{ancilla}(t)$ to produce interactions between the ancilla and the two oscillators via the respective dispersive couplings, examples of which are described below.

According to some embodiments, the Hamiltonian of system 3300 which includes two oscillator modes, a multi-level system, and their dispersive interactions can be written as:

$$H/\hbar = \omega_A a^\dagger a + \omega_B b^\dagger b + \omega_{ge}|e\rangle\langle e| + \tag{Eqn. C3}$$
$$(\omega_{ge} + \omega_{ef})|f\rangle\langle f| - \chi_A^{ge} a^\dagger a|e\rangle\langle e| - (\chi_A^{ge} + \chi_A^{ef})a^\dagger a|f\rangle$$
$$\langle f| - \chi_B^{ge} b^\dagger b|e\rangle\langle e| - (\chi_B^{ge} + \chi_B^{ef})b^\dagger b|f\rangle\langle f|$$

where $a(a^\dagger)$ and $b(b^\dagger)$ are the annihilation (creation) operators of energy quanta in the oscillators Alice and Bob, $|g\rangle$, $|e\rangle$ and $|f\rangle$ are the lowest three energy levels of the ancilla, $\omega_A$ and $\omega_B$ are the angular frequencies of the two oscillators (Alice and Bob), $\omega_{ge}$ and $\omega_{ef}$ are the $|e\rangle \rightarrow |g\rangle$ and $|f\rangle \rightarrow |e\rangle$ transition frequencies of the ancilla, and $\chi_i^{ge}$ and $\chi_i^{ef}$ (i=A or B) represent the dispersive frequency shifts of oscillator i associated with the two ancilla transitions. Small higher-order nonlinearities are neglected in Eqn. C1 for simplicity.

The time-dependent driving signals $\varepsilon_A(t)$, $\varepsilon_B(t)$ and $\varepsilon_{ancilla}(t)$, also referred to herein as "drive waveforms," may be applied to Alice, Bob and the ancilla, respectively, to realize arbitrary single qubit operations upon each of these elements. Such quantum logic gates between oscillator and ancilla states are the key tools for deterministic generation and manipulation of the two-mode cat state $|\psi_\pm\rangle$, for example, and for enabling continuous-variable-based quantum computation.

A process for producing the two mode entangled cat state described above has been recognized and appreciated with respect to the two oscillators of system 3300, that may be broadly described as follows. Initially, the multi-level quantum system 3330 may be manipulated into a superposition of two energy levels. One approach to produce this result may be to drive the ancilla with $\varepsilon_{ancilla}(t)$ to produce a rotation of the ancilla state in the $|g\rangle - |e\rangle$ Bloch sphere. Irrespective of how the ancilla is arranged to be in this state, each oscillator may subsequently be driven by a displacement conditional on the state of the ancilla, which entangles each oscillator with the state of the ancilla. For instance, if the conditional displacement is applied with each oscillator in the $|0\rangle$ state and the displacement is conditional on the ancilla being in $|g\rangle$, the displacement realizes a three-way entangling gate:

$$\frac{1}{\sqrt{2}}(|g\rangle + |e\rangle)|0\rangle_A|0\rangle_B \rightarrow \frac{1}{\sqrt{2}}(|g\rangle|0\rangle_A|0\rangle_B + |e\rangle|2\alpha\rangle_A|2\alpha\rangle_B) \tag{Eqn. C4}$$

Subsequently, another rotation operation can be applied to the ancilla that is conditional on the joint oscillator state, which disentangles the ancilla and leaves the oscillators in a two-mode cat state.

According to some embodiments, the state-dependent frequency shifts ($\chi$'s) of each oscillator with respect to each ancilla transition are arranged to allow cavity state manipulations conditioned on the ancilla level, or vice versa, using spectrally-selective control pulses. In practice, such an arrangement comprises forming the oscillators and ancilla system to have different resonant frequencies that enabled such manipulations. An example of one such arrangement is discussed below.

Figure 34:
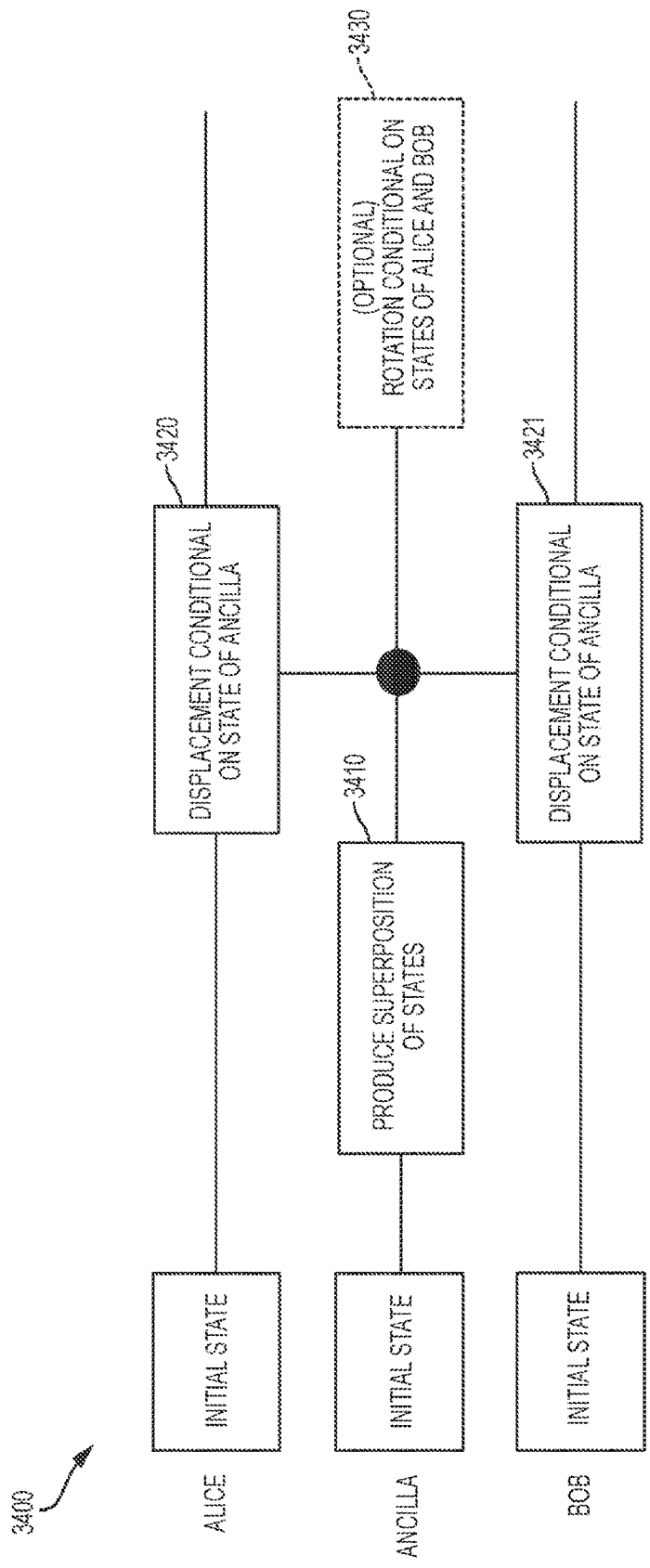
FIG. 34 illustrates a control sequence for producing cat states spanning modes of two quantum mechanical oscillators, according to some embodiments.

This above-described cat state entanglement process is illustrated in FIG. 34, which shows a control sequence for producing cat states spanning modes of two quantum mechanical oscillators, according to some embodiments. Control sequence 3400 illustrates the states of Alice, Bob and the Ancilla system with time running left to right in the figure.

In illustrative control sequence 3400, Alice, Bob and the Ancilla system begin in distinct initial states. In some embodiments, the three systems have initial states that are ground states of the respective systems. For instance, Alice and Bob may be in the $|0\rangle$ state and the ancilla may be in the $|g\rangle$ state. While these initial states may represent convenient starting points for the illustrated control sequence, other initial states may be contemplated so long as the described entanglement between cat states can be produced.

In act 3410, the ancilla is controlled to be in a superposition of states. This may be achieved by driving the ancilla with a driving signal to cause a rotation of the quantum state of the ancilla on a Bloch sphere associated with two eigenstates of the ancilla. The superposition may be a superposition of any number of the energy levels of the multi-level ancilla system, and any superposition of these energy levels may be produced. The key steps in control sequence 3400 are the conditional displacements 3420 and 3421, which are conditional on the state of the ancilla and produce entanglement between the ancilla and each of the two oscillators. So long as these displacements may be made conditional on states of the superposition of the ancilla produced in act 3410 to produce such entanglement, any suitable superposition may be produced in act 3410.

In acts 3420 and 3421, gates are applied to Alice and Bob, respectively, that coherently add (or remove) energy to (or from) the oscillator conditional on the state of the coupled ancilla. Since the ancilla is in a superposition of states at this stage, making the displacements 3420 and 3421 conditional on at least one of those states of the superposition produces a superposition of states in the respective oscillator that is entangled with the state of the ancilla.

In optional act 3430, a rotation may be applied to the ancilla conditional on the states of Alice and Bob. This rotation may disentangle the ancilla from the oscillators, yet may leave the oscillators entangled with one another via their (weak) couplings through the ancilla.

Figure 35B:
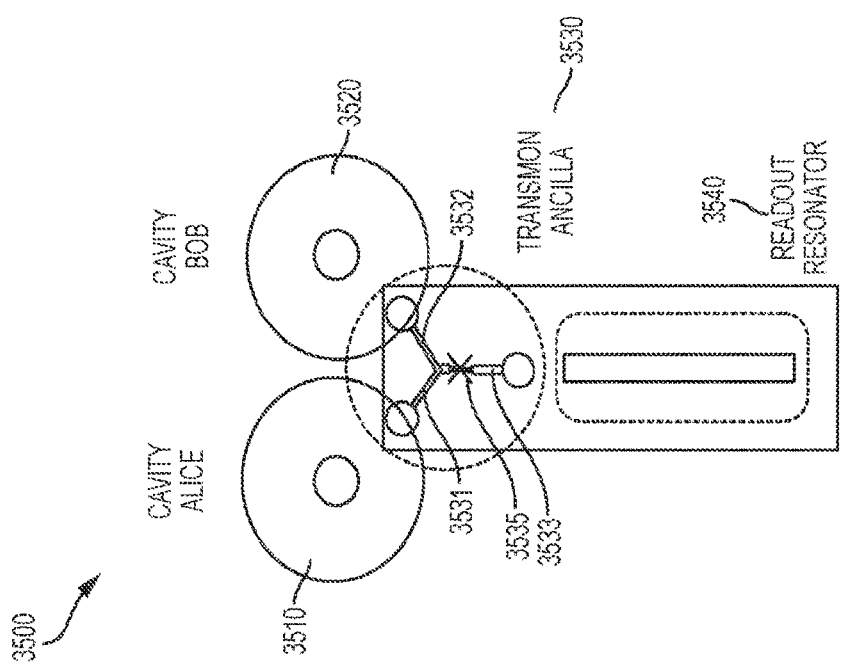
FIG. 35B is a top view of the system shown in FIG. 35A, according to some embodiments.
Figure 35A:
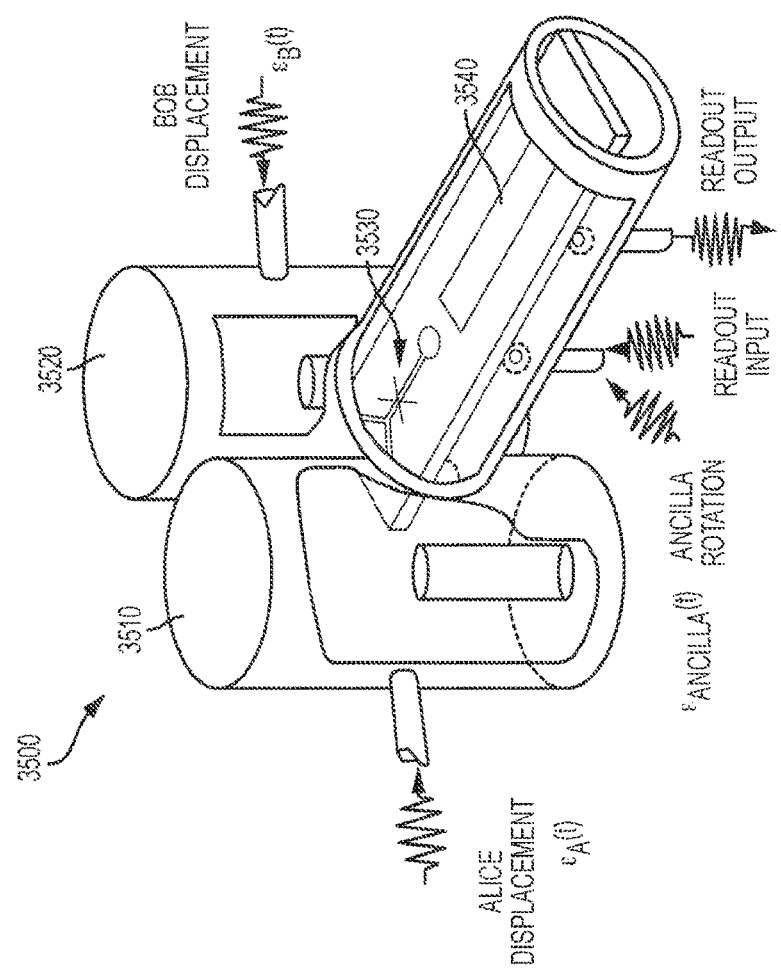
FIG. 35A is a three-dimensional schematic of an illustrative circuit quantum electrodynamics system comprising two coaxial resonator cavities and a readout resonator coupled to an ancilla transmon, according to some embodiments.

To illustrate one possible experimental realization of system 3300 shown in FIG. 33, FIGS. 35A and 35B depict an illustrative circuit quantum electrodynamics (cQED) system comprising two coaxial resonator cavities coupled to an ancilla transmon, according to some embodiments. In system 3500, which is a three-dimensional schematic of the device shown in FIG. 35A, resonators 3510 and 3520 function as quantum mechanical oscillators 35310 and 35320 in the system of FIG. 33, and transmon 3530 functions as the multi-level quantum system 3330 in the system of FIG. 33. The resonators 3510 and 3520, as illustrated, are coaxial cavities formed from aluminum.

In the example of FIGS. 35A-35B, the cQED system also includes a quasi-planar linear resonator that may be operated to readout the state of the ancilla transmon. The amplitude and phase of the pulse produced by the readout resonator near its resonance frequency both depend on the quantum state of the ancilla transmon. The resonator is formed by the resonator cavity shown in FIG. 35A and by the stripline on the transmon chip which is the central element of the coaxial arrangement shown. The transmon features three antennas 3531, 3532 and 3533, which are coupled to the cavity 3510, cavity 3520 and readout resonator 3540, respectively. Josephson junction 3535 is coupled to each of the antennas.

Figure 36:
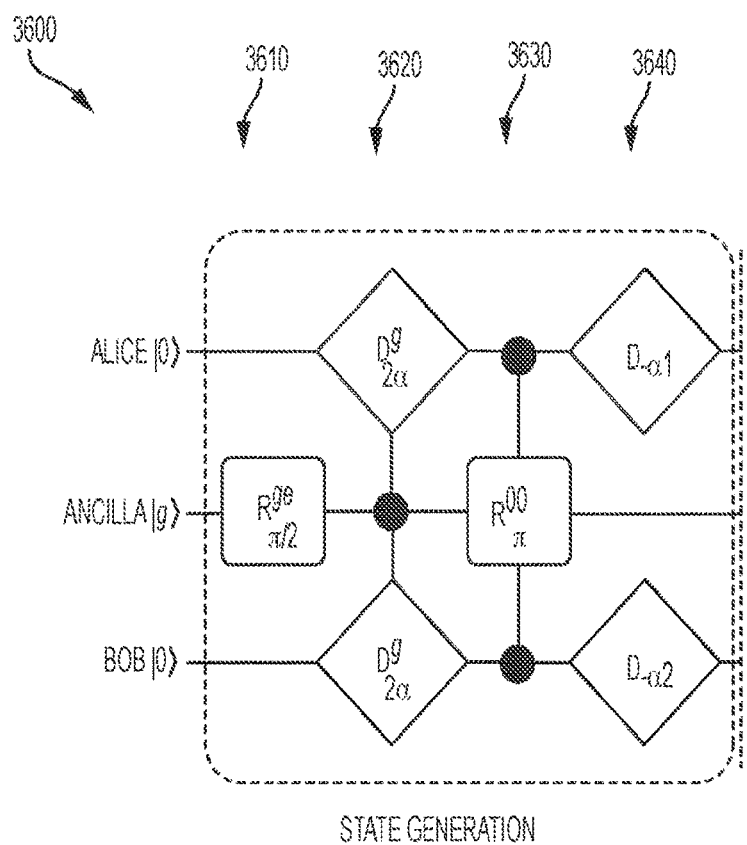
FIG. 36 illustrates an alternative control sequence suitable for producing cat states spanning modes of two quantum mechanical oscillators, according to some embodiments.
Figure 37:
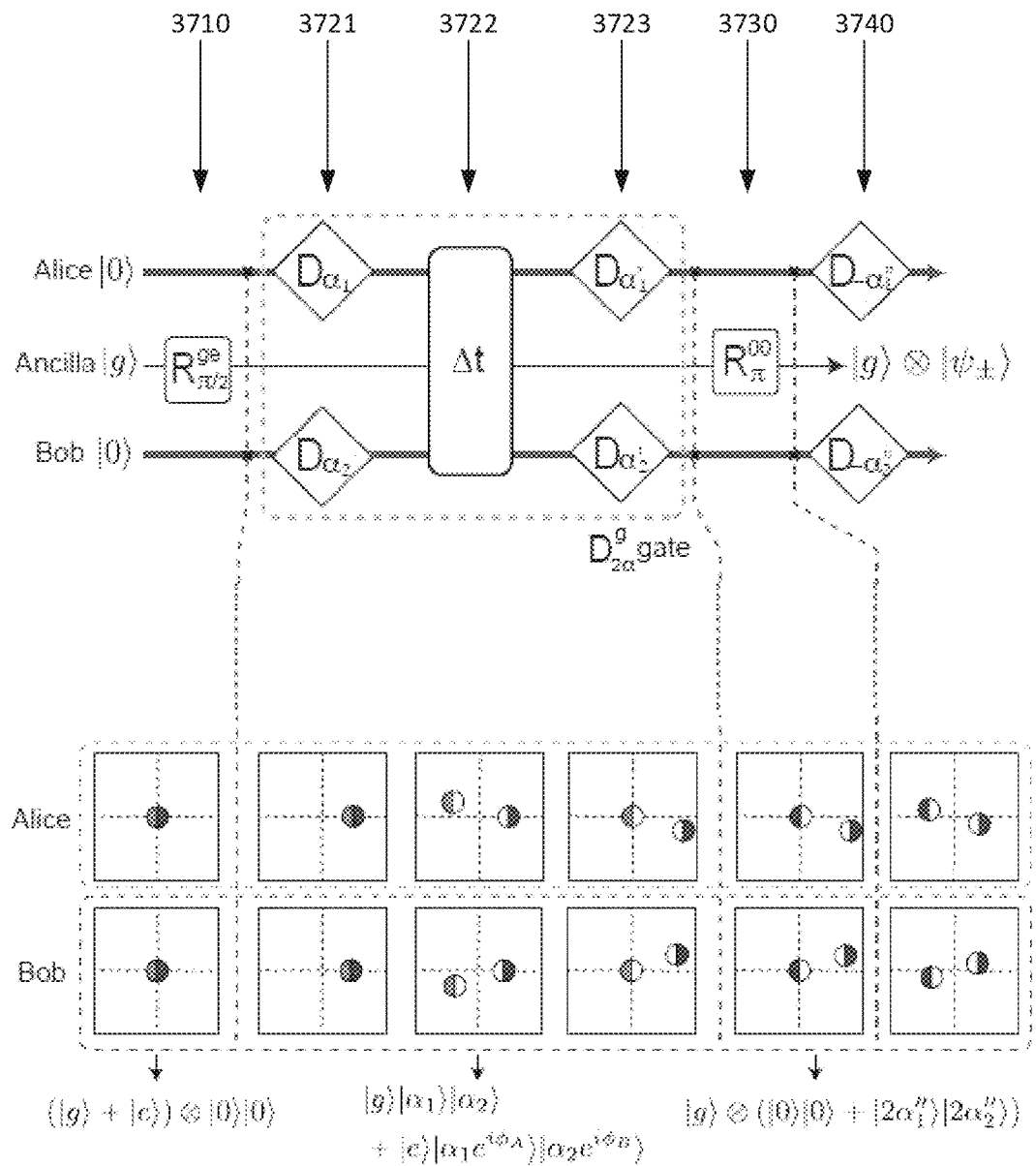
FIG. 37 illustrates a control sequence suitable for producing cat states spanning modes of two quantum mechanical oscillators in which conditional displacements upon the oscillators are each realized by two non-conditional displacements, according to some embodiments.
Figure 38A:
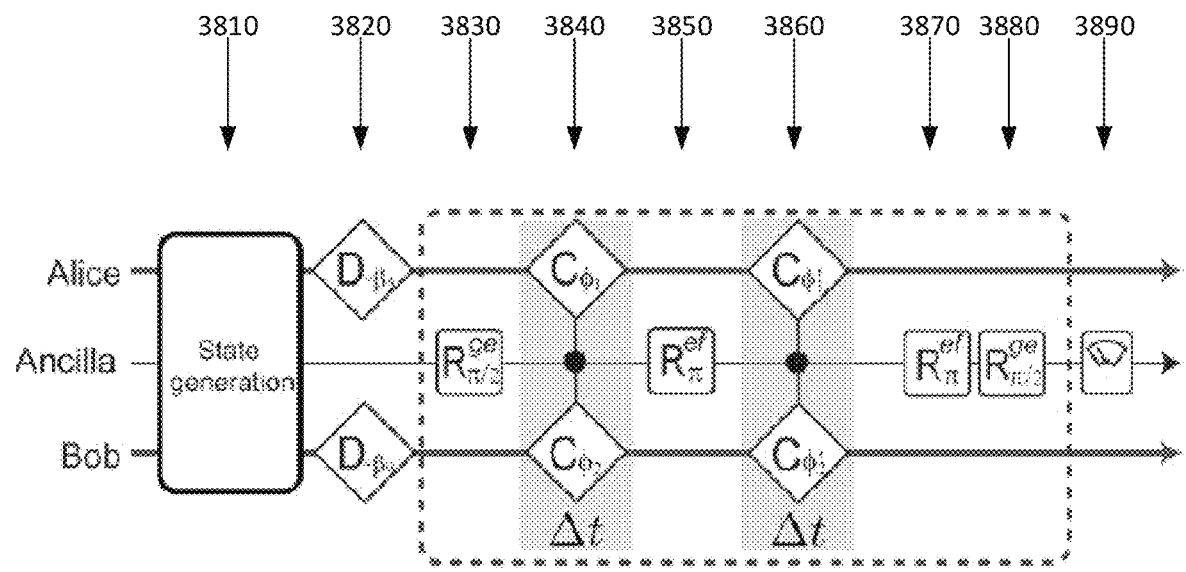
FIGS. 38A-38B are illustrative control sequences depicting two approaches to experimentally measuring the joint parity of two quantum mechanical oscillators, according to some embodiments.
Figure 38B:
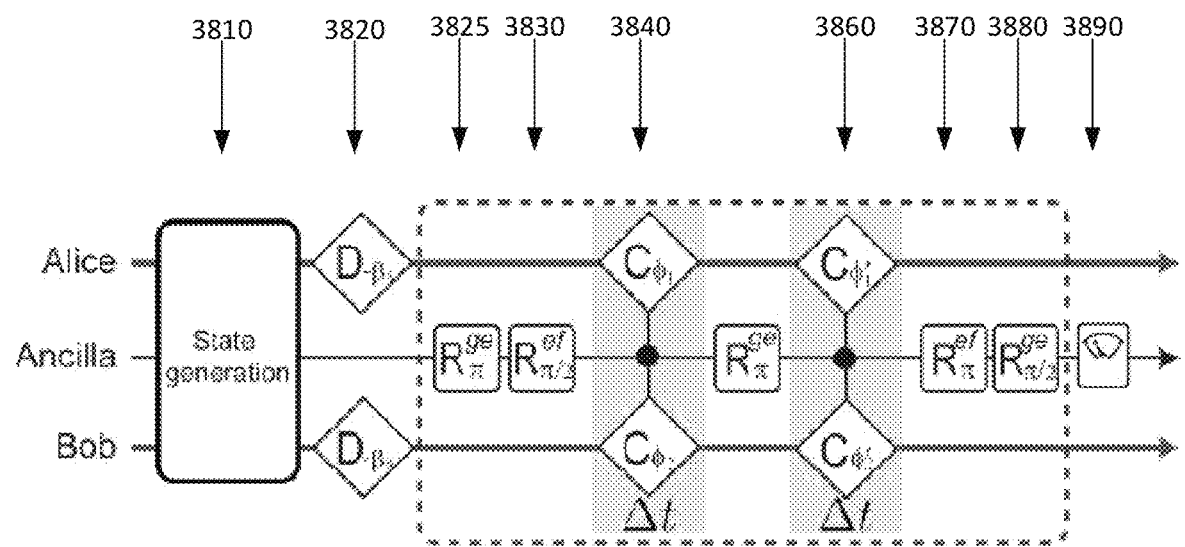
Figure 39:
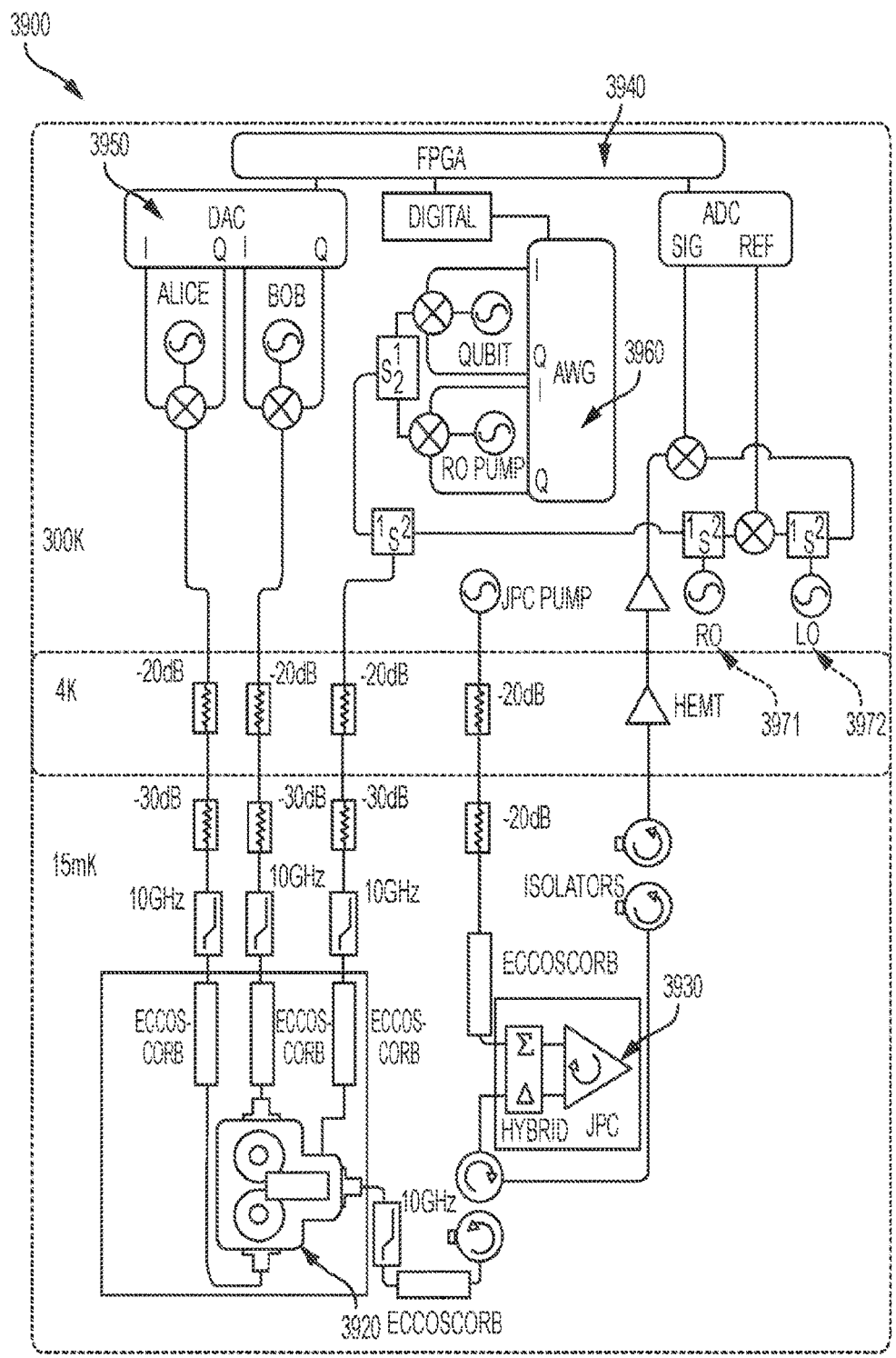
FIG. 39 is a circuit diagram of an illustrative experimental setup for controlling and/or measuring a system of two quantum mechanical oscillators coupled to an ancilla multi-level quantum system, according to some embodiments.

The illustrative cQED system 3500 shown in FIGS. 35A-35B is explored in more detail below, with FIG. 36 depicting a specific control sequence for producing a two-mode cat state across the resonator cavities 3510 and 3520; FIG. 37 depicting an illustrative technique for effectively producing a conditional displacement on the resonator cavities by applying two non-conditional displacements with a waiting period in between; FIGS. 38A-38B depicting two illustrative control sequences for experimentally measuring the joint parity of the two resonator cavities; FIG. 39 illustrates an experimental setup for operation of system 3500; and FIGS. 40A-40C depict a physical implementation of system 3500 from a block of high-purity aluminum.

While many experimental implementations and configurations may be envisioned based on the type of cQED system shown in FIGS. 35A-35B, one illustrative configuration in terms of the properties of each resonator and the transmon will be described. Table C1 below shows the Hamiltonian parameters of each component of an illustrative embodiment of system 3500, including the transmon ancilla, the two cavity resonators (Alice and Bob) and the readout resonator. The measured parameters include all transition frequencies ($\omega/2\pi$), dispersive shifts between each resonator and each transmon transition ($\chi/2\pi$), the self-Kerr of Alice ($K_A/2\pi$) and Bob ($K_B/2\pi$), and the cross-Kerr interaction between Alice and Bob ($K_{AB}/2\pi$). The Kerr parameters and $\chi^{ef}$ associated with the readout resonator are theoretical estimates based on the other measured parameters.

TABLE C1

| | Frequency $\omega/2\pi$ | Nonlinear Alice $\chi_A/2\pi$ | interactions Bob $\chi_B/2\pi$ | versus: Readout |
|---|---|---|---|---|
| $\|e\rangle \to \|g\rangle$ | 4.87805 GHz | 0.71 MHz | 1.41 MHz | 1.74 MHz |
| $\|f\rangle \to \|e\rangle$ | 4.76288 GHz | 1.54 MHz | 0.93 MHz | 1.63 MHz |
| Alice | 4.2196612 GHz | 0.83 kHz | −9 kHz | 5 kHz |
| Bob | 5.4467677 GHz | −9 kHz | 5.6 kHz | 12 kHz |
| Readout | 7.6970 GHz | 5 kHz | 12 kHz | 7 kHz |

In the example of Table C1, it will be noted that $\omega_A < \omega_{ef} < \omega_{ge} < \omega_B$. As discussed below in relation to FIGS. 38A-38B, this arrangement allows for measurements of the joint parity of the resonators without the requirement that $\chi_A^{ge}$ is exactly equal to $\chi_B^{ge}$.

FIG. 36 illustrates a control sequence suitable for producing cat states spanning modes of two quantum mechanical resonators, according to some embodiments. Control sequence 3600 may be applied to system 3500 shown in FIGS. 35A-35B, for example.

In the example of FIG. 36, resonators Alice and Bob and the Ancilla transmon, are initially in ground states $|0\rangle$ state and $|g\rangle$, respectively. In act 3610, an ancilla superposition is prepared by performing a rotation $R_{\pi/2}^{ge}$ that is an ancilla rotation of $\pi/2$ in the X-Y plane of the Bloch sphere of the $|g\rangle-|e\rangle$ manifold. This places the ancilla in an equal superposition of the ground and excited states, $$\frac{1}{\sqrt{2}}(|g\rangle + |e\rangle).$$

In act 3620, conditional displacements $D_{2\alpha}^g$ are applied to each of the two cavities. By applying the time-dependent microwave control pulses $\varepsilon_A(t)$ and $\varepsilon_B(t)$ to the cavities, arbitrary cavity state displacements may be produced in Alice ($D_{\beta_A} = e^{\beta_A a^\dagger - \beta_A^* a}$) and Bob ($D_{\beta_B} = e^{\beta_B b^\dagger - \beta_B^* b}$) independently. In the example of FIG. 36, the conditional displacements are operations that would put the respective resonators in the $|2\alpha\rangle$ state (add energy to move the state from $|0\rangle$ to $|2\alpha\rangle$) when the coupled ancilla transmon is in the $|g\rangle$ state. The net result of these displacements is to realize a three-way entangling gate:

$$\frac{1}{\sqrt{2}}(|g\rangle + |e\rangle)|0\rangle_A|0\rangle_B \to \frac{1}{\sqrt{2}}(|g\rangle|0\rangle_A|0\rangle_B + |e\rangle|2\alpha\rangle_A|2\alpha\rangle_B)$$

In act 3630, an ancilla rotation ($R_\pi^{00}$) conditional on the cavity state $|0\rangle_A|0\rangle_B$ disentangles the ancilla and leaves the cavities in a two-mode cat state. That is, the ancilla returns to $|g\rangle$ yet the cavities remain in the $$\frac{1}{\sqrt{2}}(|0\rangle_A|0\rangle_B + |2\alpha\rangle_A|2\alpha\rangle_B)$$

state.

In act 3640, additional displacements $D_{-\alpha}$ are applied to the cavities. These are unconditional displacements of Alice and Bob ($D_{-\alpha}$) to center the cat state in the phase space. This is a trivial step purely for the convenience of the presentation, and produces a cat state:

$$\frac{1}{\sqrt{2}}(|-\alpha\rangle_A|-\alpha\rangle_B + |\alpha\rangle_A|\alpha\rangle_B).$$

As discussed above, the conditional displacement ($D_{2\alpha}^g$) is what allows the entangling of the ancilla with the cavities, and therefore allows the generation of an entangled state between the two cavities. This operation can be directly implemented using cavity drives with a bandwidth smaller than the dispersive interaction strength ($\chi_i^{ge}$, i=A or B). However, this method requires a comparatively long pulse duration (and therefore higher infidelity due to decoherence and Kerr effects). An alternative method for producing the conditional displacement ($D_{2\alpha}^g$) is shown in FIG. 37.

FIG. 37 illustrates a control sequence in which the conditional displacement $D_{2\alpha}^g$ is effectively realized by two unconditional displacements separated by a wait time $\Delta t$ in between. In the example of FIG. 37, steps 3710, 3730 and 3740 are equivalent to steps 3610, 3630 and 3640 shown in FIG. 36. The difference between FIG. 36 and FIG. 37 is that steps 3721, 3722 and 3723 together effectively implement step 3620 in FIG. 36—that is, the conditional displacement $D_{2\alpha}^g$.

In step 3721, non-conditional displacements $D_{\alpha_1}$ and $D_2$ are applied to Alice and Bob, respectively, resulting in the product state of the two cavities being $|\alpha_1\rangle|\alpha_2\rangle$. In some embodiments, the two displacements may have equal magnitude and phase (e.g., $\alpha_1=\alpha_2$). In step 3722, a wait time $\Delta t$ is performed, during which time the states in Alice and Bob accumulate conditional phases that are dependent on the state of the ancilla, represented by the unitary operator U(t). Specifically, during the wait time $\Delta t$, due to the dispersive interactions between each cavity and the ancilla, cavity coherent states in both cavities accumulate conditional phases of $\phi_i = \chi_i^{ge}\Delta t$ if the ancilla is in $|e\rangle$:

$$U(\Delta t) = I_A \otimes I_B \otimes |g\rangle\langle g| + e^{i\phi_A a^\dagger a} \otimes e^{i\phi_B b^\dagger b} \otimes |e\rangle\langle e| \qquad \text{(Eqn. C5)}$$

The net result is that the states of the cavities evolve into a three-way entangled state in the manner:

$$\frac{1}{\sqrt{2}}(|g\rangle+|e\rangle)|\alpha_1\rangle|\alpha_2\rangle \to \frac{1}{\sqrt{2}}(|g\rangle|\alpha_1\rangle|\alpha_2\rangle + |e\rangle|\alpha_1 e^{i\phi_A}\rangle|\alpha_2 e^{i\phi_B}\rangle)$$

An additional displacement applied in act 3723 to each cavity after this time evolution step effectively arrives at the same result as the conditional displacement described above. Using the IQ plane to describe the photon probability distribution in each cavity in the rotating frame, a coherent state $|\alpha'\rangle_i$ can be represented by a (Gaussian) circle that stays stationary when the ancilla is in $|g\rangle$, and rotates with the angular velocity $\chi_i^{ge}$ when the ancilla is in $|e\rangle$: $|\alpha'\rangle_i \to |\alpha' e^{i\chi_i^{ge}\Delta t}\rangle_i$. Therefore, this conditional phase gate can split cavity coherent state in the phase space when the ancilla is prepared in $$\frac{1}{\sqrt{2}}(|g\rangle+|e\rangle),$$

effectively realizing a conditional displacement.

FIGS. 38A-38B are illustrative control sequences depicting two approaches to experimentally measuring the joint parity of two quantum mechanical oscillators, according to some embodiments. As discussed above, measurement of joint parity number is important both to understand the two-mode cat state and to be able to detect error syndromes and correct them to maintain the state via quantum error correction techniques.

For the illustrative system 3500 shown in FIGS. 35A-35B, the joint parity measurement is a joint photon number parity, $P_J$, measurement. This single-cavity photon parity measurements using only the only $|g\rangle$ and $|e\rangle$ levels of an ancilla qubit is applicable to one cavity when the other cavity is in the vacuum state. The measurement uses the dispersive interaction $\chi_i^{ge}$ to map even-photon-number and odd-photon-number states in the cavity of interest (i=A or B) to different levels of the ancilla. This may be realized by two $\pi/2$ rotations of the ancilla qubit, $R_{\pi/2}^{ge}$ (around the same axis, e.g., the X-axis), separated by a wait time of $\pi/\chi_i^{ge}$. For example, if Bob is in the vacuum state ($b^\dagger b|0\rangle=0$), the conditional phase shift described in Eqn. C5 over the time $\Delta t = \pi/\chi_A^{ge}$ is described by the following unitary operator:

$$U(\pi/\chi_A^{ge}) = C_\pi^A = |\otimes|g\rangle\langle g| + e^{i\pi a^\dagger a} \otimes |e\rangle\langle e| \qquad \text{(Eqn. C6)}$$

This shift is equivalent to a qubit Z-rotation of $\pi$ conditioned on the photon number in Alice being odd because $e^{i\pi a^\dagger a} = P_A$. Therefore the whole sequence $R_{\pi/2}^{ge} C_\pi^A R_{\pi/2}^{ge}$ flips the qubit if and only if the photon number parity in Alice is even, and therefore a subsequent readout of the qubit state measures the parity of the cavity.

This control and measurement sequence to measure parity in a single cavity can in principle be implemented to also measure the joint photon number parity, but only if $\chi_A^{ge}$ is exactly equal to $\chi_B^{ge}$. This is because for a wait time of $\Delta t = \pi/\chi_A^{ge} (= \pi/\chi_B^{ge})$ from Eqn. C5 we have:

$$U(\pi/\chi_i^{ge}) = C_\pi^A C_\pi^B = |\otimes|g\rangle\langle g| + P_A P_B \otimes |e\rangle\langle e| \qquad \text{(Eqn. C7)}$$

Noting $P_J = P_A P_B$, an identical control sequence of $R_{\pi/2}^{ge}U(\Delta t)R_{\pi/2}^{ge}$; followed by a qubit readout would achieve the joint parity measurement. However, without strictly identical $\chi_A^{ge}$ and $\chi_B^{ge}$, the phase accumulation in one cavity is faster than the other, and it is in general not possible to realize parity operators in both cavities simultaneously using this simple protocol. Moreover, for a general two-cavity quantum state, this sequence cannot measure single-cavity parity operator ($P_A$ or $P_B$) due to inevitable entanglement between the ancilla and the photons in the other cavity during the process.

According to some embodiments, one technique for measuring $P_J$ with a less stringent requirement on Hamiltonian parameters works by exploiting the $|f\rangle$-level of the ancilla. This method is may be advantageous when $|e\rangle \to |g\rangle$ transition of the ancilla shows stronger interaction with Bob ($\chi_B^{ge} > \chi_A^{ge}$), while the $|f\rangle \to |e\rangle$ transition shows stronger interaction with Alice ($\chi_A^{ef} > \chi_B^{ef}$). This can be physically realized by engineering the ancilla frequency between the two cavities, i.e. $\omega_A < \omega_{ef} < \omega_{ge} < \omega_B$.

Considering the quantum state with two cavities and three ancilla levels in general, the unitary evolution for any wait time $\Delta t$ is:

$$U(\Delta t) = I_A \otimes I_B \otimes |g\rangle\langle g| + e^{i\phi_A a^\dagger a} \otimes e^{i\phi_B b^\dagger b} \otimes |e\rangle\langle e| + e^{i\phi'_A a^\dagger a} \otimes e^{i\phi'_B b^\dagger b} \otimes |f\rangle\langle f| \qquad \text{(Eqn. C8)}$$

where $$\phi_A = \chi_A^{ge}\Delta t, \phi_B = \chi_B^{ge}\Delta\Delta t$$

$$\phi'_A = \chi_A^{gf}\Delta t, \phi'_B = \chi_B^{gf}\Delta t \qquad \text{(Eqn. C9)}$$

Here we define $\chi_A^{gf} \equiv \chi_A^{ge} + \chi_A^{ef}$ and $\chi_B^{gf} \equiv \chi_B^{ge} + \chi_B^{ef}$. Therefore, the two cavities simultaneously acquire conditional phases in their coherent state components at relative rates that differ for $|e\rangle$ and $|f\rangle$. FIGS. 38A and 38B illustrate two different pulse sequences for realizing a joint parity measurement without the requirement that $\chi_A^{ge}$ and $\chi_B^{ge}$ are equal. In both FIG. 38A and FIG. 38B, step 3810 represents the generation of a state between two oscillators (Alice and Bob) and an ancilla. Step 3810 may comprise, for instance, control sequence 3400 shown in FIG. 34 or control sequence 3600 shown in FIG. 36. Step 3820 in each of FIG. 38A and FIG. 38B are initial displacements of the cavities.

In the example of FIG. 38A, for a given two-cavity quantum state $\Psi_{AB}$, we can first use a $R_{\pi/2}^{ge}$ rotation in act 3830 to prepare the ancilla in the state $$\frac{1}{\sqrt{2}}(|g\rangle+|e\rangle).$$

Then, a wait time $\Delta t_1$ in act 3840 imparts phases $\phi_{A1} = \chi_A^{ge}\Delta t_1$ and $\phi_{B1} = \chi_B^{ge}\Delta t_1$ to the two cavities for the $|e\rangle$ component of the state:

$$\Psi_{AB} \otimes \frac{1}{\sqrt{2}}(|g\rangle+|e\rangle) \qquad \text{(Eqn. C10)}$$

$$\Rightarrow \frac{1}{\sqrt{2}}\left[\Psi_{AB}\otimes|g\rangle + e^{i\phi_{A1}a^\dagger a}e^{i\phi_{B1}b^\dagger b}\Psi_{AB}\otimes|e\rangle\right]$$

Next, in act 3850 the |e> component in this intermediate state is converted to |f> by a π rotation in the |e>–|f> space, $R_\pi^{ef}$. Subsequently, a second wait time $\Delta t_2$ in act 3860 leads to a second simultaneous conditional phase gate, imparting phases $\phi_{A2}=\chi_A^{gf}\Delta t_2$ and $\phi_{B2}=\chi_B^{gf}\Delta t_2$ to the two cavities for the now |f> component of the state:

$$\frac{1}{\sqrt{2}}[\Psi_{AB}\otimes|g\rangle + e^{i\phi_{A1}a^\dagger a}e^{i\phi_{B1}b^\dagger b}\Psi_{AB}\otimes|f\rangle] \Rightarrow \quad \text{(Eqn. C11)}$$

$$\frac{1}{\sqrt{2}}[\Psi_{AB}\otimes|g\rangle + e^{i(\phi_{A1}+\phi_{A2})a^\dagger a}e^{i(\phi_{B1}+\phi_{B2})b^\dagger b}\Psi_{AB}\otimes|f\rangle]$$

The |f> component is then converted back to |e> by another $R_\pi^{ef}$ pulse in act 3870. When $\Delta t_1$ and $\Delta t_2$ satisfy the following equations:

$$\phi_{A1}+\phi_{A2}=\chi_A^{ge}\Delta t_1+\chi_A^{gf}\Delta t_2=\pi$$

$$\phi_{B1}+\phi_{B2}=\chi_B^{ge}\Delta t_1+\chi_B^{gf}\Delta t_2=\pi \quad \text{(Eqn. C12)}$$

the obtained quantum state is:

$$\frac{1}{\sqrt{2}}[\Psi_{AB}\otimes|g\rangle + P_J\Psi_{AB}\otimes|e\rangle] \quad \text{(Eqn. C13)}$$

effectively realizing the simultaneous controlled π-phase gate ($C_\pi^A C_\pi^B$) in Eqn. C7. Finally, a $R_{\pi/2}^{ge}$ pulse in act 3880 completes the projection of joint parity to the ancilla |g>, |e> levels, ready for readout through the readout resonator in act 3890.

The condition for finding non-negative solutions for $\Delta t_1$ and $\Delta t_2$ in Eqn. C12 is that $\chi_A^{ge}-\chi_B^{ge}$ and $\chi_A^{gf}-\chi_B^{gf}$ have opposite signs. In essence, the cavity that acquires phase slower than the other at |e> due to smaller $\chi_i^{ge}$ is allowed to catch up at |f> using its larger $\chi_i^{gf}$.

It should be noted that such relative relation of χ's is just a practically preferred condition rather than an absolute mathematical requirement. This is because parity mapping can be achieved whenever both cavities acquire a conditional phase of π modulo 2π. It is always possible to allow extra multiples of 2π phases applied to the cavity with stronger dispersive coupling to the ancilla, although it increases the total gate time and incurs more decoherence. The most important ingredient in engineering the $P_J$ operator is the extra tuning parameter $\Delta t_2$ (in addition to $\Delta t_1$) that allows two equations such as Eqn. C12 to be simultaneously satisfied.

This extra degree of freedom also enables measurement of photon number parity of a single cavity, $P_A$ or $P_B$, for an arbitrary two-cavity quantum state. This alternative can be realized with the same control sequences as shown in FIG. 38A whilst choosing such wait times that one cavity acquires a conditional π phase (modulo 2π) while the other acquires 0 phase (modulo 2π). For example, to measure $P_A$ we use $\Delta t_1$ and $\Delta t_2$ satisfying:

$$\phi_{A1}+\phi_{A2}=\chi_A^{ge}\Delta t_1+\chi_A^{gf}\Delta_2=\pi(\text{mod }2\pi)$$

$$\phi_{B1}+\phi_{B2}=\chi_B^{ge}\Delta t_1+\chi_B^{gf}\Delta t_2=0(\text{mod }2\pi) \quad \text{(Eqn. C14)}$$

FIG. 38B shows this alternative version of joint parity mapping protocol, which uses more ancilla operations, but is more adaptive to a larger parameter space of χ's. In this protocol, the ancilla spends time at |e>–|f> superposition, when conditional phases proportional to $\chi_i^{ef}$ are applied to the cavities. To achieve joint parity mapping, the two time intervals $\Delta t_1$ and $\Delta t_2$ therefore should satisfy:

$$\phi_{A1}+\phi_{A2}=\chi_A^{ef}\Delta t_1+\chi_A^{gf}\Delta_2=\pi(\text{mod }2\pi)$$

$$\phi_{B1}+\phi_{B2}=\chi_B^{ef}\Delta t_1+\chi_B^{gf}\Delta t_2=0(\text{mod }2\pi) \quad \text{(Eqn. C15)}$$

which can avoid the use of extra 2π phases when a $\chi_A^{ef}-\chi_B^{ef}$ has opposite sign versus $\chi_A^{gf}-\chi_B^{gf}$.

Experimentally, choices of which parity mapping sequence to apply (FIG. 38A or FIG. 38B) and gate times $\Delta t_1$ and $\Delta t_2$ involve trade-offs in various aspects such as pulse speed/bandwidth and coherence time. For the sequence of FIG. 38A, $\Delta t_1=0$, $\Delta t_2=184$ ns has been experimentally implemented. For the sequence of FIG. 38B, $\Delta t_1=28$ ns, $\Delta t_2=168$ ns has been experimentally implemented. The actual effective wait time is longer due to the non-zero duration (16 ns) of each ancilla rotation. The first protocol, with this choice of wait times, does not yield the exact π phases required for exact parity mapping (We estimate $\phi_{A1}+\phi_{A2}=0.97\pi$ and $\phi_{B1}+\phi_{B2}=1.03\pi$. These phase errors lead to an estimated infidelity of the joint parity measurement of about 3% for the two-cavity states under this study. Exact phases can be achieved with longer wait times so that $\phi_{A1}+\phi_{A2}=3\pi$ and $\phi_{B1}+\phi_{B2}=5\pi$, but the infidelity due to decoherence and high-order Hamiltonian terms outweighs the benefits. In principle, the second protocol that achieves exact π phases at relatively short total gate time should be more advantageous. However, using the second protocol, we observe visibly identical results of joint Wigner tomography of the two-mode cat states with fidelity nearly equal to the first protocol. This may be attributed to extra infidelity from the more complicated ancilla rotations involved in the second protocol.

FIG. 39 is a circuit diagram of an illustrative experimental setup for controlling and/or measuring a system of two quantum mechanical oscillators coupled to an ancilla multi-level quantum system, according to some embodiments. System 3900 includes a cQED system 3920 which may, for example, be cQED system 3500 shown in FIGS. 35A-35B or some other cQED system suitable for practicing the techniques described herein.

System 3900 includes three temperatures stages at 15 mK, 4K and 3500K, where the cQED system 3920 is operated at the 15 mK stage. For instance, the cQED system 3920 may be installed inside a Cryoperm magnetic shield and thermalized to the mixing chamber of a dilution refrigerator with a base temperature of 15 mK. Low-pass filters and infrared (eccosorb) filters may be used to reduce stray radiation and photon shot noise. A Josephson parametric converter (JPC) 3930 is also mounted to the 15 mK stage, connected to the output port of the device package via circulators, providing near-quantum-limited amplification.

In the example of FIG. 39, a field programmable gate array (FPGA) 3940 operates both the quantum-control pulse sequences and the data acquisition process. In some cases, the FPGA may access stored waveforms for application to Alice, Bob and the Ancilla (e.g., for performing rotations, displacements, etc. as described above). In other cases, the FPGA may be programmed to compute rather than store waveforms in real time. This latter approach may lead to lower (or minimal) usage of waveform memory for a large number of different cavity displacements, allowing many measurements in a single run.

In the example of FIG. 39, cavity drives and transmon drives are generated by sideband-modulation of continuous-wave (CW) carrier tones produced by respective microwave generators. The drive waveforms may be applied to each cavity and to the transmon independently. The 4 FPGA analog channels are used as 2 IQ-pairs in unit 3950 that each control a cavity drive to implement arbitrary cavity displacements. Rotations of the transmon ancilla are controlled by another pair of IQ channels provided by an arbitrary waveform generator (AWG 3960) synchronized to the FPGA via a digital marker. This IQ pair controls both |g>-|e> and |e>-|f> transitions by using different intermediate frequencies (IF).

In the example of FIG. 39, ancilla readout may be performed by heterodyne measurement of the microwave transmission of a readout pulse through the two ports of the quasi-planar readout resonator near its resonance frequency. Using a cQED dispersive readout, the amplitude and phase of the transmitted signal depends on the quantum state of the ancilla. This readout pulse is produced by a microwave generator (RO 3971) gated by a FPGA digital channel. The transmitted signal, after amplified by the JPC, is further amplified by a high electron mobility transistor (HEMT) at 4K and a regular RF amplifier at room temperature. The amplified signal is then mixed down to 50 MHz with the output of a "local oscillator" (LO 3972) microwave generator, and analyzed by the FPGA. A split copy of the readout pulse is directly mixed with the LO without entering the refrigerator to provide a phase reference for the measured transmission.

According to some embodiments, the long lifetimes of the cavities of the cQED system may allow preparation of highly coherent cavity quantum states, but may also severely limit the rate at which one can repeat the measurement process. (With $T_1 \approx 3$ ms for Alice, it takes 15-20 ms for the cavity photon number to naturally decay to the order of 0.01.) Since tomographic measurement of the two-cavity quantum state can require large amounts of measurements, in some cases a four-wave mixing process may be implemented to realize fast reset for both cavities. These processes can effectively convert photons in Alice or Bob into photons in the short-lived readout resonator mode using three parametric pumping tones. For instance, this reset operation could be applied for 400 μs, and then experimental data can be acquired with a repetition cycle of about 900 μs.

FIGS. 4A-40C depict one illustrative physical implementation of cQED system 3500 formed from a block of high-purity aluminum. FIG. 40A is a photograph of a machined aluminum package containing two coaxial stub cavity resonators and a transmon. In the example of FIG. 40A, a single block of high-purity (5N5) aluminum has been machined to form a 3D structure that contains both superconducting cavity resonators, and also functions as a package for a sapphire chip with deposited Josephson junction.

Each of the two cavities in FIG. 40A can be considered a 3D version of a λ/4 transmission line resonator between a center stub (e.g., 3.2 mm in diameter) and a cylindrical wall (outer conductor) (e.g., 9.5 mm in diameter). The heights of the stubs control the resonance frequency, and in the pictured example are about 12.2 mm and 16.3 mm for Alice and Bob, respectively. A tunnel (in the example having a maximum width of 5.8 mm and a maximum height of 3.9 mm) is opened from the outside towards the middle wall between the two cavities, creating a three way joint between the tunnel and the two cavities. The whole package is chemically etched by about 80 μm after machining to improve the surface quality of the cavity resonators.

In the example of FIGS. 40A-40C, the superconducting transmon is on a 5.5 mm×27.5 mm chip, which is diced from a 430 μm-thick c-plane sapphire wafer after fabrication. The transmon on the chip is shown in FIG. 40B. The fabrication process used electron-beam lithography and shadow-mask evaporation of an Al/AlOx/Al Josephson junction. The sapphire chip is inserted into the tunnel, with the antenna pads of the transmon slightly intruding into the coaxial cavities to provide mode coupling. The chip is mechanically held at one end with an aluminum clamping structure and indium seal.

According to some embodiments, during the transmon fabrication process, a 100 μm×9.8 mm strip of aluminum film may be deposited on the sapphire chip to form a readout resonator. This metal strip and the wall of the tunnel form a planar-3D hybrid λ/2 stripline resonator. This resonator design has the advantages of both lithographic dimensional control and low surface/radiation loss. Here, it is capacitively coupled to the transmon, and strongly coupled to a 50Ω transmission line for readout, as shown in FIG. 40C.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Numerical values and ranges may be given in the specification and claims as approximate values or exact values. For example, in some cases the terms "about," "approximately," and "substantially" may be used in reference to a value. Such references are intended to encompass the referenced value as well as plus and minus reasonable variations of the value. For example, a phrase "between about 10 and about 20" is intended to mean "between exactly 10 and exactly 20" in some embodiments, as well as "between 10±δ1 and 20±δ2" in some embodiments. The amount of variation δ1, δ2 for a value may be less than 5% of the value in some embodiments, less than 10% of the value in some embodiments, and yet less than 20% of the value in some embodiments. In embodiments where a large range of values is given, e.g., a range including two or more orders of magnitude, the amount of variation δ1, δ2 for a value could be 50%. For example, if an operable range extends from 2 to 200, "approximately 80" may encompass values between 40 and 120.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, FPGA, or semi-custom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions may be described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A waveform processor comprising:
   one or more data storage devices that include:
      a first memory for storing a plurality of master instructions, wherein a master instruction comprises a plurality of digital data fields and the master instructions have a defined order; and
      a second memory for storing a plurality of digital waveforms;
   a first sequencer comprising a first plurality of logic blocks configured to access the first memory and sequentially execute the master instructions according to their defined order, the first sequencer having a first digital output configured to output digital values based at least in part on results of executing the master instructions;
   a second sequencer coupled to the first sequencer and configured to receive values from the first digital output, the second sequencer comprising a second plurality of logic blocks configured to:
      access the second memory;
      generate analog waveforms at least in part by transforming one of the plurality of digital waveforms according to one or more of the digital values received from the first sequencer; and
      output the generated analog waveforms to an external system; and
   a waveform analyzer comprising a third plurality of logic blocks configured to integrate analog waveforms received from the external system and to output results of said integration to the first sequencer,
   wherein transforming one of the plurality of digital waveforms by the second sequencer comprises performing a linear transformation of the one of the plurality of digital waveforms based at least in part on the one or more digital values received from the first sequencer.

2. The waveform processor of claim 1,
   wherein the one or more data storage devices further include a third memory for storing a plurality of waveform instructions, wherein a waveform instruction comprises a plurality of digital data fields and the waveform instructions have a defined order, and
   wherein the second plurality of logic blocks of the second sequencer are further configured to:
      access the third memory and sequentially execute the waveform instructions according to their defined order; and
      generate said analog waveforms according to the executed waveform instructions.

3. The waveform processor of claim 2, wherein the waveform instructions include at least a first branch instruction and wherein the second sequencer is further configured to identify a non-sequential waveform instruction of the plurality of waveform instructions to execute subsequent to the first branch instruction based at least in part on a digital signal received by the second sequencer from the first sequencer.

4. The waveform processor of claim 2, wherein the second plurality of logic blocks of the second sequencer are further configured to repeatedly execute the plurality of waveform instructions according to their defined order.

5. The waveform processor of claim 1, wherein the master instructions include at least a first branch instruction and wherein the first sequencer is further configured to identify a non-sequential master instruction of the plurality of master instructions to execute subsequent to the first branch instruction based at least in part on a digital signal received by the first sequencer.

6. The waveform processor of claim 5, wherein the digital signal received by the first sequencer is received by the first sequencer from the waveform analyzer and comprises a result of said integration by the waveform analyzer.

7. The waveform processor of claim 5, wherein the first sequencer is further configured to output a digital instruction to the second sequencer based at least in part on the result of said integration received by the first sequencer from the waveform analyzer.

8. The waveform processor of claim 1, wherein the integration of analog waveforms by the waveform analyzer is triggered by execution of a master instruction by the first sequencer.

9. The waveform processor of claim 1, wherein the external system is a quantum system including a qubit, and wherein the generated analog waveforms are designed to rotate a state of the qubit.

10. The waveform processor of claim 1, wherein the first sequencer is further configured with a second digital output configured to output digital values based at least in part on results of executing the master instructions, the waveform processor further comprising:
   a third sequencer coupled to the first sequencer and configured to receive values from the second digital output, the third sequencer configured to output digital values according to one or more of the digital values received from the first sequencer.

11. The waveform processor of claim 1, wherein the one or more data storage devices, the first sequencer, the second sequencer and the waveform analyzer are assembled on a single substrate.

12. The waveform processor of claim 1, wherein the first sequencer, the second sequencer and the waveform analyzer are embodied in a field-programmable gate array.

13. The waveform processor of claim 1, wherein the first sequencer, the second sequencer and the waveform analyzer are embodied in an application specific integrated circuit.

14. The waveform processor of claim 1, wherein the first sequencer, the second sequencer and the waveform analyzer are configured to receive a common clock signal.

15. The waveform processor of claim 1, wherein the second sequencer is configured to generate the analog waveforms as comprising IQ waveform pairs.

16. The waveform processor of claim 1, wherein the second sequencer is configured to generate the analog waveforms as single-sideband modulated waveforms.

17. The waveform processor of claim 1, wherein:
the second sequencer comprises a digital-to-analog converter; and
the waveform analyzer comprises an analog-to-digital converter.

18. A system comprising the waveform processor of claim 1 and a superconducting qubit coupled to the waveform processor.

19. A system comprising a plurality of instances of the waveform processor of claim 1 communicatively coupled to one another.

20. A method comprising:
selecting, by a first sequencer that comprises a first plurality of logic blocks, a first master sequence instruction from a plurality of master sequence instructions stored in a first memory of one or more data storage devices, wherein a master sequence instruction comprises a plurality of digital data fields and the master instructions have a defined order;
executing, by the first sequencer, the first master sequence instruction;
outputting, by the first sequencer, one or more digital values to a second sequencer comprising a digital-to-analog converter and a second plurality of logic blocks;
generating, by the second sequencer, a first analog waveform at least in part by performing a linear transformation of one of a plurality of digital waveforms based at least in part on the one or more digital values received from the first sequencer;
applying the first analog waveform to a system;
integrating, by a waveform analyzer comprising a first analog-to-digital converter and a third plurality of logic blocks assembled on a substrate, a first received analog waveform from the system;
providing, by the waveform analyzer, a result of the integration to the first sequencer; and
executing, by the first sequencer, a second master sequence instruction of the plurality of master sequence instructions based on the received result from the waveform analyzer.

21. The method of claim 20, further comprising:
computing, by the first sequencer, an internal result based in part on the result of the integration;
providing, by the first sequencer, the internal result to the second sequencer; and
outputting, by the second sequencer, a second analog waveform to the system based in part on the internal result.

22. The method of claim 20, wherein the system is a quantum system including a qubit, and wherein the first analog waveform is designed to rotate a state of the qubit.

23. The method of claim 20, further comprising:
identifying, by the first sequencer, a non-sequential master instruction of the plurality of master instructions to execute subsequent to the first master sequence instruction based at least in part on the received result from the waveform analyzer.

\* \* \* \* \*